(12) United States Patent
Masuda et al.

(10) Patent No.: US 10,979,058 B2
(45) Date of Patent: Apr. 13, 2021

(54) DETECTION DEVICE AND DETECTION METHOD

(71) Applicant: SONY CORPORATION, Tokyo (JP)

(72) Inventors: Makoto Masuda, Kanagawa (JP); Hiroaki Fujita, Kanagawa (JP); Tetsuya Fujiwara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 219 days.

(21) Appl. No.: 16/097,658

(22) PCT Filed: Apr. 27, 2017

(86) PCT No.: PCT/JP2017/016665
§ 371 (c)(1),
(2) Date: Oct. 30, 2018

(87) PCT Pub. No.: WO2017/195615
PCT Pub. Date: Nov. 16, 2017

(65) Prior Publication Data
US 2020/0321966 A1 Oct. 8, 2020

(30) Foreign Application Priority Data

May 11, 2016 (JP) .............................. JP2016-095429

(51) Int. Cl.
*H03L 7/085* (2006.01)
*G01R 31/317* (2006.01)
(Continued)

(52) U.S. Cl.
CPC ........ *H03L 7/085* (2013.01); *G01R 31/31727* (2013.01); *H03K 3/037* (2013.01); *H03K 19/20* (2013.01); *H03K 21/08* (2013.01)

(58) Field of Classification Search
None
See application file for complete search history.

(56) References Cited

U.S. PATENT DOCUMENTS 8,040,156 B2 * 10/2011 Lee .................... H03L 7/095
327/20
8,258,834 B2 * 9/2012 Xiu .................... H03L 7/095
327/156

(Continued)

FOREIGN PATENT DOCUMENTS

JP 64-061119 A 3/1989
JP 3-16442 A 1/1991
(Continued)

OTHER PUBLICATIONS

International Search Report and Written Opinion of PCT Application No. PCT/JP2017/016665, dated Jul. 25, 2017, 09 pages of ISRWO.

(Continued)

*Primary Examiner* — Jeffery S Zweizig
(74) *Attorney, Agent, or Firm* — Chip Law Group

(57) ABSTRACT

The present technology relates to a first edge detector that detects whether there is an edge of a second clock signal in one cycle of a first clock signal. A second edge detector detects whether there is an edge of the first clock signal in one cycle of the second clock signal. The logic circuit performs a logical operation on a detection result from the first edge detector and a detection result from the second edge detector. The present technology can be applied to a circuit or the like that detects a locked state of a PLL circuit, for example.

15 Claims, 42 Drawing Sheets

(51) Int. Cl.
    *H03K 3/037*     (2006.01)
    *H03K 19/20*     (2006.01)
    *H03K 21/08*     (2006.01)

(56) References Cited

U.S. PATENT DOCUMENTS

| | | | |
|---|---|---|---|
| 8,749,271 B2 * | 6/2014 | Lin | H03D 13/004 |
| | | | 327/3 |
| 8,749,283 B2 * | 6/2014 | Wang | H03L 7/199 |
| | | | 327/156 |

FOREIGN PATENT DOCUMENTS

| | | | |
|---|---|---|---|
| JP | 05-022130 A | 1/1993 |
| JP | 7-321772 A | 12/1995 |
| JP | 08-097717 A | 4/1996 |
| JP | 9-214333 A | 8/1997 |
| JP | 10-336023 A | 12/1998 |
| JP | 11-122102 A | 4/1999 |
| JP | 2003-258557 A | 9/2003 |
| JP | 2007-243736 A | 9/2007 |
| JP | 2012-147426 A | 8/2012 |
| JP | 2012-204871 A | 10/2012 |
| WO | 2012/127637 A1 | 9/2012 |

OTHER PUBLICATIONS

Office Action for JP Patent Application 2018-516939 dated Dec. 8, 2020, 6 pages of Office Action and 6 pages of English Translation.

* cited by examiner

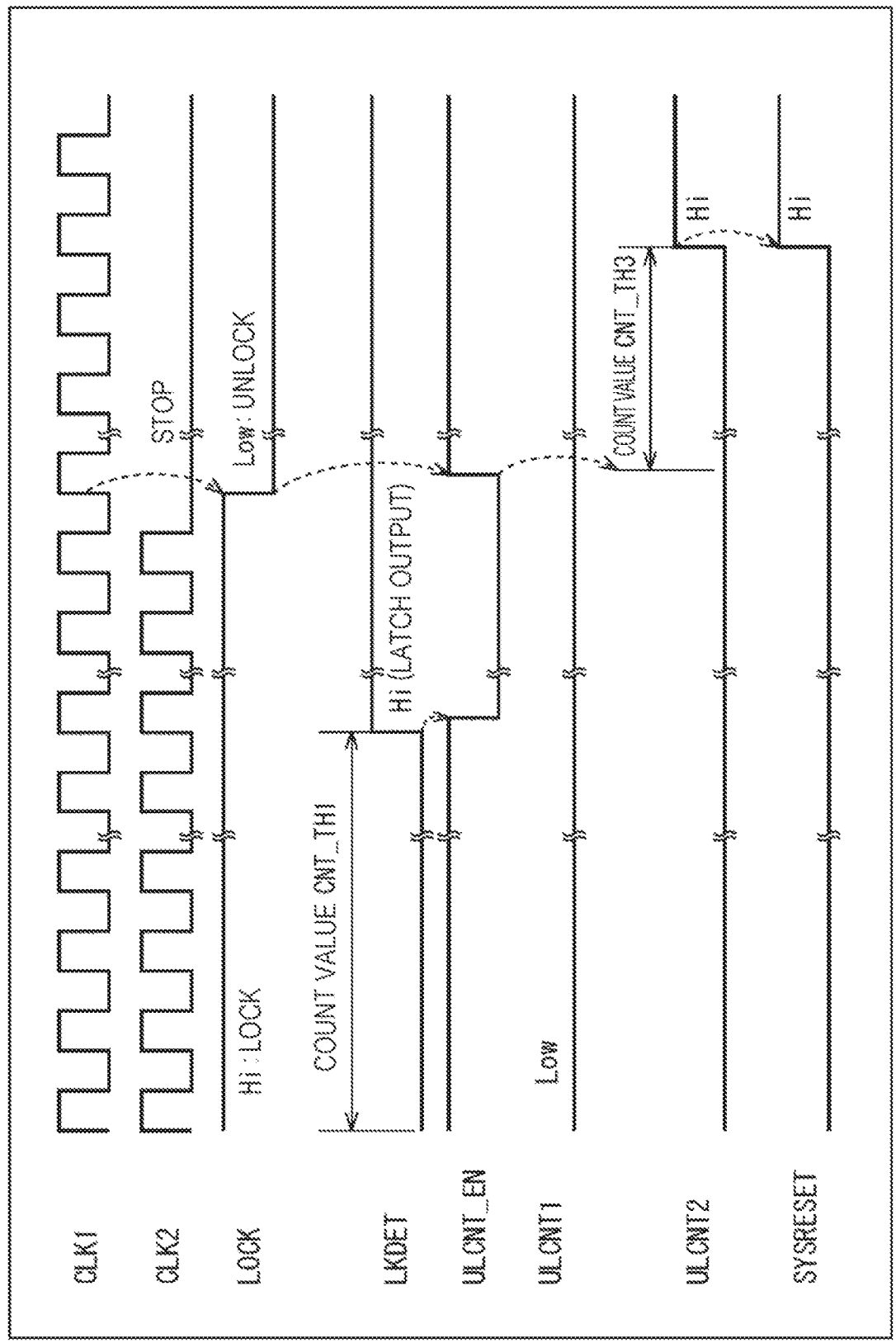

DETECTION DEVICE AND DETECTION METHOD

CROSS REFERENCE TO RELATED APPLICATIONS

This application is a U.S. National Phase of International Patent Application No. PCT/JP2017/016665 filed on Apr. 27, 2017, which claims priority benefit of Japanese Patent Application No. JP 2016-095429 filed in the Japan Patent Office on May 11, 2016. Each of the above-referenced applications is hereby incorporated herein by reference in its entirety.

TECHNICAL FIELD

The present technology relates to a detection device and a detection method, and more particularly, to a detection device and a detection method that are designed to be capable of detecting a locked state with a higher degree of accuracy.

BACKGROUND ART

At present, phase locked loop (PLL) circuits are indispensable in various fields, and are installed in many systems. In addition, lock detection circuits for that detect locked states of PLL circuits ire also widely used. (See Patent Document 1, for example).

CITATION LIST

Patent Document

Patent Document 1: Japanese Patent Application Laid-Open No. 05-022130

SUMMARY OF THE INVENTION

Problems to be Solved by the Invention

A conventional lock detection circuit erroneously detects a locked state in a case where the pulse width of a comparison clock is small, or erroneously detects a locked state in a case where the phase of a comparison clock is large, for example. Therefore, there is a demand for lock detection circuits that perform less erroneous detection.

The present technology has been developed in view of those circumstances, and is to enable more accurate detection of locked states.

Solutions to Problems

A detection device according to one aspect of the present technology includes: a first edge detector that detects whether there is an edge of a second clock signal in one cycle of a first clock signal; a second edge detector that detects whether there is an edge of the first clock signal in one cycle of the second clock signal; and a logic circuit that performs a logical operation on a detection result from the first edge detector and a detection result from the second edge detector.

A detection method according to one aspect of the present technology is implemented in a detection device, and includes: detecting whether there is an edge of a second clock signal in one cycle of a first clock signal; detecting whether there is an edge of the first clock signal in one cycle of the second clock signal; and performing a logical operation on a result of detection of an edge of the second clock signal and a result of detection of an edge of the first clock signal.

According to one aspect of the present technology, a check is made to determine whether there is an edge of a second clock signal in one cycle of a first clock signal, a check is made to determine whether there is an edge of the first clock signal in one cycle of the second clock signal, and a logical operation is performed on a result of detection of an edge of the second clock signal and a result of detection of an edge of the first clock signal.

The detection device may be an independent device, or may be an internal block in one device.

Effects of the Invention

According to one aspect of the present technology, it is possible to detect a locked state with a higher degree of accuracy.

Note that effects of the present technology are not limited to the effects described herein, and may include any of the effects described in the present disclosure.

BRIEF DESCRIPTION OF DRAWINGS

FIG. 9 shows an example of a reference clock delay signal REFCLK_D in a case where the delay amount changes with the process, temperature, the power supply voltage, or the like.

FIG. 42 is a timing chart in a case where a second clock signal CLK2 stops.

MODES FOR CARRYING OUT THE INVENTION

Figure 1:
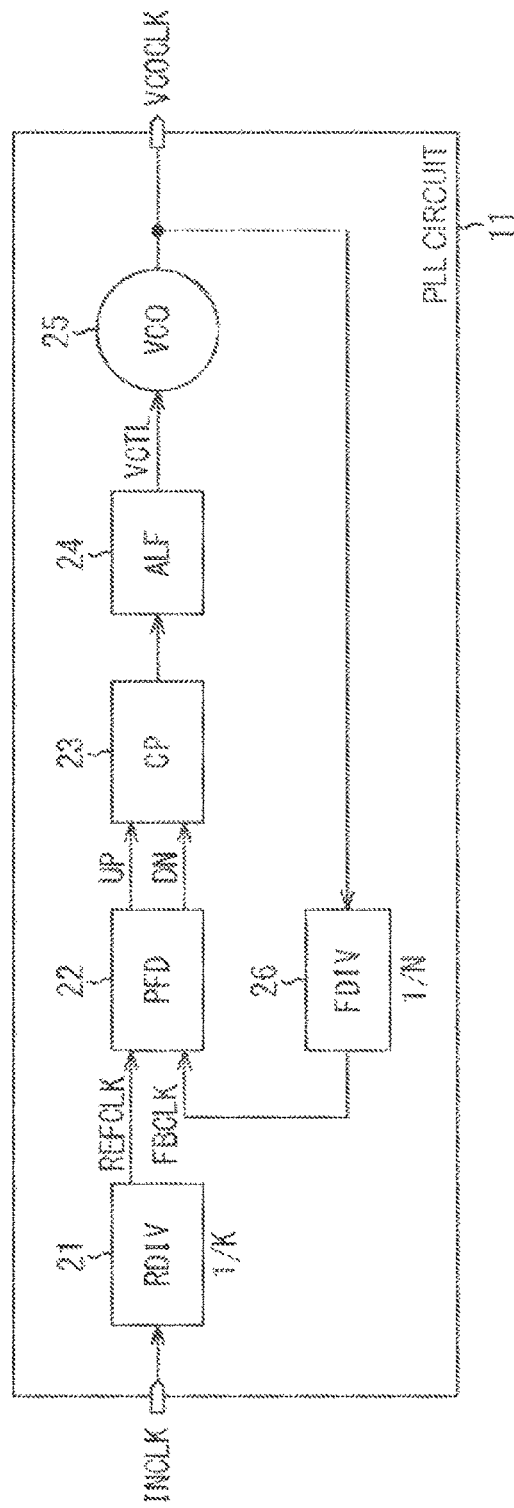
FIG. 1 is a block diagram showing an example configuration of an integer PLL circuit.

The following is a description of modes (hereinafter referred to as embodiments) for carrying out the present technology, with reference to the drawings. In this specification, embodiments of lock detection circuits for detecting a locked state of a PLL circuit are described. However, to facilitate understanding of the embodiments of lock detection circuits, the circuit configuration of a general PLL circuit and the circuit configuration of a basic lock detection circuit are first described, followed by the embodiments in order.

In this specification, explanation is made in the following order.

1. Example configuration of an integer PLL circuit
2. Lock detection circuit (1)
3. Example configuration of a fractional-N PLL circuit
4. Lock detection circuit (2)
5. Lock detection circuit (3)
6. Lock detection circuit (4)
7. First embodiment of a lock detection circuit
 7.1 First specific configuration of the first embodiment
 7.2 Second specific configuration of the first embodiment
 7.3 Third specific configuration of the first embodiment
 7.4 Fourth specific configuration of the first embodiment
 7.5 Summary of the first through fourth specific configurations
8. Second embodiment of a lock detection circuit
9. Third embodiment of a lock detection circuit <1. Example Configuration of an Integer PLL Circuit>

FIG. 1 is a block diagram showing an example configuration of an integer PLL circuit.

An integer PLL circuit 11 includes an input divider (RDIV) 21, a phase frequency comparator (a phase frequency detector: PFD) 22, a charge pump (CP) 23, an analog loop filter (ALF) 24, a voltage controlled oscillator (VCO) 25, and a feedback divider (FDIV) 26.

The input divider 21 divides an input clock signal INCLK input to the PLL circuit 11 so as to have 1/K of the frequency, and outputs a reference clock signal REFCLK, which is the divided signal, to the phase frequency comparator 22.

The phase frequency comparator 22 compares the phase of the reference clock signal REFCLK supplied from the input divider 21 with the phase of a comparison clock signal FBCLK supplied from the feedback divider 26, and outputs an UP signal or a DN signal (DOWN signal) to the charge pump 23, depending on the comparison result.

The charge pump 23 converts the UP signal or the DN signal supplied from the phase frequency comparator 22 into a current signal, and outputs the current signal to the analog loop filter 24. The analog loop filter 24 converts the current signal supplied from the charge pump 23 into a voltage signal VCTL, and outputs the voltage signal VCTL to the voltage controlled oscillator 25.

The voltage controlled oscillator 25 generates an output clock signal VCOCLK by converting the voltage signal VCTL supplied from the analog loop filter 24 into a frequency. The voltage controlled oscillator 25 outputs the output clock signal VCOCLK from the PLL circuit 11, and also supplies the output clock signal VCOCLK to the feedback divider 26.

The feedback divider 26 divides the output clock signal VCOCLK, which has been input thereto, so as to have 1/N of the frequency, and outputs the comparison clock signal FBCLK, which is the divided signal, to the phase frequency comparator 22.

In the PLL circuit 11 configured as described above, control is performed so that the phase and the frequency of the input reference clock signal REFCLK coincide with the phase and the frequency of the comparison clock signal FBCLK based on the fed-back output clock signal VCOCLK. The output clock signal VCOCLK output from the PLL circuit 11 is supplied as a master clock signal of the system into which the PLL circuit 11 is incorporated, for example, and a plurality of clock signals are generated from the master clock signal and are used as needed.

In the PLL circuit 11, a state in which the phase and the frequency of the reference clock signal REFCLK coincide with the phase and the frequency of the comparison clock signal FBCLK is a locked state, and a state in which the phase and the frequency of the reference clock signal REFCLK do not coincide with the phase and the frequency of the comparison clock signal FBCLK is an unlocked state.

When the PLL circuit 11 is in a locked state, the frequency and phase relationship between the respective clock signals is set. In an unlocked state, the frequency and phase relationship between the clocks is not guaranteed. Because of this, the system fails to satisfy the required specification of logical static timing analysis (STA) and might not function properly. Therefore, in some cases, the PLL circuit 11 needs to be in a locked state in the system that receives a supply of the output clock signal VCOCLK.

In view of this, a lock detection circuit is needed so that a locked state or an unlocked state of the PLL circuit 11 is detected and is used as a system activation signal, a data processing start signal, or the like.

Further, a lock detection signal that is an output of the lock detection circuit may also be used for switching bands of the PLL circuit 11 during the period before a lock, to shorten the lock-up time of the PLL circuit 11, for example.

Various types of lock detection circuits are used depending on determination accuracy, ease of mounting, circuit size, and the like.

<2. Lock Detection Circuit (1)>

Figure 2:
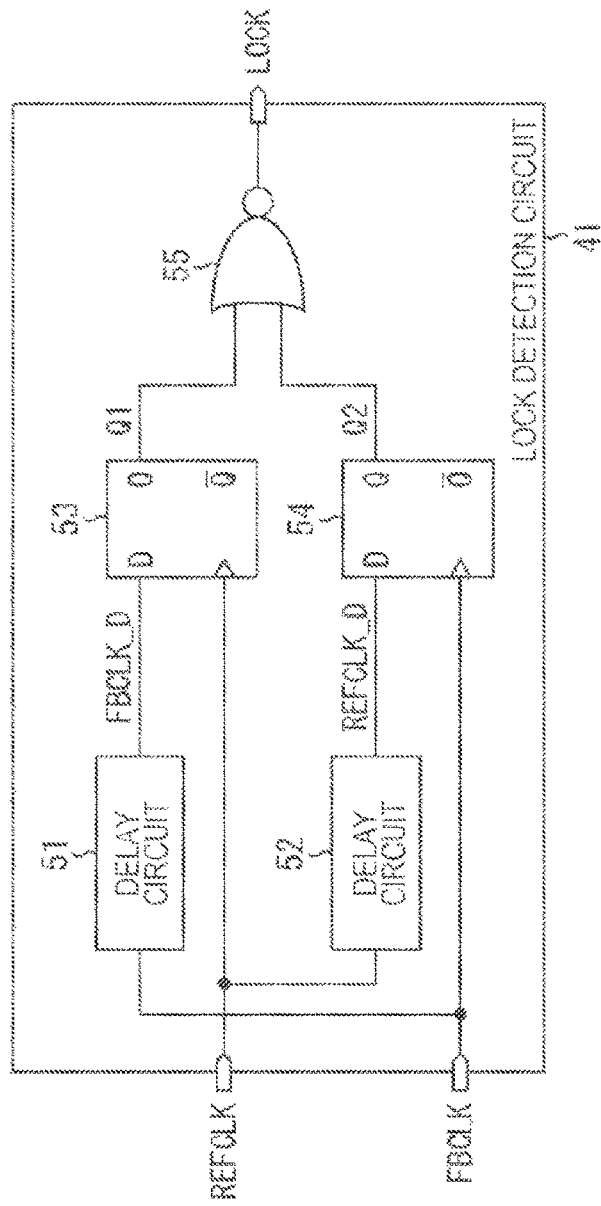
FIG. 2 is a block diagram showing the most general circuit configuration of a lock detection circuit.

FIG. 2 is a diagram showing the most general circuit configuration of a lock detection circuit.

The lock detection circuit diagram 41 shown in FIG. 2 includes delay circuits 51 and 52, D-flip-flops 53 and 54, and a NOR circuit 55.

The reference clock signal REFCLK and the comparison clock signal FBCLK, which are the same as the signals to be input to the phase frequency comparator 22 in FIG. 1, are input to the lock detection circuit diagram 41.

The delay circuit 51 generates a comparison clock delay signal FBCLK_D, which is a signal obtained by delaying the input comparison clock signal FBCLK by a predetermined time, and outputs the comparison clock delay signal FBCLK_D to the D-input of the D-flip-flop 53.

The delay circuit 52 generates a reference clock delay signal REFCLK_D, which is a signal obtained by delaying the input reference clock signal REFCLK by a predetermined time, and outputs the reference clock delay signal REFCLK_D to the D-input of the D-flip-flop 54.

The D-flip-flop 53 outputs the comparison clock delay signal FBCLK_D of the D-input at the timing of a rising edge of the reference clock signal REFCLK input to the CLK terminal, as a Q1 signal from the Q-output.

The D-flip-flop 54 outputs the reference clock delay signal REFCLK_D of the D-input at the timing of a rising edge of the comparison clock signal FBCLK input to the CLK terminal, as a Q2 signal from the Q-output.

The NOR circuit 55 calculates the negative OR of the Q1 signal supplied from the D-flip-flop 53 and the Q2 signal supplied from the D-flip-flop 54, and outputs the calculation result as a lock detection signal LOCK.

In the lock detection circuit diagram 41 configured as described above, a lock determination window is determined by the delay amounts of the delay circuits 51 and 52. In a case where the phase difference between the reference clock signal REFCLK and the comparison clock signal FBCLK is smaller than the lock determination window, both the Q1 signal and the Q2 signal become "Low". Therefore, the NOR circuit 55 obtains the negative OR (NOR), and outputs a "Hi" lock detection signal LOCK that indicates a locked state.

Figure 3:
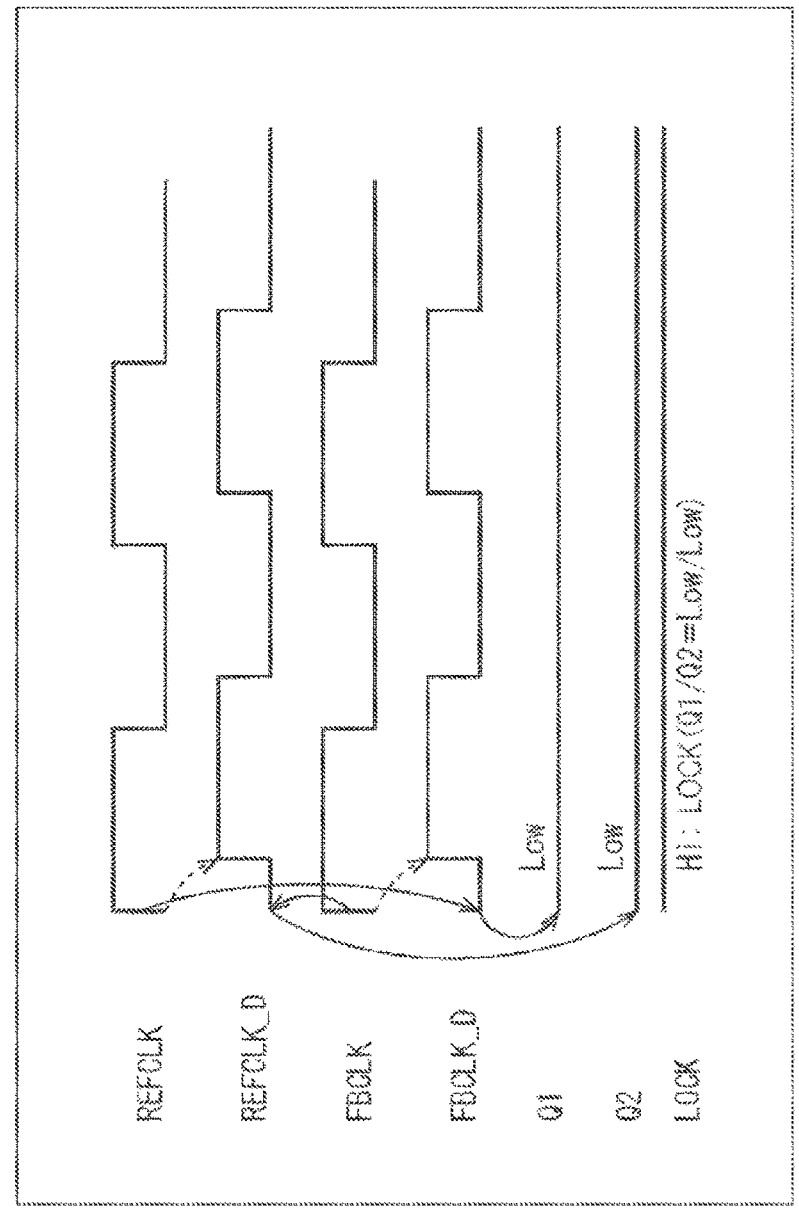
FIG. 3 is a timing chart of a locked state of the lock detection circuit shown in FIG. 2.

FIG. 3 shows an example of a timing chart in a case where the lock detection circuit diagram 41 outputs a "Hi" lock detection signal LOCK indicating a locked state. Note that FIG. 3 shows an example case where the phase of the reference clock signal REFCLK coincides with the phase of the comparison clock signal FBCLK.

At the timing of a rising edge of the reference clock signal REFCLK, the comparison clock delay signal FBCLK_D becomes "Low", and this state (Low) is output as the Q1 signal. At the timing of a rising edge of the comparison clock signal FBCLK, the reference clock delay signal REFCLK_D becomes Low, and this stage (Low) is output as the Q2 signal. The Q1 signal="Low" and the Q2 signal="Low" are then input to the NOR circuit 55. The NOR circuit 55 calculates the NOR of the Q1 signal="Low" and the Q2 signal="Low", and outputs a "Hi" lock detection signal LOCK that indicates a locked state.

Figure 4:
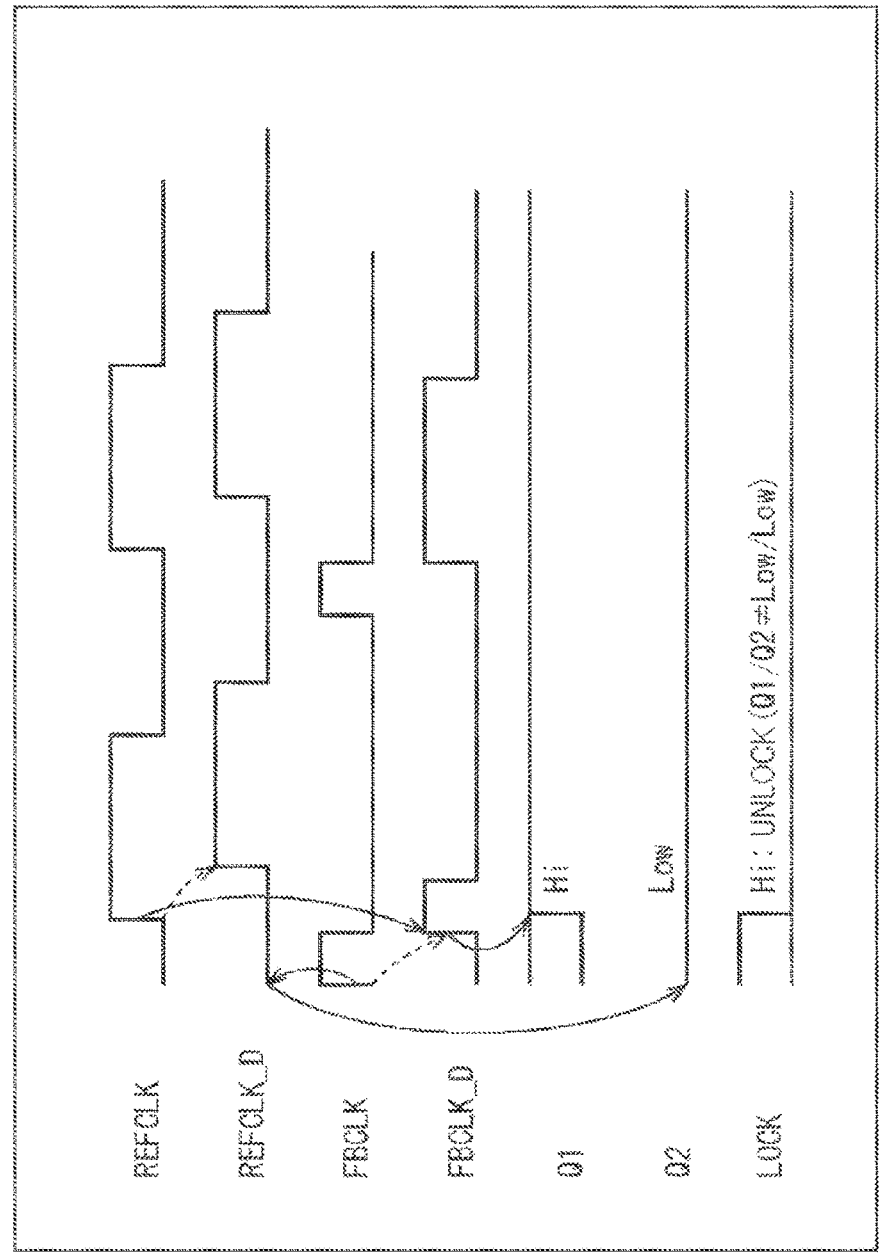
FIG. 4 is a timing chart of an unlocked state of the lock detection circuit shown in FIG. 2.

FIG. 4 shows an example of a timing chart in a case where the lock detection circuit diagram 41 outputs a "Low" lock detection signal LOCK indicating an unlocked state. Note that FIG. 4 shows an example case where the phase of the comparison clock signal FBCLK is ahead of the phase of the reference clock signal REFCLK, and the pulse width of the comparison clock signal FBCLK is equal to the width of the lock determination window.

At the timing of a rising edge of the reference clock signal REFCLK, the comparison clock delay signal FBCLK_D becomes "Hi", and this state (Hi) is output as the Q1 signal. At the timing of a rising edge of the comparison clock signal FBCLK, the reference clock delay signal REFCLK_D becomes Low, and this stage (Low) is output as the Q2 signal. The Q1 signal="Hi" and the Q2 signal="Low" are then input to the NOR circuit 55. The NOR circuit 55 calculates the NOR of the Q1 signal="Hi" and the Q2 signal="Low", and outputs a "Low" lock detection signal LOCK that indicates an unlocked state.

Note that, in FIG. 4, the state before the Q1 signal becomes "Hi" varies, depending on the comparison clock delay signal FBCLK_D at the timing of the rising edge of the reference clock signal REFCLK before that. The same applies to the lock detection signal LOCK.

<Pulse Swallow Divider>

In a case where a high frequency is required as the frequency of the output clock signal VCOCLK, a pulse swallow divider (a dual modulus pulse swallow divider) is used as the feedback divider 26, to cope with high-speed operation.

Figure 5:
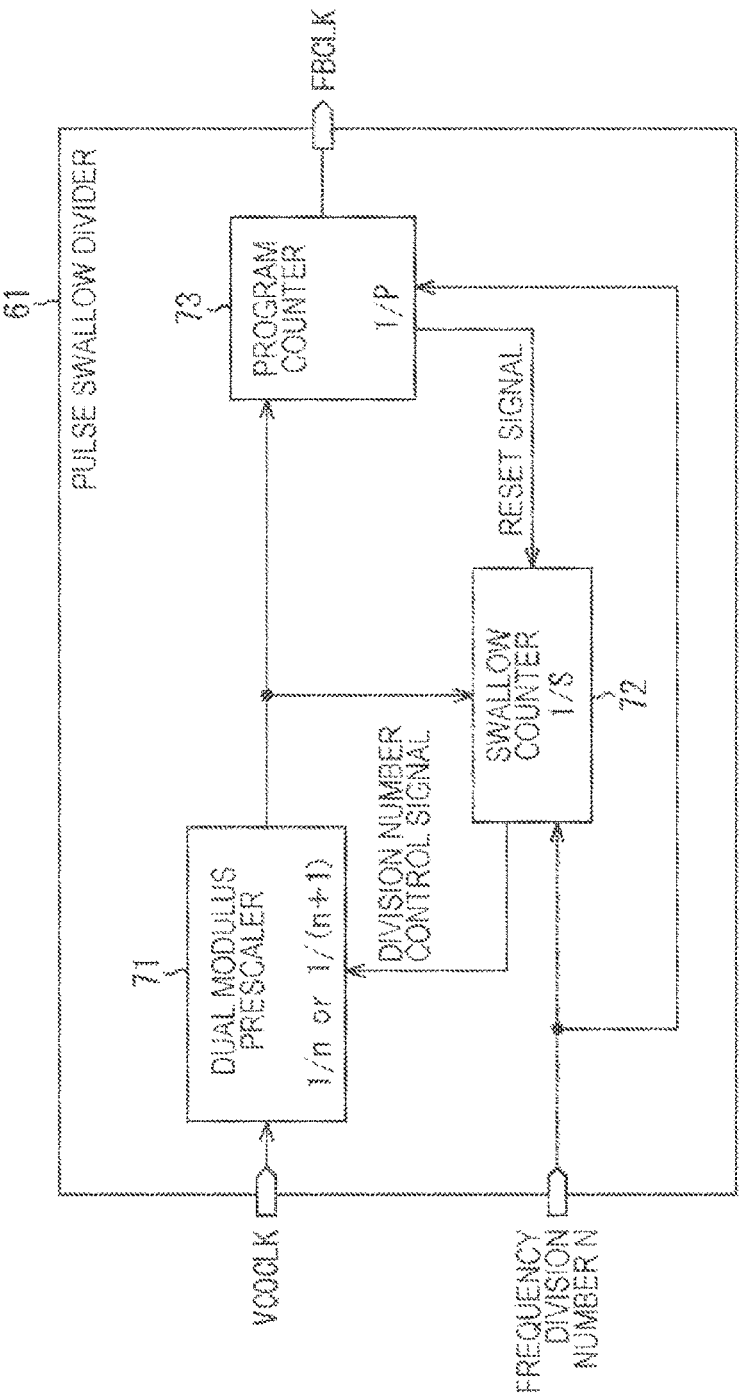
FIG. 5 is a block diagram showing an example configuration of a pulse swallow divider.

FIG. 5 is a block diagram showing an example configuration of a pulse swallow divider.

The pulse swallow divider 61 shown in FIG. 5 includes a dual modulus prescaler 71, a swallow counter 72, and a program counter 73.

The dual modulus prescaler 71 divides the output clock signal VCOCLK that has been input by a frequency division number of 1/n or 1/(n+1) in accordance with a division number control signal supplied from the swallow counter 72, and outputs the resultant signal to the swallow counter 72 and the program counter 73.

The swallow counter 72 performs counting in accordance with the output signal from the dual modulus prescaler 71, and outputs a division number control signal for setting the frequency division number to 1/n or 1/(n+1). Specifically, the swallow counter 72 outputs a division number control signal for setting the frequency division number to 1/(n+1) until counting S times, and, after counting S times, outputs a division number control signal for setting the frequency division number to 1/n. Further, in a case where a reset signal is supplied from the program counter 73, the swallow counter 72 resets the counter that is counting, and switches the output to a division number control signal for setting the frequency division number to 1/(n+1).

The program counter 73 outputs the output signal from the dual modulus prescaler 71 as the comparison clock signal FBCLK. The program counter 73 also performs counting in accordance with the output signal from the dual modulus prescaler 71. When counting P times, the program counter 73 supplies a reset signal to the swallow counter 72, and resets its own counter.

The frequency division number N of the pulse swallow divider 61 configured as described above is expressed as shown in the following equation.

$$N=\text{VCOCLK}/\text{FBCLK}=n*P+S\ (n, P, \text{ and } S \text{ being positive integers})$$

Note that, to perform high-speed operation, the dual modulus prescaler 71 with n=2 is selected in the pulse swallow divider 61 in many cases.

Here, in the pulse swallow divider 61, the pulse width of the comparison clock signal FBCLK depends on the frequency division setting number N of the feedback divider 26, and is determined to be n times the cycle of the output clock signal VCOCLK in some cases. Also, there are other possible examples in which the pulse width of the comparison clock signal FBCLK becomes small, depending on the configuration of the voltage controlled oscillator 25, the configuration of the IF circuit, the input clock standard, or the like.

To maintain a great pulse width for the comparison clock signal FBCLK, it is possible to adopt a method of adjusting the configuration of the divider circuit. However, adopting such a method is not easy, because the frequency division number N and the operation speed that can be set will be restricted by the method. A duty adjustment circuit may be used to increase the pulse width of the comparison clock signal FBCLK, but it is difficult to adjust duty while maintaining phase accuracy. There is also a method of adopting a pulse width stretcher, but it is necessary to use a delay element to increase the pulse width, or pull in a high-speed clock such as the output clock signal VCOCLK. This will result in an increase in circuit cost and electric current consumption.

Here, the pulse swallow divider 61 is used as the feedback divider 26, and the pulse width of the comparison clock signal FBCLK becomes smaller than the lock determination window formed by the delay circuits 51 and 52 of the lock detection circuit diagram 41 shown in FIG. 2. In that case, a locked state might be erroneously detected in the lock detection circuit diagram 41 shown in FIG. 2.

Figure 6:
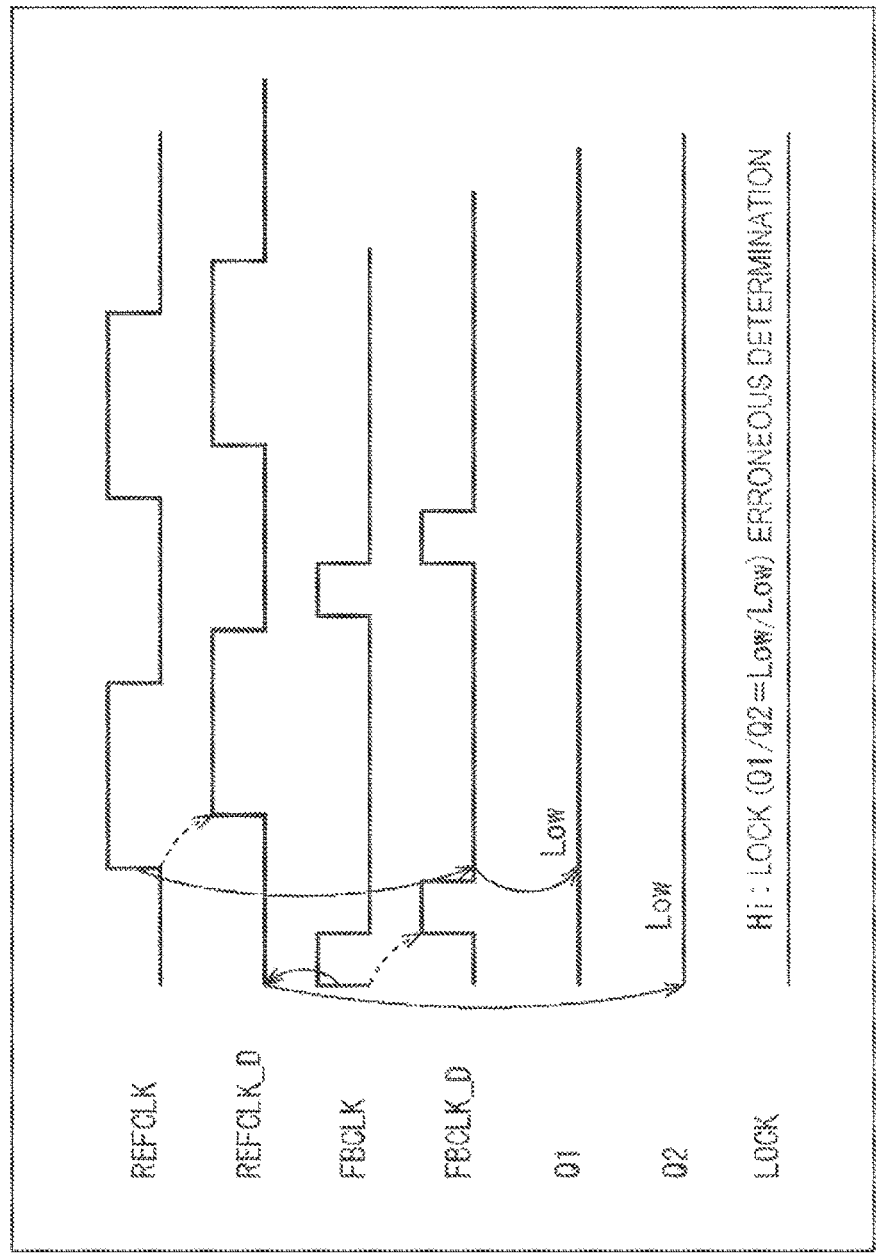
FIG. 6 is a timing chart in a case where erroneous detection is performed with a small pulse width.

FIG. 6 shows an example of a timing chart in a case where a locked state is erroneously detected because the pulse width of the comparison clock signal FBCLK becomes small.

In the example shown in FIG. 6, the comparison clock delay signal FBCLK_D becomes "Low" at the timing of a rising edge of the reference clock signal REFCLK, and therefore, the Q1 signal becomes "Low". The reference clock delay signal REFCLK_D becomes "Low" at the timing of a rising edge of the comparison clock signal FBCLK, and therefore, the Q2 signal becomes "Low". The Q1 signal="Low" and the Q2 signal="Low" are then input to the NOR circuit 55. The NOR circuit 55 calculates the NOR of the Q1 signal="Low" and the Q2 signal="Low", and outputs a "Hi" lock detection signal LOCK that indicates a locked state.

In the example shown in FIG. 6, however, the phase difference between the reference clock signal REFCLK and the comparison clock signal FBCLK exceeds the lock determination window determined by the delay amount, and therefore, an unlocked state should be detected. Since the pulse width of the comparison clock signal FBCLK is small, a "Hi" lock detection signal LOCK is output as described above, and a locked state is erroneously detected.

<3. Example Configuration of a Fractional-N PLL Circuit>

In the integer PLL circuit 11 shown in FIG. 1, the output clock frequency that is the frequency of the output clock signal VCOCLK should be limited to integral multiples of the reference clock frequency that is the frequency of the reference clock signal REFCLK. In view of this, a fractional-N PLL circuit has been suggested as a PLL circuit capable of setting the output clock frequency at narrower intervals than the reference clock frequency.

The reasons for using a fractional-N PLL circuit are the features of the fractional-N PLL circuit described below, as well as the above mentioned adjustment of the output clock frequency.

1. The PLL circuit band can be made higher, and noise can be reduced.
2. The capacity of the analog loop filter 24, which is a low-pass filter, can be made smaller, and thus, a smaller area is required.
3. Fine output frequency control can be readily performed simply by changing the number of bits in the fractional division value (Fraction: α).
4. The frequency of the reference clock signal REFCLK can be kept high, and thus, the lock-up time can be shortened.

Figure 7:
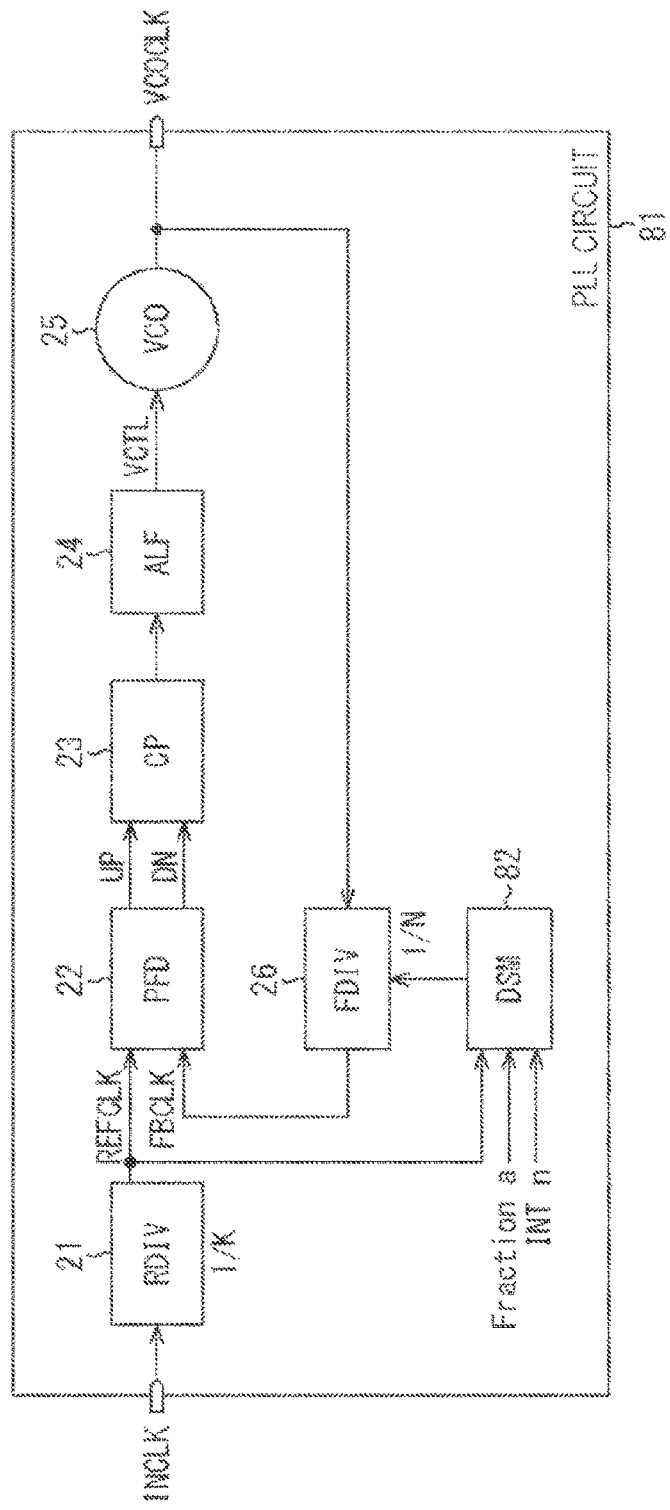
FIG. 7 is a block diagram showing an example configuration of a fractional-N PLL circuit.

FIG. 7 is a block diagram showing an example configuration of a fractional-N PLL circuit.

Note that, in FIG. 7, the components equivalent to those of the integer PLL circuit 11 shown in FIG. 1 are denoted by the same reference numerals as those used in FIG. 1, and explanation of them is not unnecessarily repeated herein.

A fractional-N PLL circuit 81 includes an input divider (RDIV) 21, a phase frequency comparator (PFD) 22, a charge pump (CP) 23, an analog loop filter (ALF) 24, a voltage controlled oscillator (VCO) 25, a feedback divider (FDIV) 26, and a delta-sigma modulator (ΔΣ modulator: DSM) 82.

That is, the fractional-N PLL circuit 81 differs from the integer PLL circuit 11 shown in FIG. 1 in that the ΔΣ modulator 82 is newly added, and noise shaping by the high-order ΔΣ modulator 82 is used to reduce fractional spurious. An integer n and a fractional division value (Fraction) α are supplied to the ΔΣ modulator 82, and such an integer column that the average frequency division number N of the feedback divider 26 becomes a frequency division number N=n·α is supplied to the feedback divider 26.

In the fractional-N PLL circuit 81, the respective clock frequencies of the input clock frequency FRQ_INCLK, the reference clock frequency FRQ_REFCLK, the comparison clock frequency FRQ_FBCLK, and the output clock frequency FRQ_VCOCLK at a time of locking are determined by the following equations.

$$FRQ\_REFCLK=FRQ\_INCLK/K$$

$$FRQ\_REFCLK=FRQ\_FBCLK$$

$$FRQ\_VCOCLK=FRQ\_REFCLK*N$$

As the value of the fractional division value (Fraction) α is set, the output clock frequency FRQ_VCOCLK can be controlled with a smaller width than the reference clock frequency FRQ_REFCLK.

In a third-order MASH (Multi-stAge-noize-Shaping) configuration that is commonly used as the ΔΣ modulator 82 in the fractional-N PLL circuit 81, the frequency division number N of the feedback divider 26 is a value among eight tones, and this is realized by the ΔΣ modulator 82 dynamically switching the frequency division number N.

Here, the comparison clock frequency FRQ_FBCLK is equal to FRQ_VCOCLK/N, and the cycle of the comparison clock signal FBCLK can have a variation width of (1/FRQ_VCOCLK)*8 at the maximum. In a case where the cycle of the comparison clock signal FBCLK varies with the above mentioned variation width, and the phase of the comparison clock signal FBCLK dynamically and greatly changes, the lock detection circuit diagram 41 in FIG. 2 might not be able to detect a locked state correctly.

Figure 8:
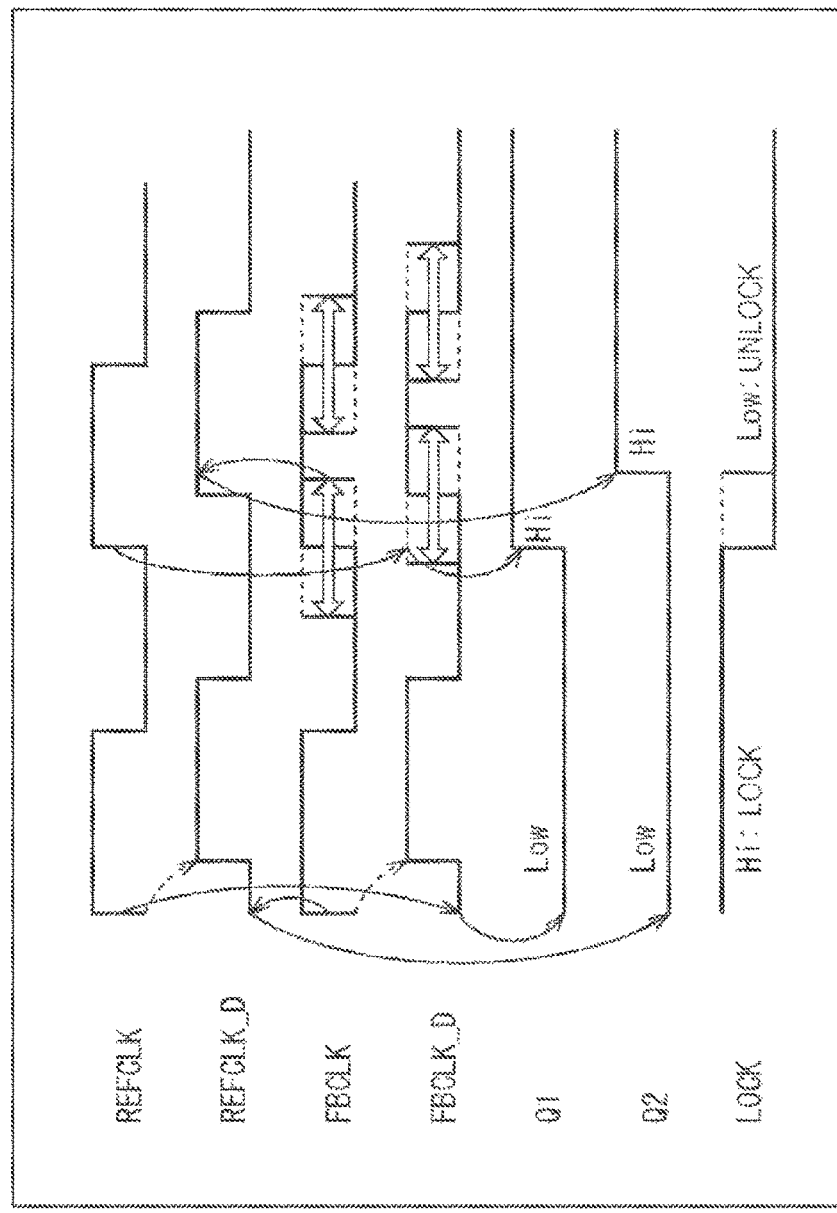
FIG. 8 is a timing chart in a case where erroneous detection is performed with a phase change.

FIG. 8 shows an example of a timing chart in a case where a locked state is erroneously detected from a change in the phase of the comparison clock signal FBCLK.

For example, in a case where the phase of the comparison clock signal FBCLK and the phase of the comparison clock delay signal FBCLK_D greatly change beyond the lock determination window, as indicated by thick arrows in FIG. 8, it is not possible to detect a locked state correctly.

To cope with changes in the phase of the fractional-N PLL circuit 81, it is necessary to widen the lock determination window, for example. Further, one of the methods of expanding the lock determination window is increasing the delay amounts of the delay circuits 51 and 52 shown in FIG. 2.

Figure 9:
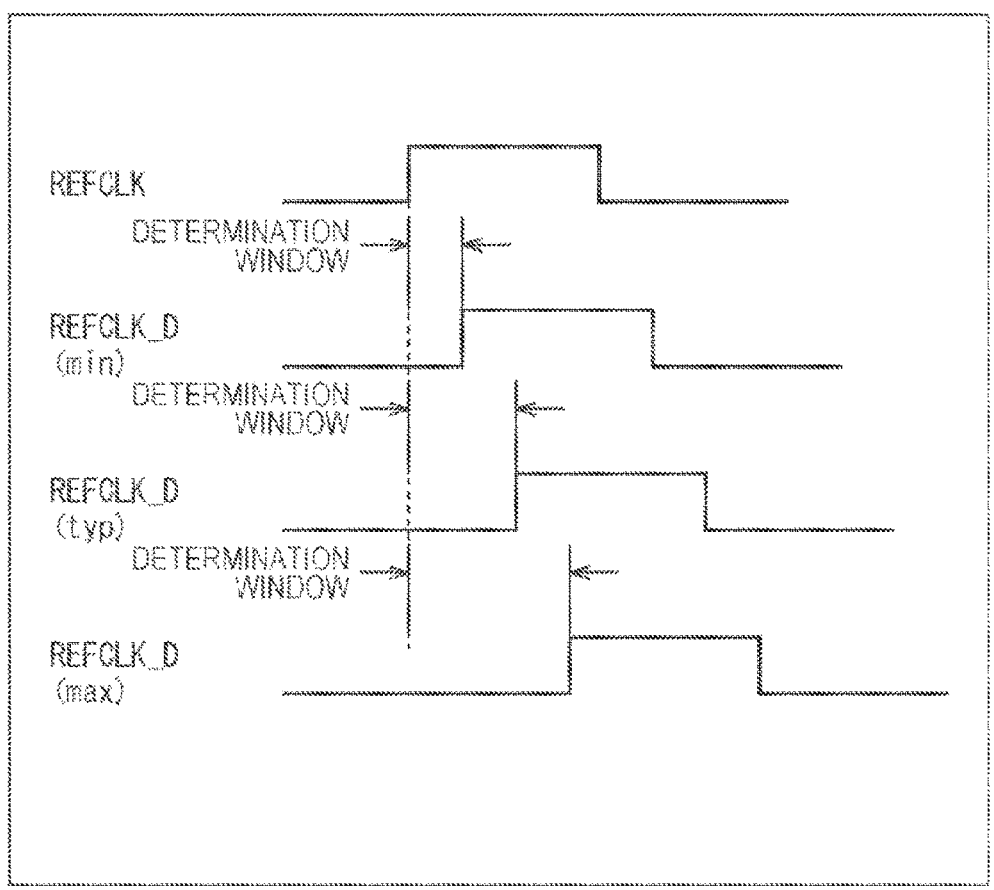

FIG. 9 shows an example of the reference clock delay signal REFCLK_D in a case where the delay amount of the delay circuit 52 in FIG. 2 changes with the process, temperature, the power supply voltage, or the like.

The delay amount of the delay circuit 52 greatly varies depending on the respective conditions of the process (P), the power supply voltage (V), and temperature (T) (these conditions will be hereinafter collectively referred to as the PVT conditions). To secure a necessary width for the lock determination window, the circuit is adjusted so that the delay has the delay amount necessary under the conditions for minimizing the delay as shown in FIG. 9 (min), for example. Under different PVT conditions, however, the delay might be "typ", "max", or the like shown in FIG. 9, and it is difficult to maintain a constant determination accuracy due to the great variation in the delay amount. Further, to obtain a sufficiently large delay amount under the conditions for minimizing the delay (min), the number of delay elements needs to be increased. As a result, the circuit cost increases, and electric current consumption increases due to the increased number of elements.

<4. Lock Detection Circuit (2)>

In view of the above, Patent Document 1 mentioned in Background Art discloses a method for generating a lock determination window from a VCO clock having a fixed period, instead of using a delay circuit for determining the width of a lock determination window.

Figure 10:
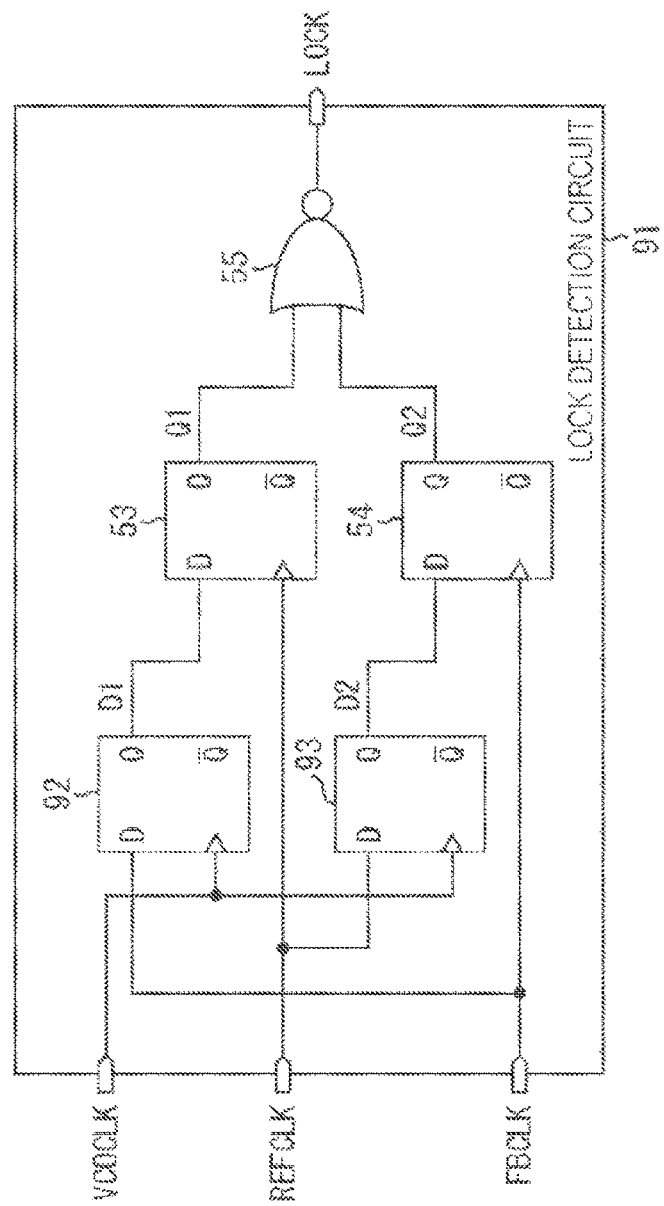
FIG. 10 is a block diagram showing the circuit configuration of a lock detection circuit disclosed in Patent Document 1.

FIG. 10 is a block diagram showing the circuit configuration of the lock detection circuit disclosed in Patent Document 1.

The lock detection circuit 91 shown in FIG. 10 includes D-flip-flops 92 and 93, D-flip-flops 53 and 54, and a NOR circuit 55.

The lock detection circuit 91 in FIG. 10 differs from the lock detection circuit 41 in FIG. 2 in that the delay circuits 51 and 52 of the lock detection circuit 41 are replaced with the D-flip-flops 92 and 93.

Figure 11:
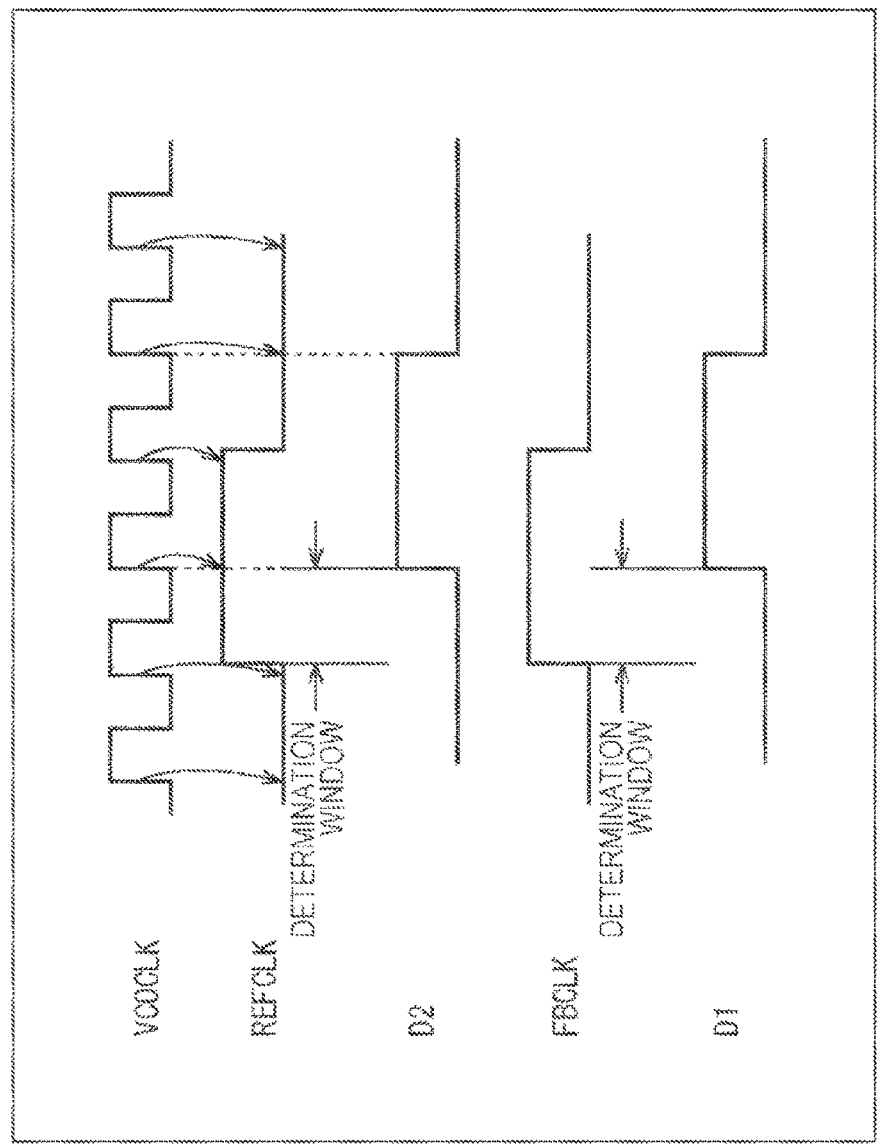
FIG. 11 is a timing chart of the lock detection circuit shown in FIG. 10.

FIG. 11 shows an example of a timing chart of input signals and output signals of the D-flip-flops 92 and 93 of the lock detection circuit 91 shown in FIG. 10.

The D-flip-flop 92 generates and outputs a D1 signal by delaying the comparison clock signal FBCLK input to the D-input by one cycle of the output clock signal VCOCLK.

The D-flip-flop 93 generates and outputs a D2 signal by delaying the reference clock signal REFCLK input to the D-input by one cycle of the output clock signal VCOCLK.

Therefore, in the lock detection circuit 91 in FIG. 10, the lock determination window width is determined by the cycle of the output clock signal VCOCLK.

By the method implemented in the lock detection circuit 91, the lock determination window can be generated without any delay circuit. However, it is necessary to perform timing adjustment to pull in and synchronize with the high-frequency output clock signal VCOCLK, and there are problems such as larger electric current consumption.

<5. Lock Detection Circuit (3)>

In view of the above, a lock detection circuit that observes the edges of the output clock signal VCOCLK with a counter, and detects a locked state has been suggested as another method.

Figure 12:
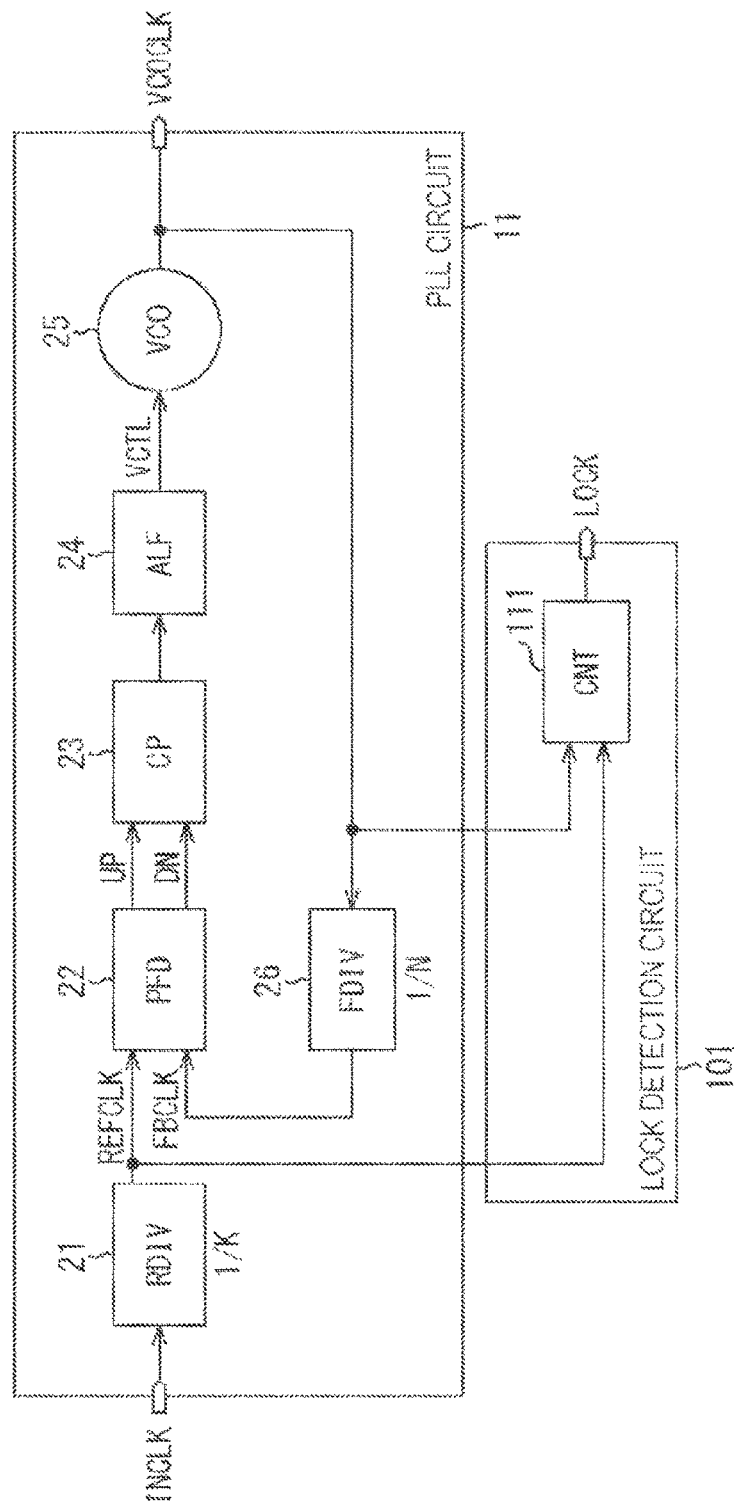
FIG. 12 is a block diagram showing the circuit configuration of a lock detection circuit of a type that observes clock edges with a counter.

FIG. 12 shows the circuit configuration of a lock detection circuit of a type that observes clock edges with a counter.

In FIG. 12, the lock detection circuit 101 shown with the PLL circuit 11 of FIG. 1 includes a counter (CNT) 111.

The counter 111 counts the edges of the output clock signal VCOCLK that is being input, and calculates a moving average frequency from a count result. The counter 111 then determines whether the calculated moving average frequency is within the range between a VCOCLK determination threshold 1 and a VCOCLK determination threshold 2. The counter 111 detects an unlocked state when the moving average frequency is outside the range, and detects a locked state when the moving average frequency is within the range.

In the lock detection circuit 101 of such a clock edge observing type, a locked state is not erroneously detected in a case where the pulse width of the comparison clock signal FBCLK is small, or where the phase of the comparison clock signal FBCLK dynamically and greatly varies as in the fractional-N PLL circuit 81 as described above.

However, the average frequency is calculated and is compared with determination threshold values, and therefore, a locked state might be erroneously detected even in a state in which the PLL circuit 11 is not stable due to its loop design or the like.

Figure 13:
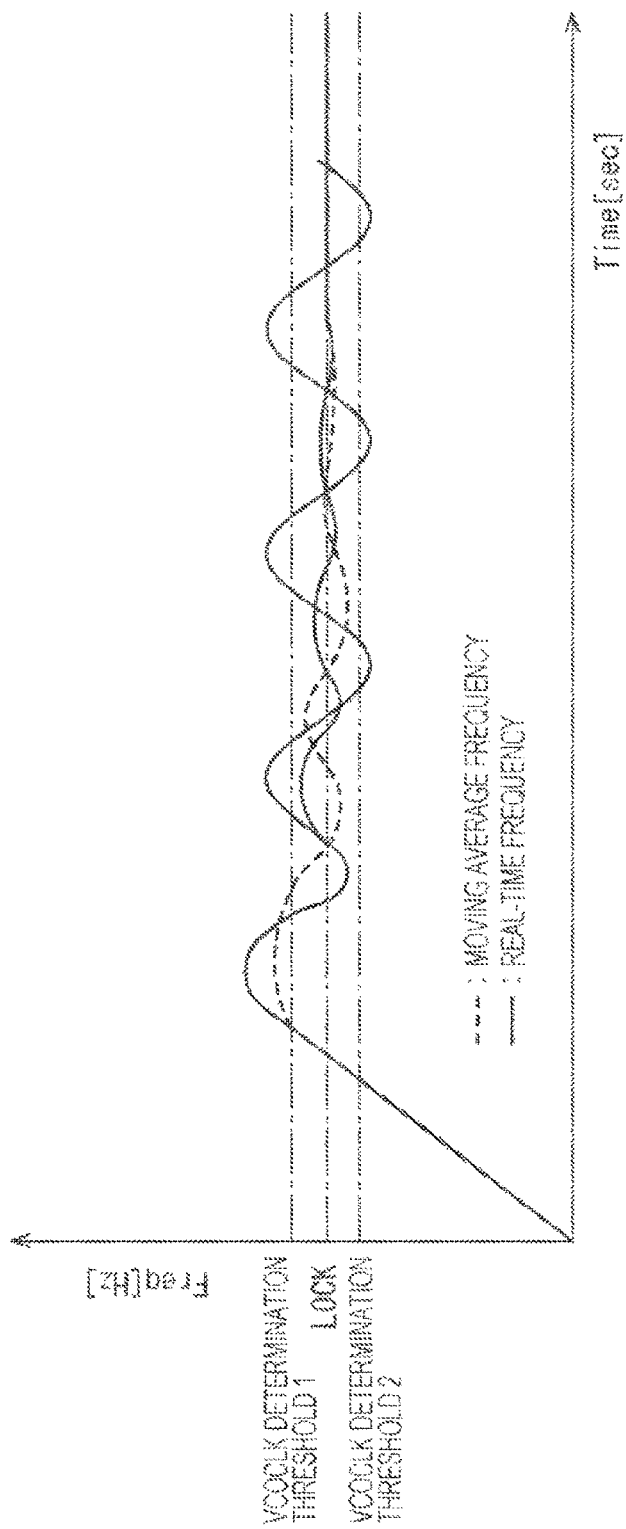
FIG. 13 is a diagram for explaining a case where the lock detection circuit shown in FIG. 12 erroneously detects a locked state.

FIG. 13 is a diagram for explaining a case where the lock detection circuit 101 erroneously detects a locked state.

FIG. 13 is a graph showing the moving average frequency calculated by the counter 111 in accordance with the elapsed time, and the actual frequency (real-time frequency).

In FIG. 13, the moving average frequency is indicated by a dashed line, and the real-time frequency is indicated by a solid line.

Note that, in FIG. 13, after the real-time frequency drops for the first time and then increases again, two types of solid-line waveforms indicating the real-time frequency are shown. When the moving average frequency is calculated, each of the two types of real-time frequency is observed as indicated by the dashed-line waveform.

Since the moving average frequency indicated by the dashed line converges on the LOCK frequency with the lapse of time, the counter 111 detects a locked state at the time when the calculated moving average frequency falls within the range between the VCOCLK determination threshold 1 and the VCOCLK determination threshold 2.

However, while one of the two types of real-time frequency described above converges on the LOCK frequency and is in a normal locked state, the other type of real-time frequency varies with a certain variation width that crosses both the VCOCLK determination threshold 1 and the VCOCLK determination threshold 2, and is not in a locked state.

As described above, even the lock detection circuit 101 of a clock edge observing type erroneously detects a locked state in some cases. Further, locked state determination is performed after the average frequency calculation, and therefore, detecting a locked state takes a long time.

<6. Lock Detection Circuit (4)>

Next, a lock detection circuit that detects a locked state by monitoring the voltage signal VCTL for controlling the voltage controlled oscillator 25 has been suggested as another lock detection method.

Figure 14:
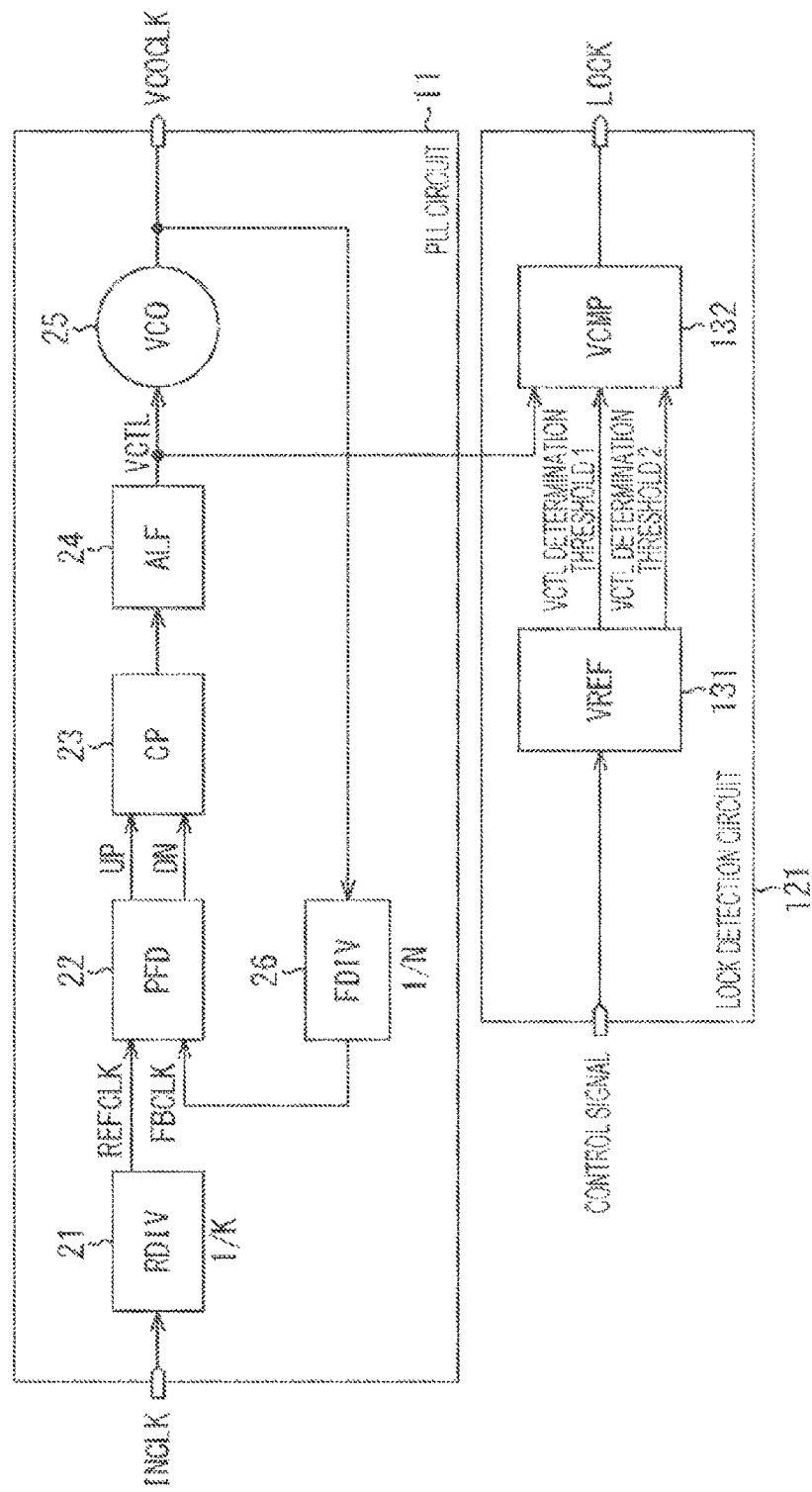
FIG. 14 is a block diagram showing the circuit configuration of a lock detection circuit of a type that monitors a voltage signal VCTL.

FIG. 14 shows the circuit configuration of a lock detection circuit of the type that monitors the voltage signal VCTL.

In FIG. 14, a lock detection circuit 121 shown together with the PLL circuit 11 of FIG. 1 includes a reference voltage generation circuit (Voltage Reference: VREF) 131 and a voltage comparator (VCMP) 132.

The reference voltage generation circuit 131 sets a VCTL determination threshold 1 and a VCTL determination threshold 2, which are determination thresholds to be used for lock determination, in accordance with a control signal being input, and outputs the thresholds to the voltage comparator 132.

Using the VCTL determination threshold 1 and the VCTL determination threshold 2 supplied from the reference voltage generation circuit 131, the voltage comparator 132 determines whether the voltage signal VCTL supplied from the analog loop filter 24 of the PLL circuit 11 falls within the range between the VCTL determination threshold 1 and VCTL determination threshold 2. The voltage comparator 132 detects an unlocked state when the voltage signal VCTL is outside the range, and detects a locked state when the voltage signal VCTL is within the range. Since the voltage signal VCTL for controlling the voltage controlled oscillator 25 is correlated with the output clock signal VCOCLK, the output clock frequency FRQ_VCOCLK can be estimated from the voltage signal VCTL.

Figure 15:
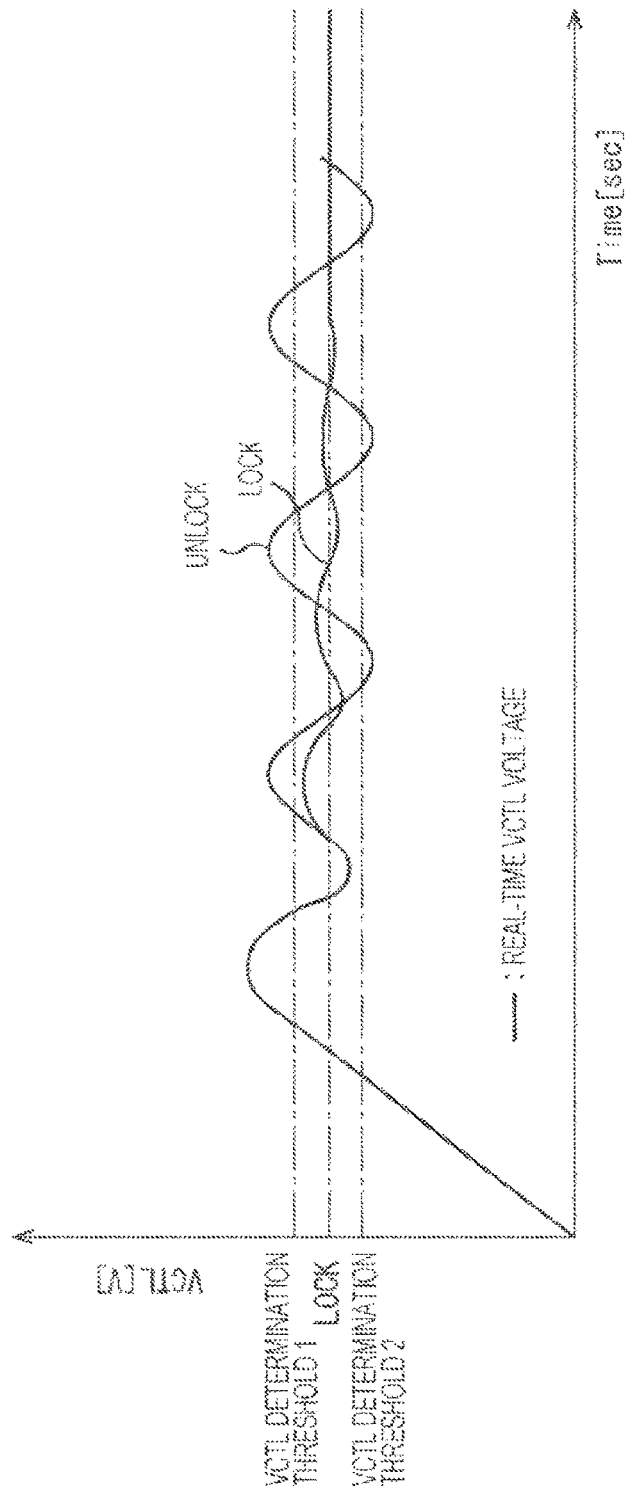
FIG. 15 is a diagram for explaining locked and unlocked states in the lock detection circuit shown in FIG. 14.

FIG. 15 is a graph showing changes in the actual voltage signal VCTL (real-time VCTL voltage) over time.

The lock detection circuit 121 of such a type that monitors the voltage signal VCTL constantly monitors changes in the voltage signal VCTL (real-time VCTL voltage). Even if the PLL circuit 11 is not stable due to its loop design or the like, the lock detection circuit 121 can detect an unlocked state by immediately noticing that the voltage signal VCTL exceeds the determination threshold.

Meanwhile, in the lock detection circuit 121, it is necessary to set the VCTL determination threshold 1 and the VCTL determination threshold 2, but it is difficult to set accurate values for the frequency division settings in the PLL circuit 11 and variations in the PVT conditions.

Further, the reference voltage generation circuit 131 and the voltage comparator 132 are analog circuits, and therefore, there is a possibility of an increase in cost due to an increase in adjustment work and an increase in the circuit area.

The above described four lock detection circuits, which are the lock detection circuit diagram 41 shown in FIG. 2, the lock detection circuit 91 in FIG. 10, the lock detection circuit 101 in FIG. 12, and the lock detection circuit 121 in FIG. 14 might perform erroneous detection under predetermined conditions such as a case where the pulse width of the comparison clock signal FBCLK is small or a case where the phase of the comparison clock signal FBCLK dynamically and greatly changes, as described above. Also, these lock detection circuits might perform erroneous detection in a case where the PLL is not stable due to its loop design or the like. Therefore, there is a possibility that detecting a locked state will take a long time, adjustment will become difficult, and the costs will increase, for example.

In view of the above, a lock detection circuit to which the present technology is applied will be described below.

<7. First Embodiment of a Lock Detection Circuit>

Figure 16:
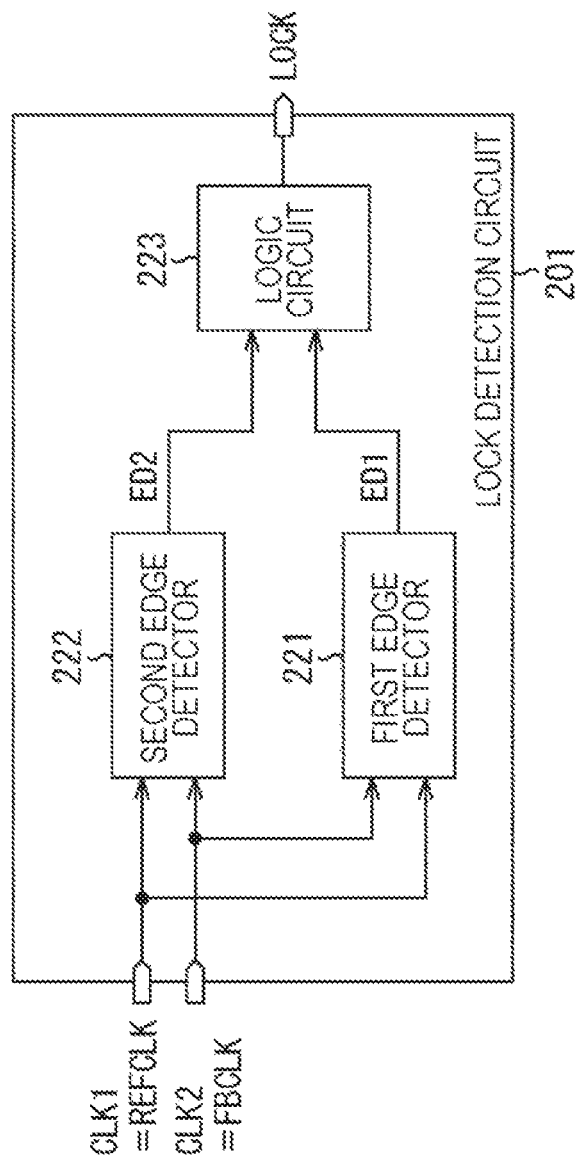
FIG. 16 is a block diagram of a first embodiment of a lock detection circuit to which the present technology is applied.

FIG. 16 is a block diagram of a first embodiment of a lock detection circuit to which the present technology is applied.

The lock detection circuit 201 in FIG. 16 includes a first edge detector 221, a second edge detector 222, and a logic circuit 223.

A first clock signal CLK1 and a second clock signal CLK2 are input to the lock detection circuit 201. For example, the reference clock signal REFCLK of the PLL circuit 11 or the PLL circuit 81 described above is input as the first clock signal CLK1, and the comparison clock signal FBCLK of the PLL circuit 11 or the PLL circuit 81 is input as the second clock signal CLK2.

The lock detection circuit 201 detects a locked state of the input first clock signal CLK1 and the input second clock signal CLK2. In a case where the first clock signal CLK1 and the second clock signal CLK2 are in a locked state, the lock detection circuit 201 outputs the "Hi" lock detection signal LOCK. In a case where the clock signals are in an unlocked state, the lock detection circuit 201 outputs a "Low" lock detection signal LOCK.

The first edge detector 221 detects an edge of the second clock signal CLK2 during one cycle of the first clock signal CLK1, if any, and outputs the detection result as an ED1 signal to the logic circuit 223.

The second edge detector 222 detects an edge of the first clock signal CLK1 during one cycle of the second clock signal CLK2, if any, and outputs the detection result as an ED2 signal to the logic circuit 223.

The logic circuit 223 performs a logical operation on the ED1 signal as the detection result from the first edge detector 221 and the ED2 signal as the detection result from the second edge detector 222.

Figure 17:
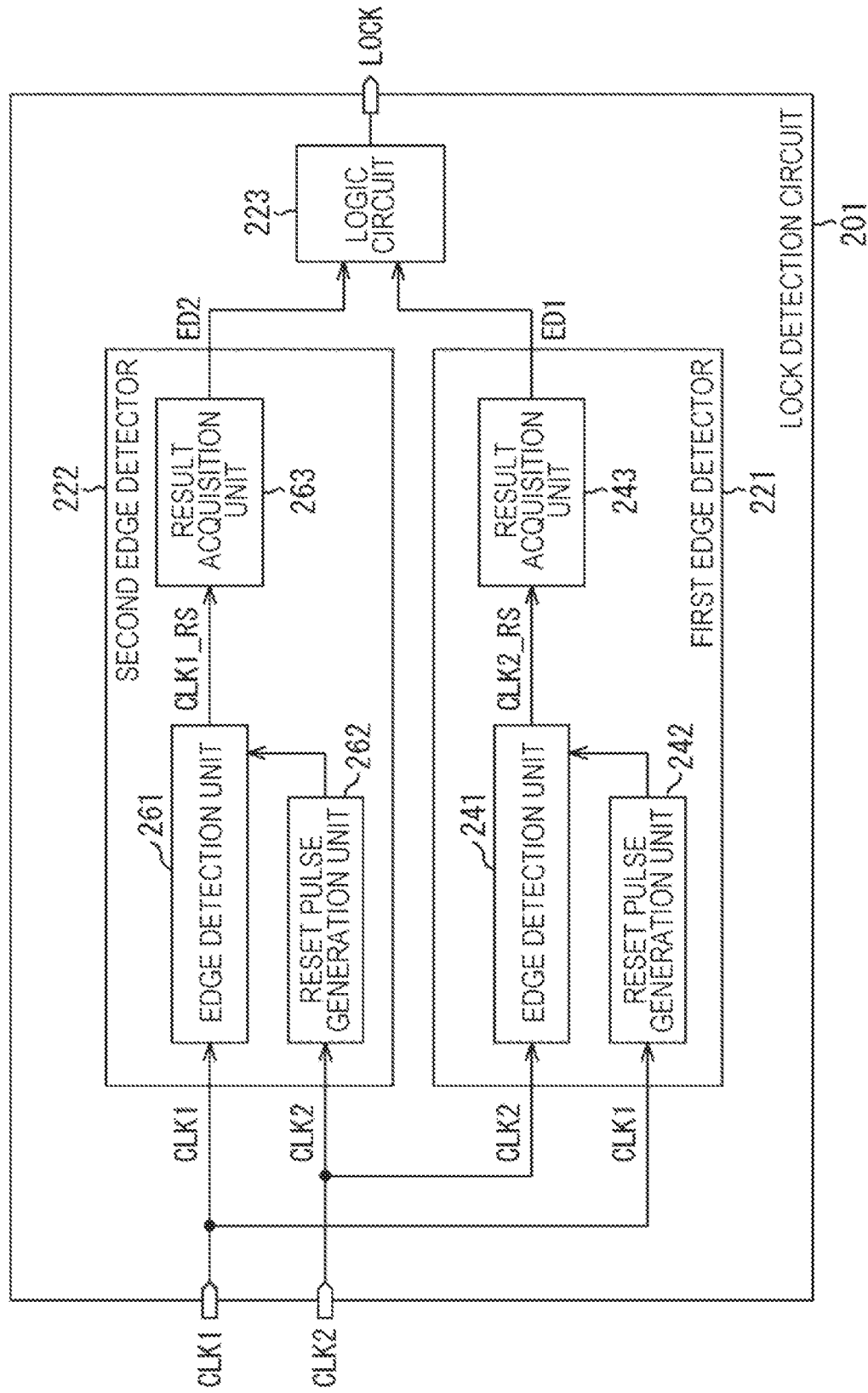
FIG. 17 is a block diagram of the lock detection circuit, showing specific configurations of a first edge detector and a second edge detector shown in FIG. 16.

FIG. 17 is a block diagram of the lock detection circuit 201, showing specific configurations of the first edge detector 221 and the second edge detector 222 shown in FIG. 16.

The first edge detector 221 includes an edge detection unit (first edge detection unit) 241, a reset pulse generation unit (first reset pulse generation unit) 242, and a result acquisition unit (first result acquisition unit) 243.

The edge detection unit 241 detects the presence/absence of an edge of the second clock signal CLK2 being input, and outputs the detection result as an edge detection signal CLK2_RS to the result acquisition unit 243.

The reset pulse generation unit 242 generates a reset pulse for resetting the edge detection unit 241 in each cycle of the first clock signal CLK1, and outputs the reset pulse to the edge detection unit 241.

The result acquisition unit 243 acquires the detection result supplied from the edge detection unit 241 immediately before the edge detection unit 241 is reset in each cycle by the reset pulse supplied from the reset pulse generation unit 242, and outputs the detection result as the ED1 signal.

The second edge detector 222 includes an edge detection unit (second edge detection unit) 261, a reset pulse generation unit (second reset pulse generation unit) 262, and a result acquisition unit (second result acquisition unit) 263.

The edge detection unit 261 detects the presence/absence of an edge of the first clock signal CLK1 being input, and outputs the detection result as an edge detection signal CLK1_RS to the result acquisition unit 263.

The reset pulse generation unit 262 generates a reset pulse for resetting the edge detection unit 261 in each cycle of the second clock signal CLK2, and outputs the reset pulse to the edge detection unit 261.

The result acquisition unit 263 acquires the detection result supplied from the edge detection unit 261 immediately before the edge detection unit 261 is reset in each cycle by the reset pulse supplied from the reset pulse generation unit 262, and outputs the detection result as the ED2 signal.

Accordingly, the configurations of the first edge detector 221 and the second edge detector 222 are identical, and the input destinations of the first clock signal CLK1 and the second clock signal CLK2 are switched.

<7.1 First Example Specific Configuration of the First Embodiment>

Figure 18:
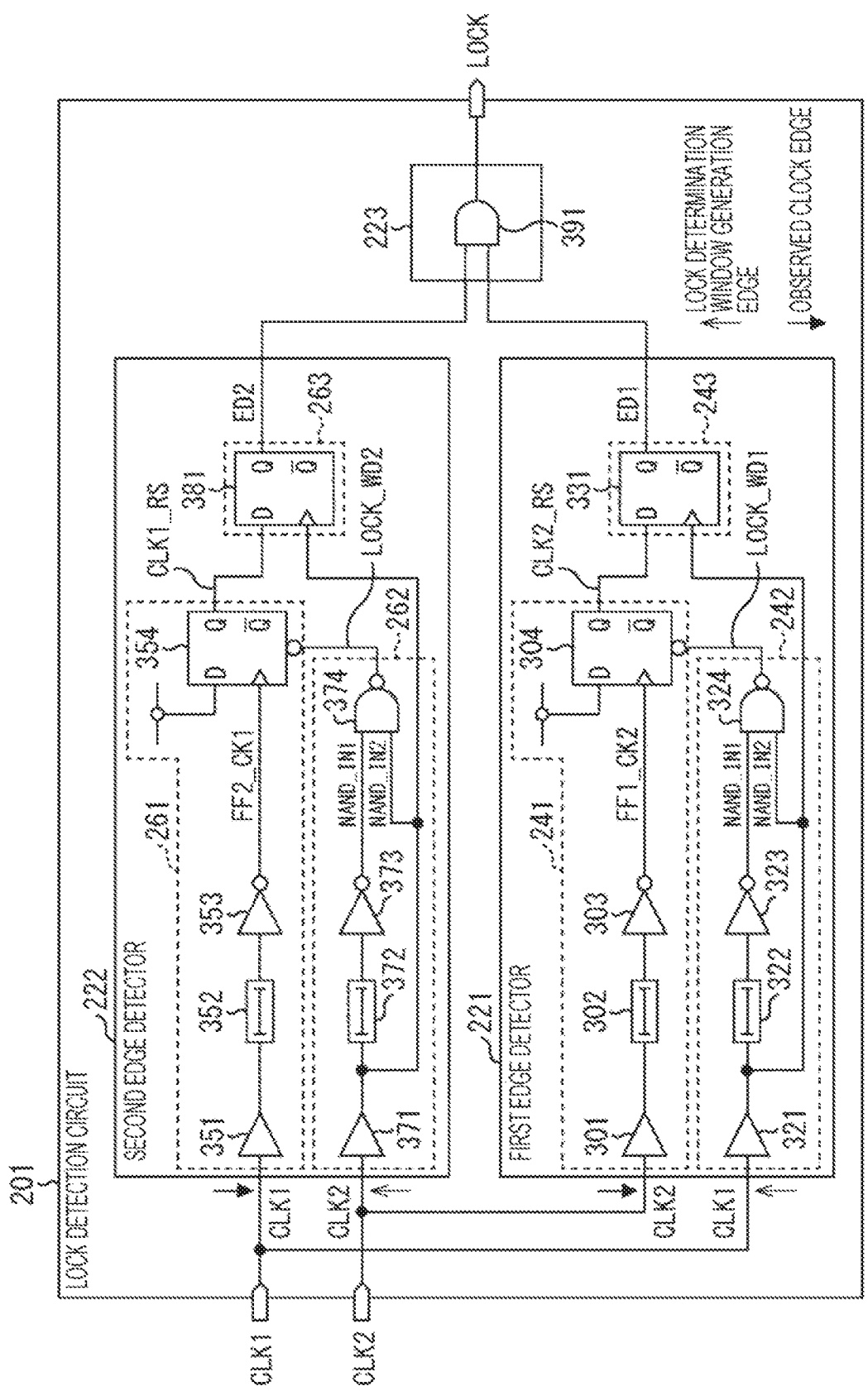
FIG. 18 is a diagram showing a first specific configuration of the first edge detector and the second edge detector.

FIG. 18 shows a first specific configuration of the first edge detector 221 and the second edge detector 222.

First, the first edge detector 221 is described.

The edge detection unit 241 includes a buffer 301, a delay circuit 302, an inverter 303, and a D-flip-flop 304.

The second clock signal CLK2 input to the edge detection unit 241 is delayed by a predetermined time at the buffer 301 and the delay circuit 302, and the logic is then inverted by the inverter 303. The second clock inverted signal FF1_CK2 inverted by the inverter 303 is then input to the CLK terminal of the D-flip-flop 304.

A "Hi" signal is constantly input to the D-input of the D-flip-flop 304. At the timing of a rise of the second clock inverted signal FF1_CK2 input to the CLK terminal, the D-flip-flop 304 outputs the "Hi" signal of the D-input as the edge detection signal CLK2_RS from the Q-output. Here, a second clock inverted signal FF1_CK2 input to the CLK terminal is an inverted signal of the second clock signal CLK2. In other words, the D-flip-flop 304 outputs the "Hi" signal of the D-input as the edge detection signal CLK2_RS from the Q-output, at the timing of a fall of the second clock signal CLK2.

Further, the edge detection signal CLK2_RS of the Q-output of the D-flip-flop 304 is reset at a time when the output from the reset pulse generation unit 242 becomes "Low".

The reset pulse generation unit 242 includes a buffer 321, a delay circuit 322, an inverter 323, and a NAND circuit 324.

The first clock signal CLK1 input to the reset pulse generation unit 242 is delayed for a predetermined time at the buffer 321 and the delay circuit 322, and the logic is then inverted by the inverter 323. A first clock inverted signal CLK1_INV having its logic inverted by the inverter 323 is then input as a first NAND input signal NAND_IN1 to the NAND circuit 324, and the first clock signal CLK1 as the output from the buffer 321 is input as a second NAND input signal NAND_IN2 to the NAND circuit 324.

The NAND circuit 324 calculates the negative AND (NAND) of the first NAND input signal NAND_IN1 and the second NAND input signal NAND_IN2, and outputs the calculation result as a first lock determination window signal LOCK_WD1 to the RST terminal of the D-flip-flop 304.

The result acquisition unit 243 is formed with a D-flip-flop 331.

The edge detection signal CLK2_RS output from the Q-output of the edge detection unit 241 is input to the D-input of the D-flip-flop 331, and the first clock signal CLK1 from the reset pulse generation unit 242 is input to the CLK terminal.

The D-flip-flop 331 outputs the edge detection signal CLK2_RS at the timing of a rising edge of the first clock signal CLK1 as the ED1 signal from the Q-output.

Figure 19:
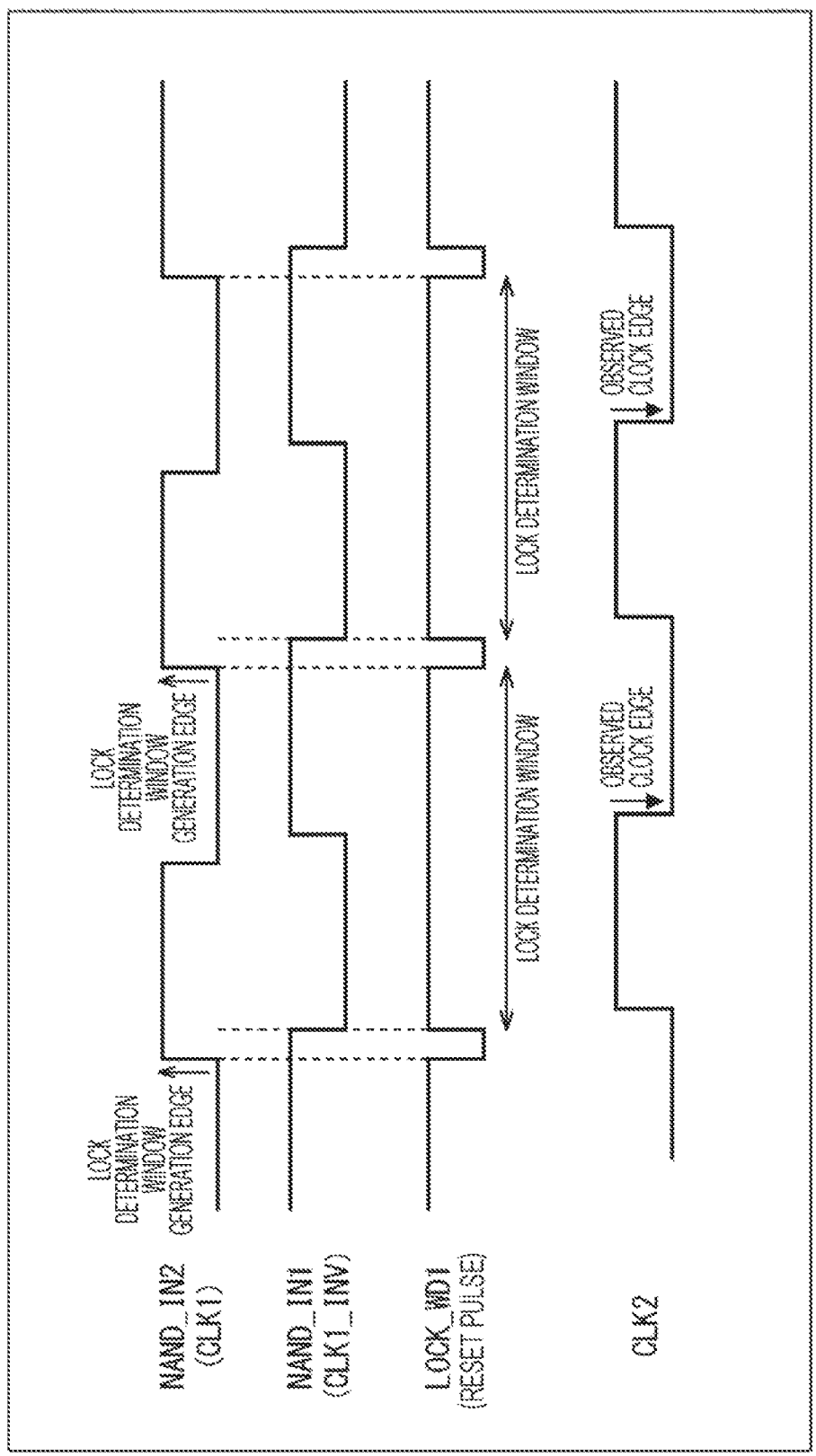
FIG. 19 is a timing chart for roughly explaining operation of the first edge detector.

FIG. 19 is a timing chart for roughly explaining operation of the first edge detector 221.

The reset pulse generation unit 242 outputs the first lock determination window signal LOCK_WD1. The first lock determination window signal LOCK_WD1 is the NAND of the first NAND input signal NAND_IN1, which is the first clock inverted signal CLK1_INV delayed by a predetermined time at the delay circuit 322, and the second NAND input signal NAND_IN2, which is the first clock signal CLK1.

The first lock determination window signal LOCK_WD1 is input to the RST terminal of the D-flip-flop 304 of the edge detection unit 241. As the D-flip-flop 304 resets the Q-output when the pulse input to the RST terminal is "Low", the first lock determination window signal LOCK_WD1 functions as a reset pulse for resetting the output of the D-flip-flop 304.

The D-flip-flop 304 is reset in each cycle of the first clock signal CLK1, and the period during which the reset pulse is "Low" corresponds to the delay amount of the delay circuit 322.

In a case where a falling edge of the second clock signal CLK2 (a rising edge of the second clock inverted signal FF1_CK2) is detected during the reset pulse is "Hi", the D-flip-flop 304 outputs a "Hi" edge detection signal CLK2_RS from the Q-output.

That is, the period during which the reset pulse is "Hi" is the lock determination window for determining whether or not there is a locked state, and this lock determination window is generated at each rising edge of the first clock signal CLK1. A locked state or an unlocked state is then determined, depending on whether or not a falling edge of the second clock signal CLK2 is observed in the generated lock determination window. Since the result of determination as to whether there is a locked state or an unlocked state is reset in each cycle of the first clock signal CLK1, the edge detection signal CLK2_RS is the edge detection result on a cycle basis.

Here, the edges of the clock signal for generating the lock determination window are referred to as lock determination window generation edges, and the edges of the current clock signal being observed are referred to as observed clock edges. In the edge detection unit 241 in this case, the lock determination window generation edges are the rising edges of the first clock signal CLK1, and the observed clock edges are the falling edges of the second clock signal CLK2, as shown in FIG. 19.

The D-flip-flop 331 of the result acquisition unit 243 acquires the edge detection signal CLK2_RS immediately before the D-flip-flop 304 of the edge detection unit 241 is reset in one cycle, and outputs the edge detection signal CLK2_RS as the ED1 signal from the Q-output.

Therefore, the first edge detector 221 detects a falling edge of the second clock signal CLK2, if any, in the lock determination window in one cycle of the first clock signal CLK1, the lock determination window being determined at a rising edge of the first clock signal CLK1.

Note that the delay circuit 302 of the edge detection unit 241 is provided so that the second clock signal CLK2 as the clock to be observed is input to the D-flip-flop 304 without fail after the D-flip-flop 304 is reset by the reset pulse. Therefore, the delay circuit 302 is not necessarily prepared.

Next, the second edge detector 222 is described.

The edge detection unit 261 includes a buffer 351, a delay circuit 352, an inverter 353, and a D-flip-flop 354.

The buffer 351, the delay circuit 352, the inverter 353, and the D-flip-flop 354 of the edge detection unit 261 are equivalent to the buffer 301, the delay circuit 302, the inverter 303, and the D-flip-flop 304 of the edge detection unit 241 described above, and perform the same operations as those in the edge detection unit 241. However, the current signal to be processed is not the second clock signal CLK2 but the first clock signal CLK1, and therefore, the signal to be input to the CLK terminal of the D-flip-flop 354 is a first clock inverted signal FF2_CK1.

A "Hi" signal is constantly input to the D-input of the D-flip-flop 354. At the timing of a rise of the first clock inverted signal FF2_CK1 input to the CLK terminal, the D-flip-flop 354 outputs the "Hi" signal of the D-input as the edge detection signal CLK1_RS from the Q-output. Here, the first clock inverted signal FF2_CK1 input to the CLK terminal is an inverted signal of the first clock signal CLK1. In other words, the D-flip-flop 354 outputs the "Hi" signal of the D-input as the edge detection signal CLK1_RS from the Q-output, at the timing of a fall of the first clock signal CLK1.

The reset pulse generation unit 262 includes a buffer 371, a delay circuit 372, an inverter 373, and a NAND circuit 374.

The buffer 371, the delay circuit 372, the inverter 373, and the NAND circuit 374 of the reset pulse generation unit 262 are equivalent to the buffer 321, the delay circuit 322, the inverter 323, and the NAND circuit 324 of the reset pulse generation unit 242 described above, and perform the same operations as those in the reset pulse generation unit 242. However, the current signal to be processed is not the first clock signal CLK1 but the second clock signal CLK2.

The reset pulse generation unit 262 outputs a second lock determination window signal LOCK_WD2. The second lock determination window signal LOCK_WD2 is the NAND of the first NAND input signal NAND_IN1, which is a second clock inverted signal CLK2_INV delayed by a predetermined time at the delay circuit 372, and the second NAND input signal NAND_IN2, which is the second clock signal CLK2.

The result acquisition unit 263 is formed with a D-flip-flop 381.

The D-flip-flop 381 outputs the edge detection signal CLK1_RS at the timing of a rising edge of the second clock signal CLK2 as the ED2 signal from the Q-output.

Therefore, the second edge detector 222 detects a falling edge of the first clock signal CLK1, if any, in the lock determination window in one cycle of the second clock signal CLK2, the lock determination window being determined at a rising edge of the second clock signal CLK2.

Next, the logic circuit 223 is described.

The logic circuit 223 is formed with an AND circuit 391.

The AND circuit 391 calculates the logical product (AND) of the ED1 signal as the detection result from the first edge detector 221 and the ED2 signal as the detection result from the second edge detector 222, and outputs the calculation result as the lock detection signal LOCK.

<Timing Chart at the Time of a Locked State>

Figure 20:
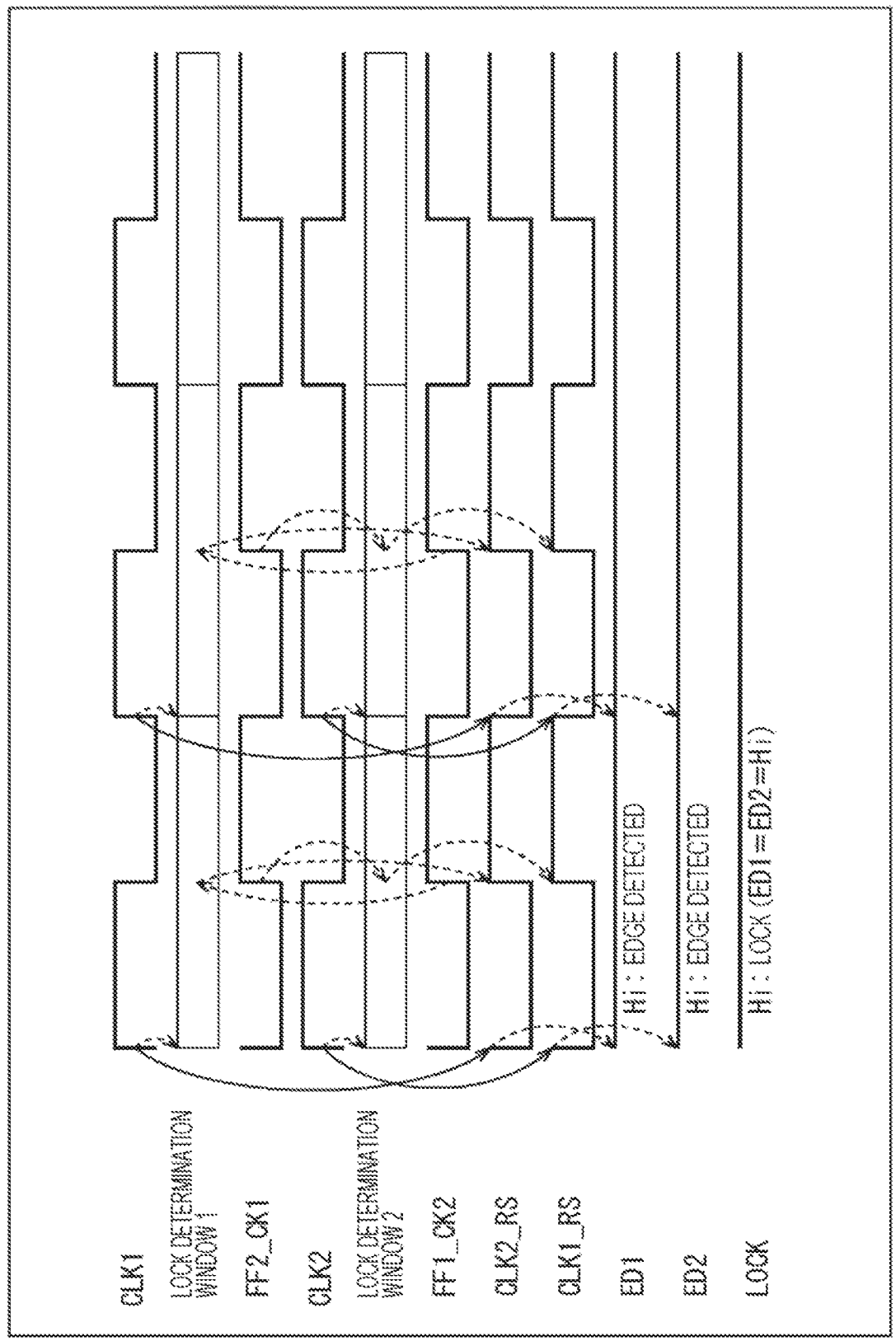
FIG. 20 is a timing chart at the time of a locked state.

FIG. 20 is a timing chart showing the operation to be performed when there is a locked state in the first specific configuration of the lock detection circuit 201.

In FIG. 20, a lock determination window 1 is a lock determination window generated in accordance with the first clock signal CLK1, and corresponds to the first lock determination window signal LOCK_WD1 shown in FIG. 19. A lock determination window 2 is a lock determination window generated in accordance with the second clock signal CLK2, and corresponds to the second lock determination window signal LOCK_WD2 shown in FIG. 18. In the lock determination window 1 and the lock determination window 2 shown in FIG. 20, the "Low" periods are extremely short, and therefore, are not shown in the drawing.

In the first edge detector 221, a lock determination window 1 is generated at a rising edge of the first clock signal CLK1. When a rising edge of the second clock inverted signal FF1_CK2 (corresponding to a falling edge of the second clock signal CLK2) is detected during the generated lock determination window 1, the edge detection signal CLK2_RS switches to "Hi". The "Hi" edge detection signal CLK2_RS is acquired at the timing of a later rising edge of the first clock signal CLK1, and a "Hi" ED1 signal is output.

In the second edge detector 222, a lock determination window 2 is generated at a rising edge of the second clock signal CLK2. When a rising edge of the first clock inverted signal FF2_CK1 (corresponding to a falling edge of the first clock signal CLK1) is detected during the generated lock determination window 2, the edge detection signal CLK1_RS switches to "Hi". The "Hi" edge detection signal CLK1_RS is acquired at the timing of a later rising edge of the second clock signal CLK2, and a "Hi" ED2 signal is output.

Since both the ED1 signal and the ED2 signal are "Hi", the lock detection signal LOCK that is output from the logic circuit 223 (the AND circuit 391) also becomes "Hi".

Thus, with the first specific configuration of the lock detection circuit 201, a locked state can be detected correctly.

<Timing Chart at the Time of a Locked State (an Example where the CLK2 pulse width is small)>

Figure 21:
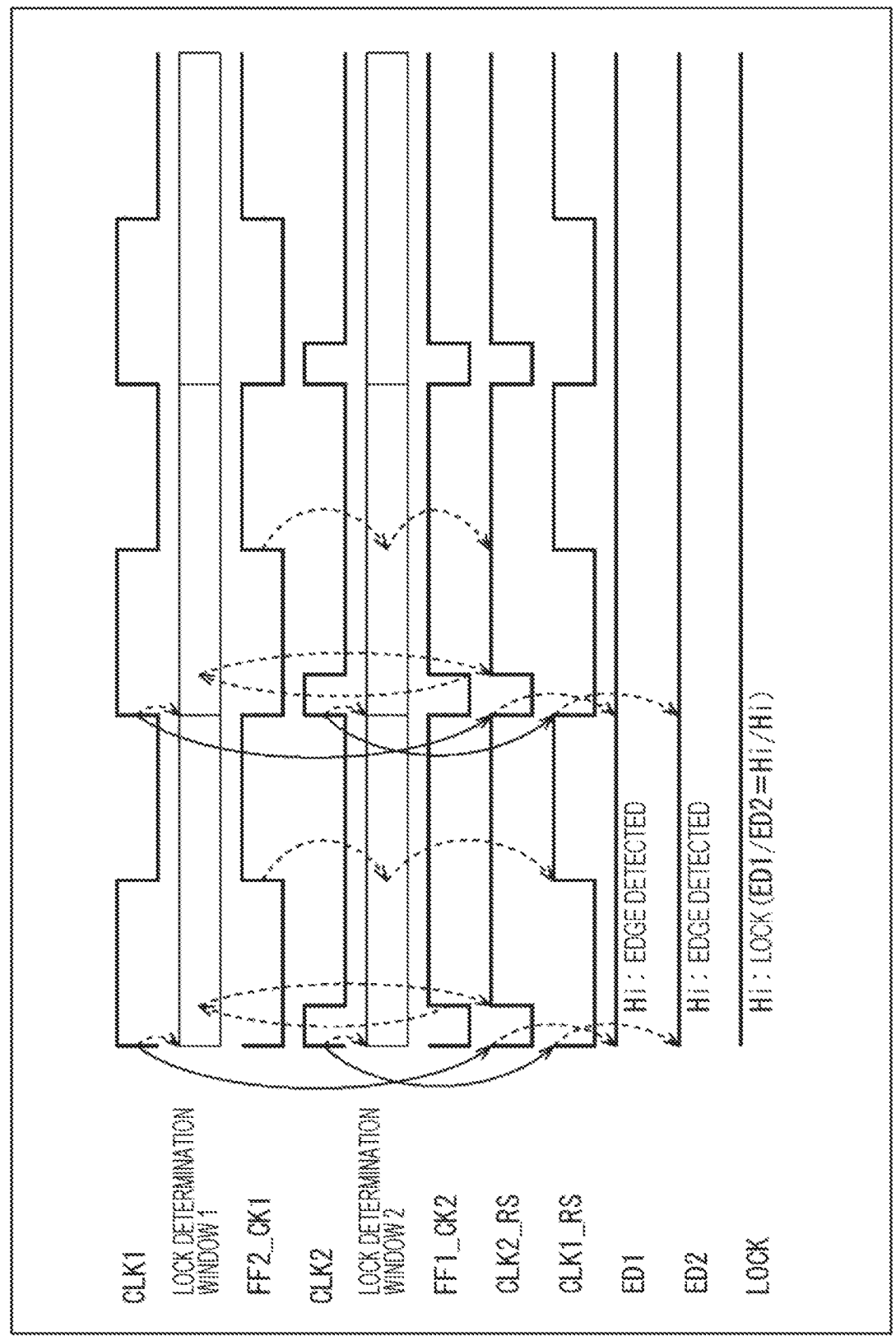
FIG. 21 is a timing chart at a time when a CLK2 pulse width is small, and there is a locked state.

FIG. 21 is a timing chart showing the operation to be performed when the pulse width of the second clock signal CLK2 is small, and there is a locked state in the first specific configuration of the lock detection circuit 201.

Although not specifically described herein, even if the pulse width of the second clock signal CLK2 is small, it is possible to correctly detect a locked state, as in the case shown in FIG. 20.

<Timing Chart at the Time of an Unlocked State>

Figure 22:
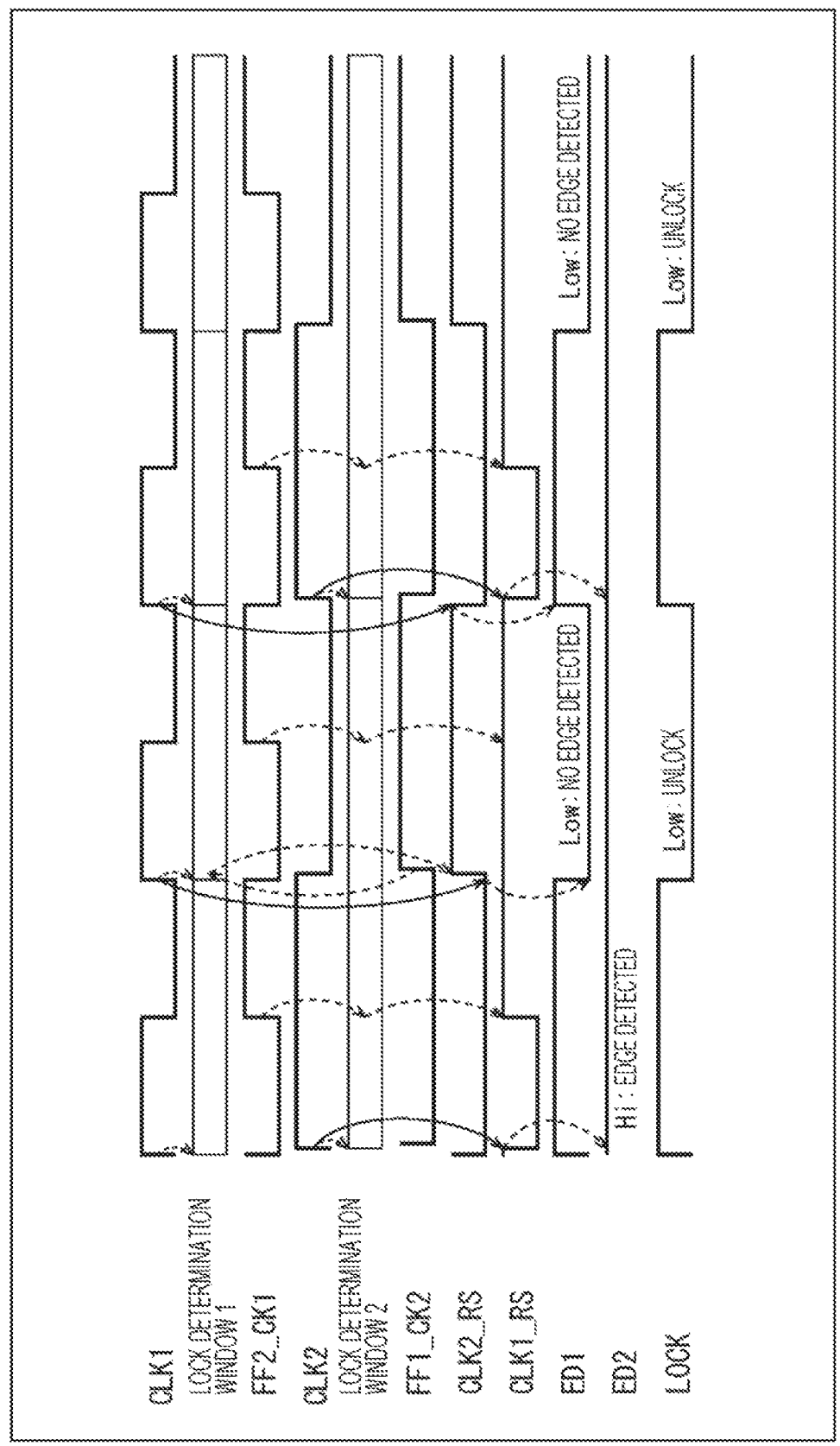
FIG. 22 is a timing chart at the time of an unlocked state.

FIG. 22 is a timing chart showing the operation to be performed when there is an unlocked state in the first specific configuration of the lock detection circuit 201.

Note that FIG. 22 shows a timing chart in a case where the frequency of the second clock signal CLK2 is about 0.5 times the frequency of the first clock signal CLK1.

In the first edge detector 221, a rising edge of the second clock inverted signal FF1_CK2 (corresponding to a falling edge of the second clock signal CLK2) might not be detected during a lock determination window 1 generated at a rising edge of the first clock signal CLK1 in some cases. At that time, a "Low" edge detection signal CLK2_RS is acquired at the timing of a later rising edge of the first clock signal CLK1, and a "Low" ED1 signal is output.

In a case where the ED1 signal is "Low", the lock detection signal LOCK to be output from the logic circuit 223 (the AND circuit 391) also becomes "Low".

Accordingly, there is a state in which the "Low" lock detection signal LOCK is output, and thus, an unlocked state can be correctly detected.

<Timing Chart at the Time of an Unlocked State (an Example where the CLK2 Pulse Width is Small)>

Figure 23:
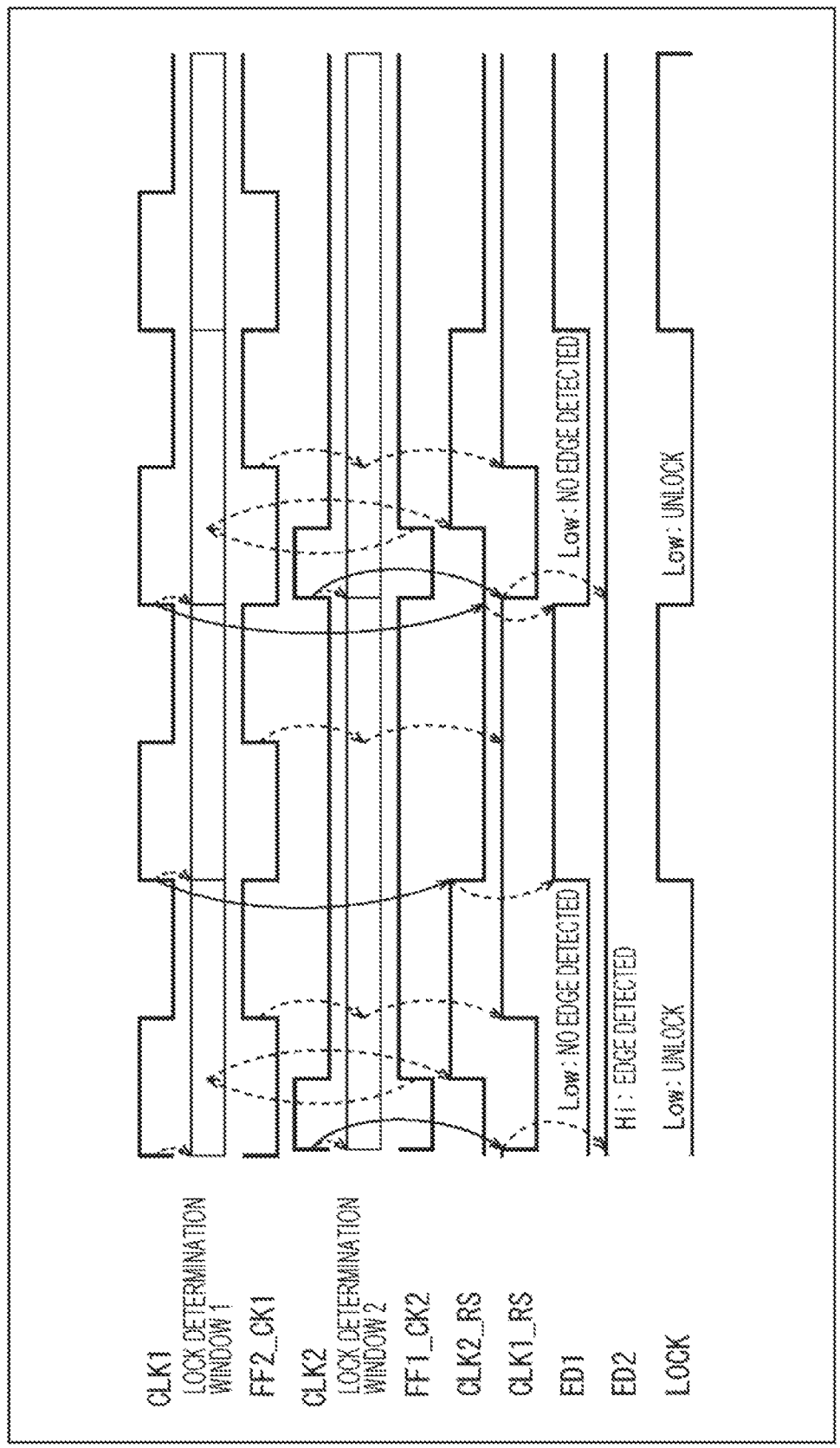
FIG. 23 is a timing chart at a time when the CLK2 pulse width is small, and there is an unlocked state.

FIG. 23 is a timing chart showing the operation to be performed when the pulse width of the second clock signal CLK2 is small, and there is an unlocked state in the first specific configuration of the lock detection circuit 201.

In FIG. 23, there is a state in which a "Low" lock detection signal LOCK is output, as in the case shown in FIG. 22. Thus, even if the pulse width of the second clock signal CLK2 is small, it is possible to correctly detect an unlocked state.

<Timing Chart at the Time of a Locked State (an Example where CLK2 Phase Changes are Large)>

Figure 24:
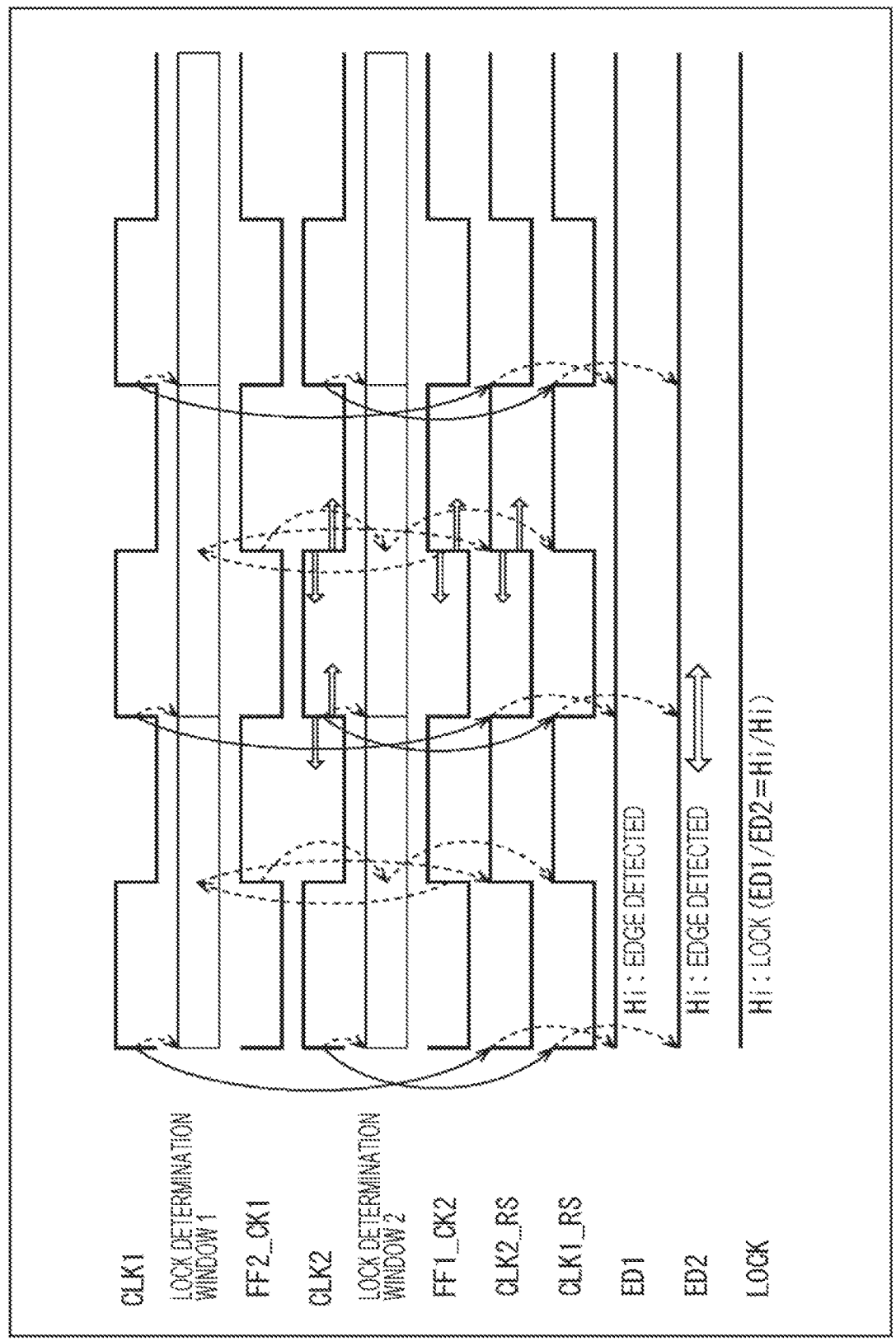
FIG. 24 is a timing chart at the time of a locked state in a case where phase changes are large.

FIG. 24 is a timing chart showing the operation to be performed when there is a locked state in a case where changes in the phase of the second clock signal CLK2 are large in the first specific configuration of the lock detection circuit 201.

As shown in FIG. 24, even in a case where changes in the phase of the second clock signal CLK2 are large, it is possible to correctly detect a locked state, as in the case shown in FIG. 20. In addition, although not shown in any drawing, when there is an unlocked state, the unlocked state can also be correctly detected.

As described above, with the first specific configuration of the lock detection circuit 201, a locked state and an unlocked state can be correctly detected even in a case where the pulse width of the second clock signal CLK2 is small, or in a case where the phase of the second clock signal CLK2 dynamically and greatly changes, for example.

<7.2 Second Example Specific Configuration of the First Embodiment>

Figure 25:
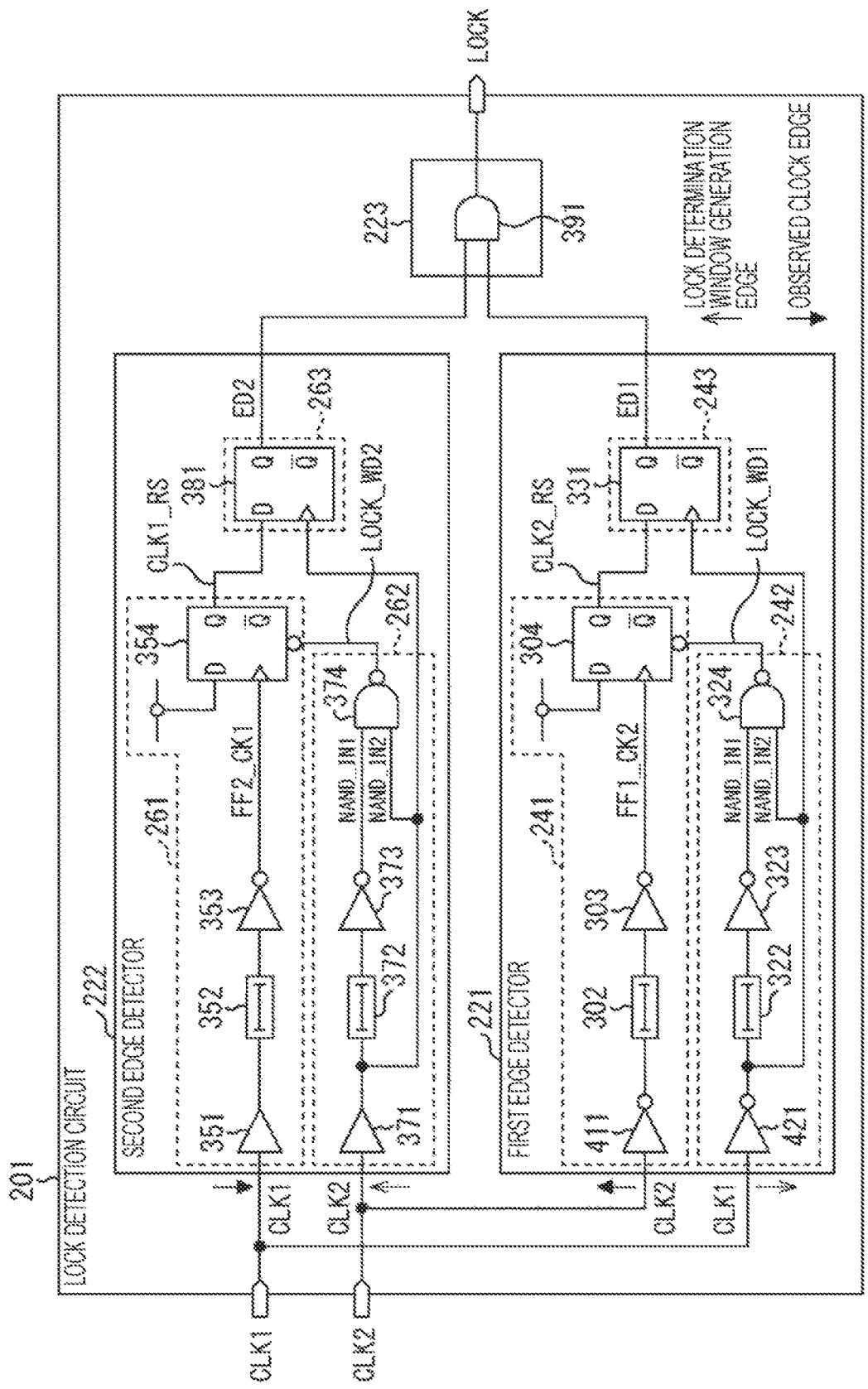
FIG. 25 is a diagram showing a second specific configuration of the first edge detector and the second edge detector.

FIG. 25 shows a second specific configuration of the first edge detector 221 and the second edge detector 222.

In the second specific configuration shown in FIG. 25, the same components as those of the first specific configuration shown in FIG. 18 are denoted by the same reference numerals as those used in FIG. 18, and explanation of them is not unnecessarily repeated herein.

The second specific configuration in FIG. 25 differs from the first specific configuration in FIG. 18 in that the buffer 301 of the edge detection unit 241 of the first edge detector 221 in the first specific configuration is replaced with an inverter 411, and the buffer 321 of the reset pulse generation unit 242 is replaced with an inverter 421.

Accordingly, the edge detection logic (the edge direction) of the lock determination window generation edges and the observed clock edges in the first edge detector 221 of the second specific configuration is the opposite of that in the first edge detector 221 of the above described first specific configuration.

That is, the first edge detector 221 of the above described first specific configuration detects a falling edge of the second clock signal CLK2, if any, in the lock determination window in one cycle of the first clock signal CLK1, the lock determination window being determined at a rising edge of the first clock signal CLK1.

On the other hand, the first edge detector 221 of the second specific configuration detects a rising edge of the second clock signal CLK2, if any, in the lock determination window in one cycle of the first clock signal CLK1, the lock determination window being determined at a falling edge of the first clock signal CLK1.

The configurations of the second edge detector 222 and the logic circuit 223 are the same as those in the above described first specific configuration.

Therefore, the second edge detector 222 detects a falling edge of the first clock signal CLK1, if any, in the lock determination window in one cycle of the second clock signal CLK2, the lock determination window being determined at a rising edge of the second clock signal CLK2.

The AND circuit 391 of the logic circuit 223 calculates the logical product (AND) of the ED1 signal as the detection result from the first edge detector 221 and the ED2 signal as the detection result from the second edge detector 222, and outputs the calculation result as the lock detection signal LOCK.

<Timing Chart at the Time of a Locked State>

Figure 26:
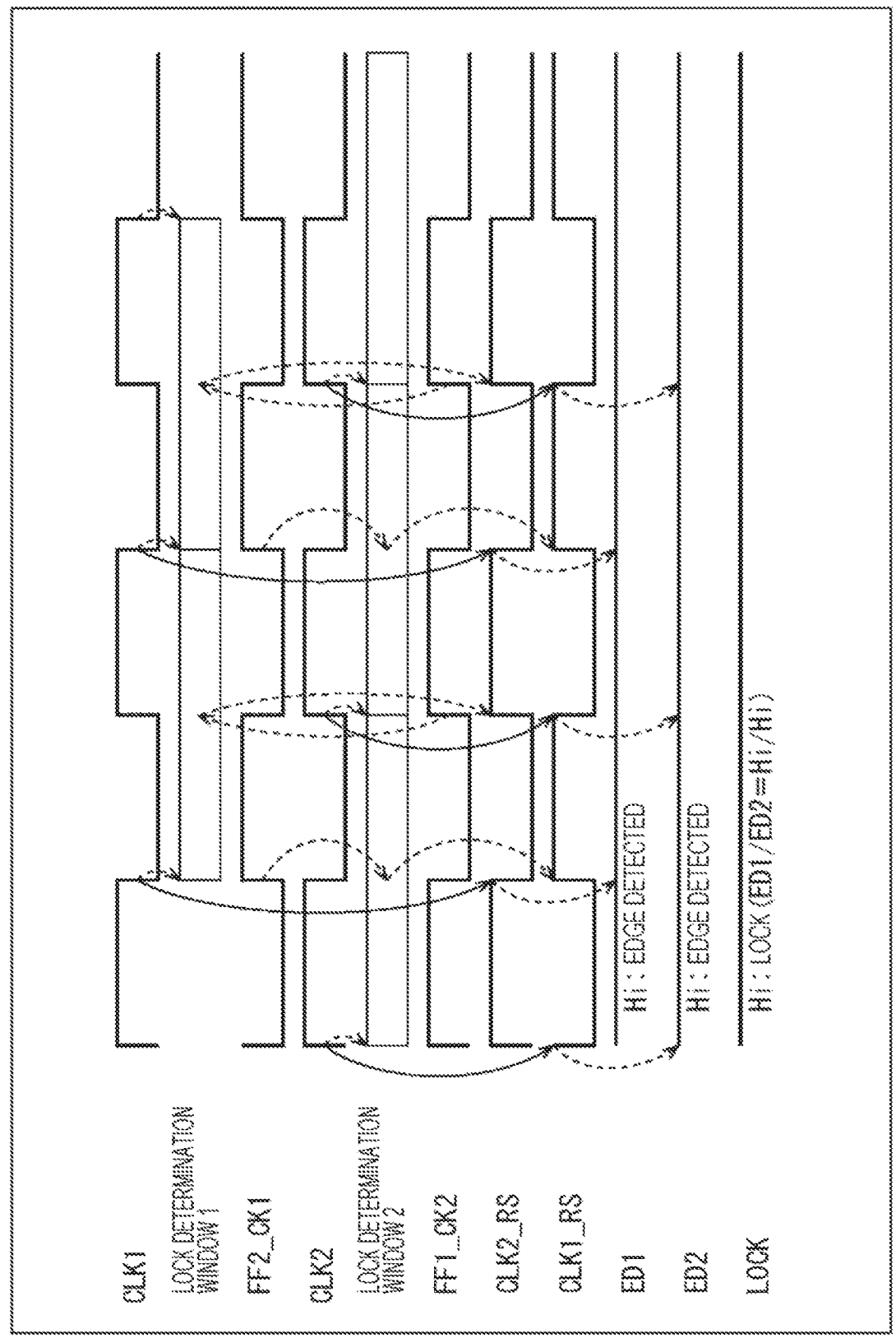
FIG. 26 is a timing chart at the time of a locked state.

FIG. 26 is a timing chart showing the operation to be performed when there is a locked state in the second specific configuration of the lock detection circuit 201.

In the first edge detector 221, a lock determination window 1 is generated at a falling edge of the first clock signal CLK1. When a rising edge of the second clock inverted signal FF1_CK2 (corresponding to a rising edge of the second clock signal CLK2) is detected during the generated lock determination window 1, the edge detection signal CLK2_RS switches to "Hi". The "Hi" edge detection signal CLK2_RS is acquired at the timing of a later falling edge of the first clock signal CLK1, and a "Hi" ED1 signal is output.

In the second edge detector 222, a lock determination window 2 is generated at a rising edge of the second clock signal CLK2. When a rising edge of the first clock inverted signal FF2_CK1 (corresponding to a falling edge of the first clock signal CLK1) is detected during the generated lock determination window 2, the edge detection signal CLK1_RS switches to "Hi". The "Hi" edge detection signal CLK1_RS is acquired at the timing of a later rising edge of the second clock signal CLK2, and a "Hi" ED2 signal is output.

Since both the ED1 signal and the ED2 signal are "Hi", the lock detection signal LOCK that is output from the logic circuit 223 (the AND circuit 391) also becomes "Hi".

Thus, with the second specific configuration of the lock detection circuit 201, a locked state can be correctly detected.

<Timing Chart at the Time of a Locked State (an Example where the CLK2 Pulse Width is Small)>

Figure 27:
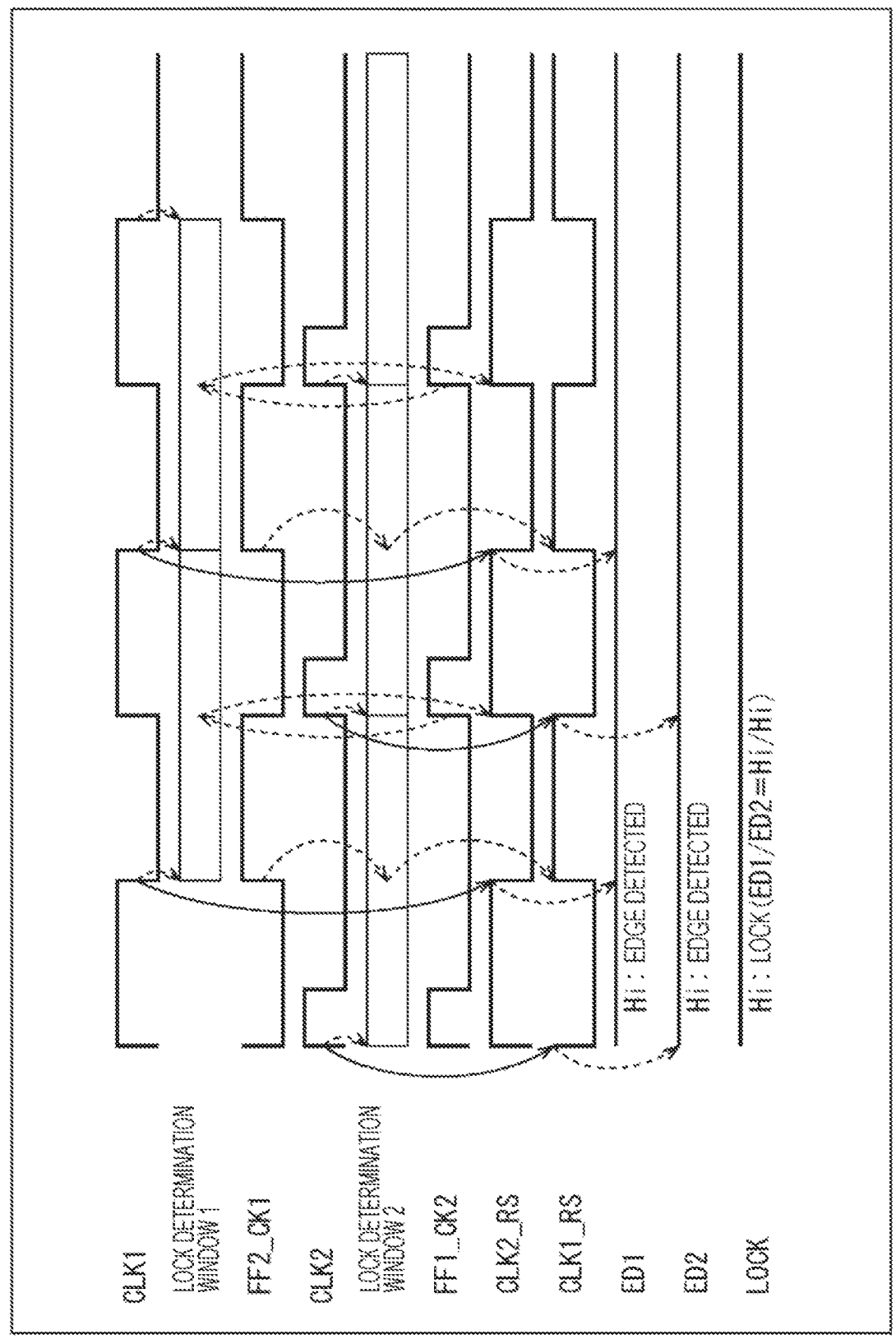
FIG. 27 is a timing chart at a time when the CLK2 pulse width is small, and there is a locked state.

FIG. 27 is a timing chart showing the operation to be performed when the pulse width of the second clock signal CLK2 is small, and there is a locked state in the second specific configuration of the lock detection circuit 201.

As shown in FIG. 27, even if the pulse width of the second clock signal CLK2 is small, it is possible to correctly determine a locked state.

<Timing Chart at the Time of an Unlocked State>

Figure 28:
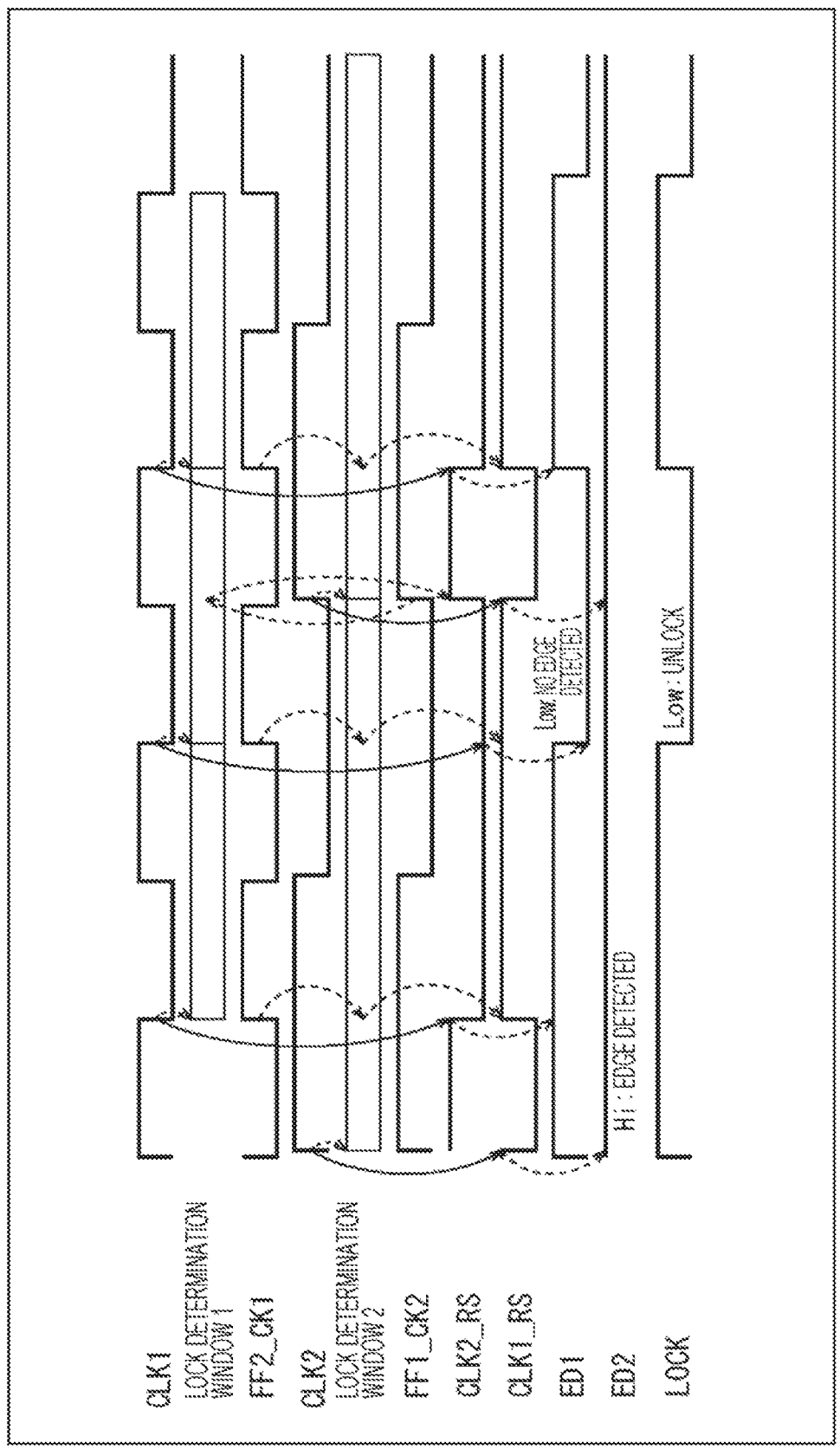
FIG. 28 is a timing chart at the time of an unlocked state.

FIG. 28 is a timing chart showing the operation to be performed when there is an unlocked state in the second specific configuration of the lock detection circuit 201.

Note that FIG. 28 shows a timing chart in a case where the frequency of the second clock signal CLK2 is about 0.5 times the frequency of the first clock signal CLK1, as in the above described case shown in FIG. 22 and others.

In the first edge detector 221, a rising edge of the second clock inverted signal FF1_CK2 (corresponding to a rising edge of the second clock signal CLK2) might not be detected during a lock determination window 1 generated at a falling edge of the first clock signal CLK1 in some cases. At that time, a "Low" edge detection signal CLK2_RS is acquired at the timing of a later falling edge of the first clock signal CLK1, and a "Low" ED1 signal is output.

In a case where the ED1 signal is "Low", the lock detection signal LOCK to be output from the logic circuit 223 (the AND circuit 391) also becomes "Low".

Accordingly, there is a state in which the "Low" lock detection signal LOCK is output, and thus, an unlocked state can be correctly detected.

<Timing Chart at the Time of an Unlocked State (an Example where the CLK2 Pulse Width is Small)>

Figure 29:
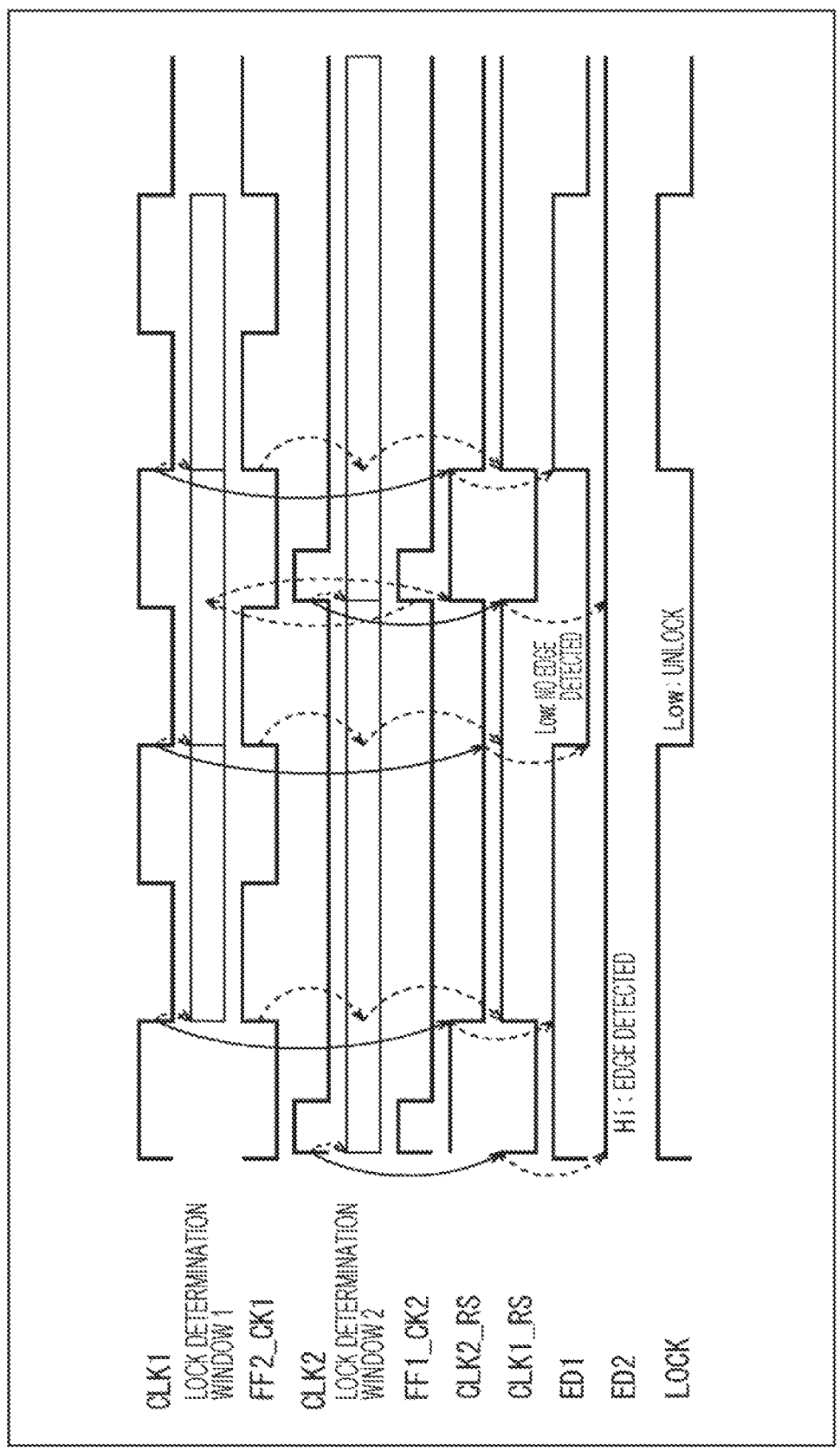
FIG. 29 is a timing chart at a time when the CLK2 pulse width is small, and there is an unlocked state.

FIG. 29 is a timing chart showing the operation to be performed when the pulse width of the second clock signal CLK2 is small, and there is an unlocked state in the second specific configuration of the lock detection circuit 201.

In FIG. 29, there is a state in which a "Low" lock detection signal LOCK is output, as in the case shown in FIG. 28. Thus, even if the pulse width of the second clock signal CLK2 is small, it is possible to correctly detect an unlocked state.

<Timing Chart at the Time of a Locked State (an Example where CLK2 Phase Changes are Large)>

Figure 30:
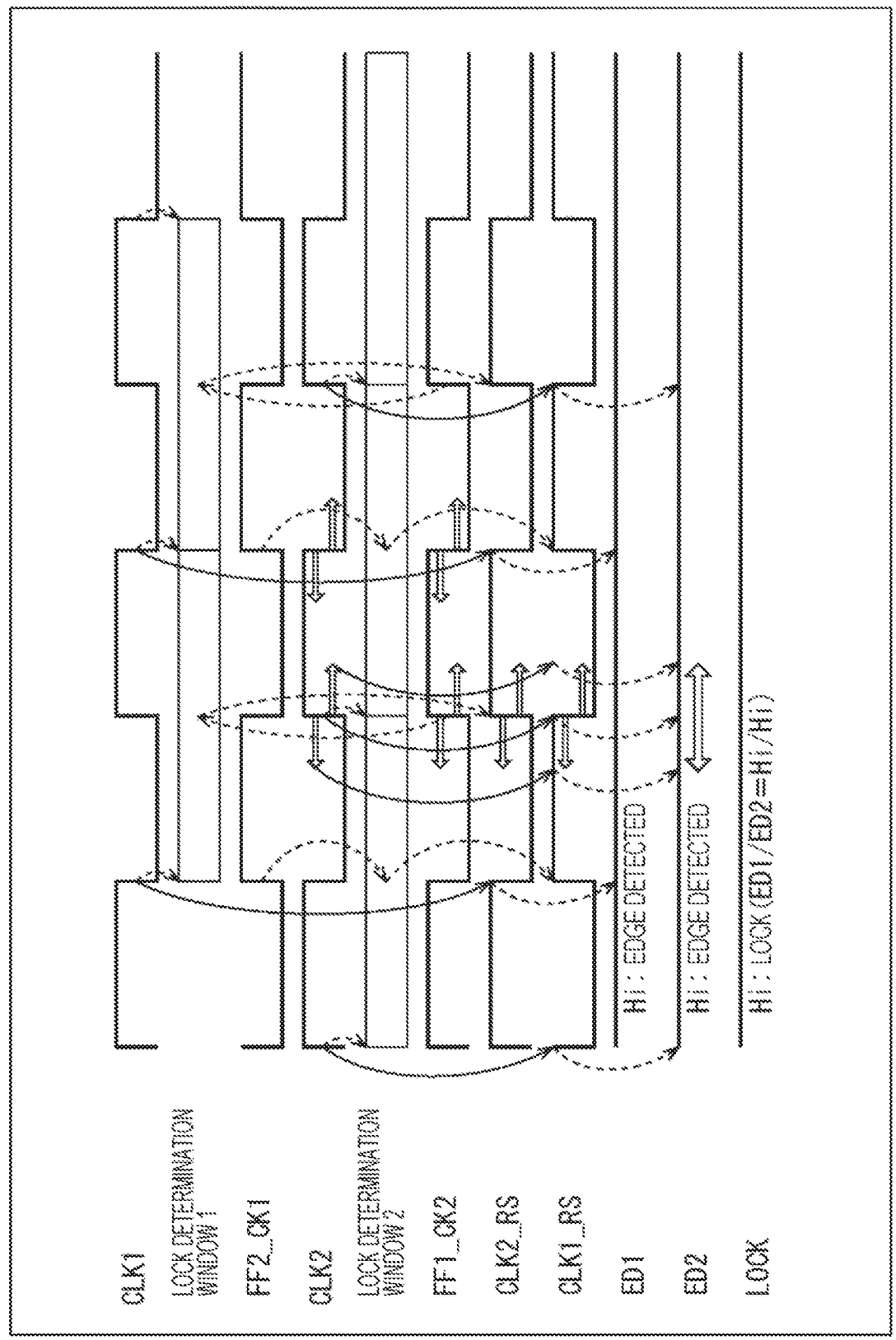
FIG. 30 is a timing chart at the time of a locked state in a case where phase changes are large.

FIG. 30 is a timing chart showing the operation to be performed when there is a locked state in a case where changes in the phase of the second clock signal CLK2 are large in the second specific configuration of the lock detection circuit 201.

Even in a case where changes in the phase of the second clock signal CLK2 are large, it is possible to correctly detect a locked state, as in the case shown in FIG. 26.

<Timing Chart at the Time of a Locked State (an Example where the CLK2 Pulse Width is Small, and CLK2 Phase Changes are Large)>

Figure 31:
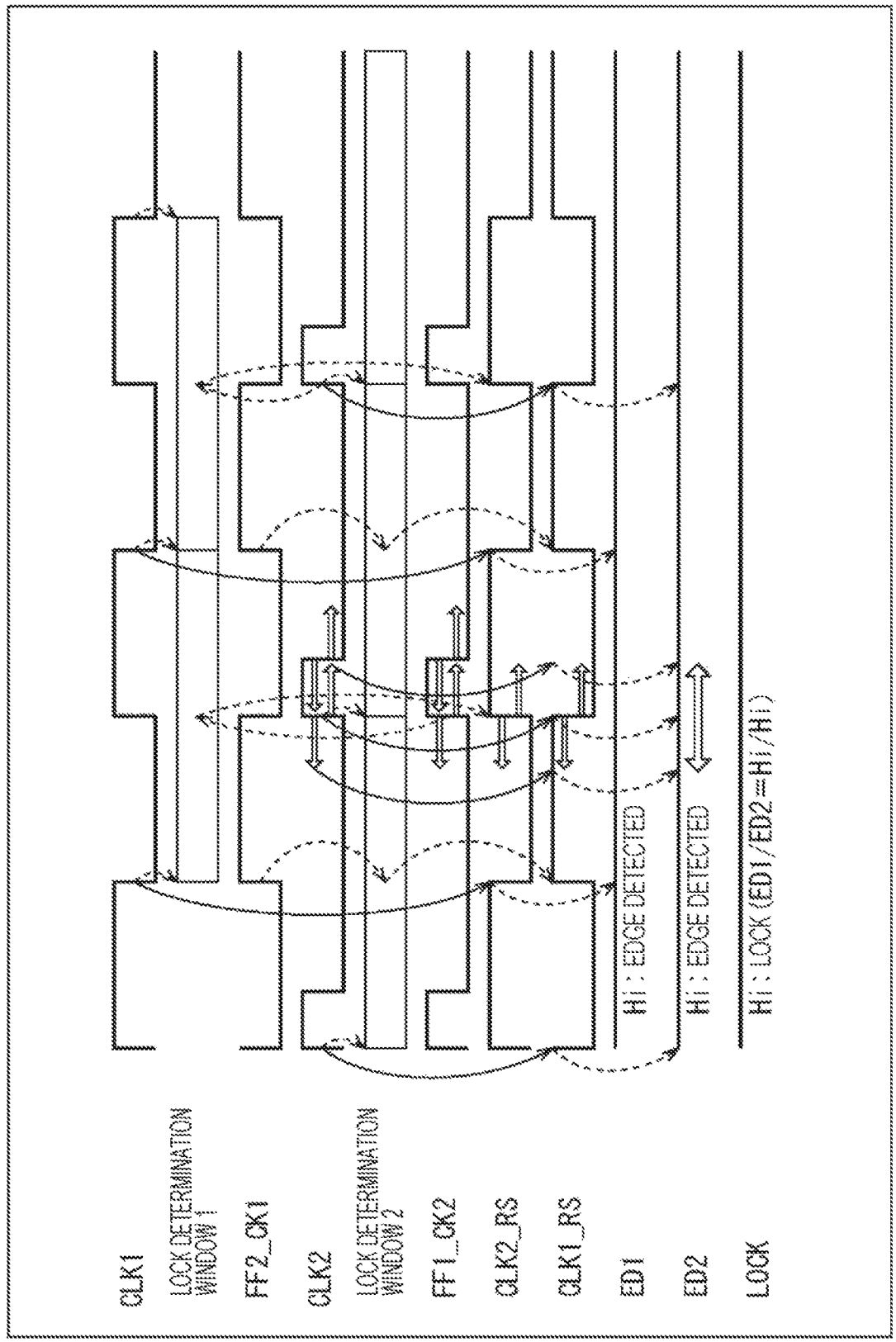
FIG. 31 is a timing chart at the time of a locked state in a case where the CLK2 pulse width is small, and phase changes are large.

FIG. 31 is a timing chart showing the operation to be performed when there is a locked state in a case where the pulse width of the second clock signal CLK2 is small, and phase changes are large in the second specific configuration of the lock detection circuit 201.

As shown in FIG. 31, even in a case where the pulse width of the second clock signal CLK2 is small, and phase changes are large, it is possible to correctly determine a locked state.

<Timing Chart at the Time of an Unlocked State (an Example where CLK2 Phase Changes are Large)>

Figure 32:
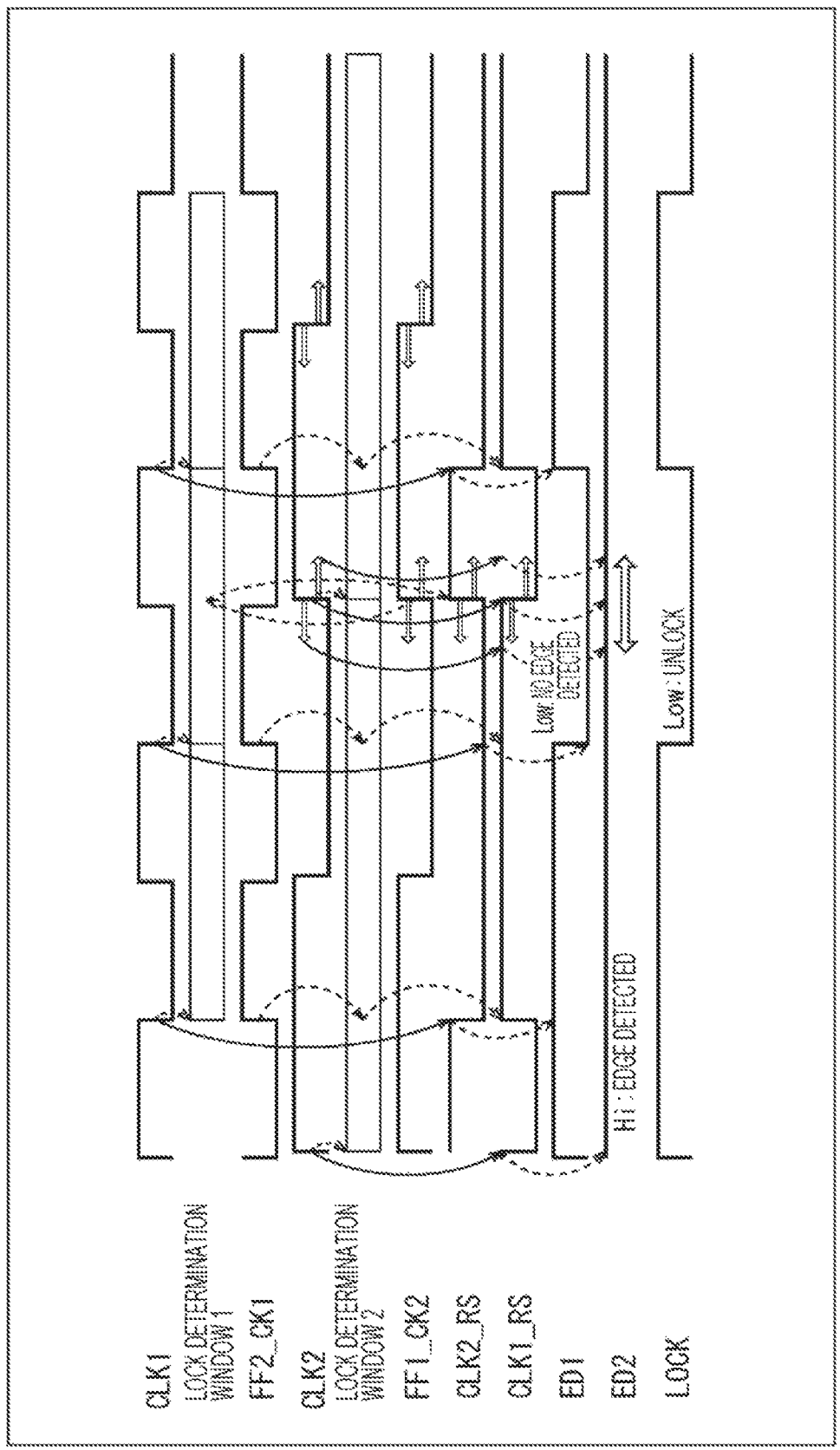
FIG. 32 is a timing chart at the time of an unlocked state in a case where phase changes are large.

FIG. 32 is a timing chart showing the operation to be performed when there is an unlocked state in a case where changes in the phase of the second clock signal CLK2 are large in the second specific configuration of the lock detection circuit 201.

Even in a case where changes in the phase of the second clock signal CLK2 are large, it is possible to correctly detect an unlocked state, as in the case shown in FIG. 28.

<Timing Chart at the Time of an Unlocked State (an Example where the CLK2 Pulse Width is Small, and CLK2 Phase Changes are Large)>

Figure 33:
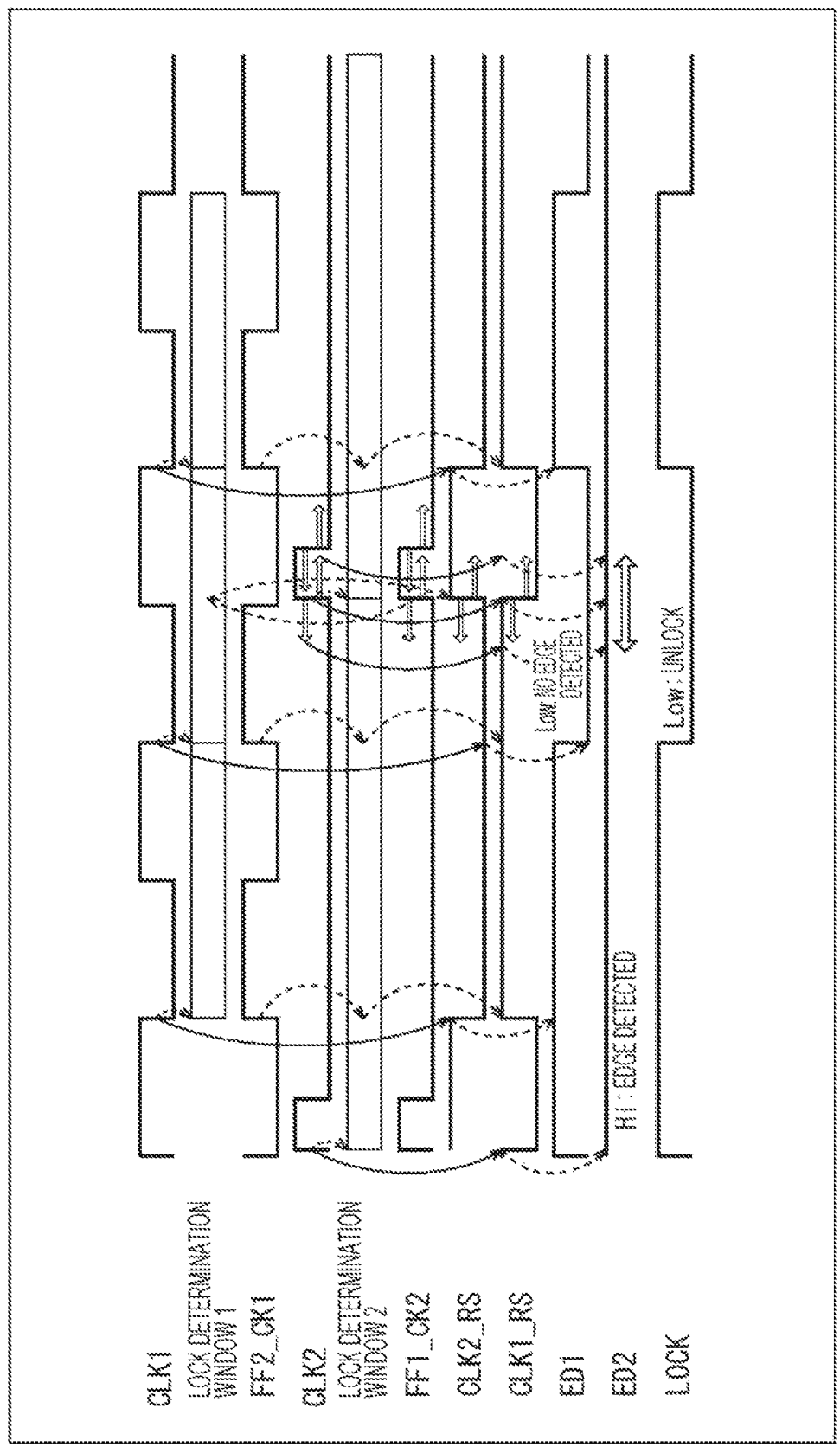
FIG. 33 is a timing chart at the time of an unlocked state in a case where the CLK2 pulse width is small, and phase changes are large.

FIG. 33 is a timing chart showing the operation to be performed when there is an unlocked state in a case where the pulse width of the second clock signal CLK2 is small, and phase changes are large in the second specific configuration of the lock detection circuit 201.

As shown in FIG. 33, even in a case where the pulse width of the second clock signal CLK2 is small, and phase changes are large, it is possible to correctly determine an unlocked state.

<7.3 Third Example Specific Configuration of the First Embodiment>

Figure 34:
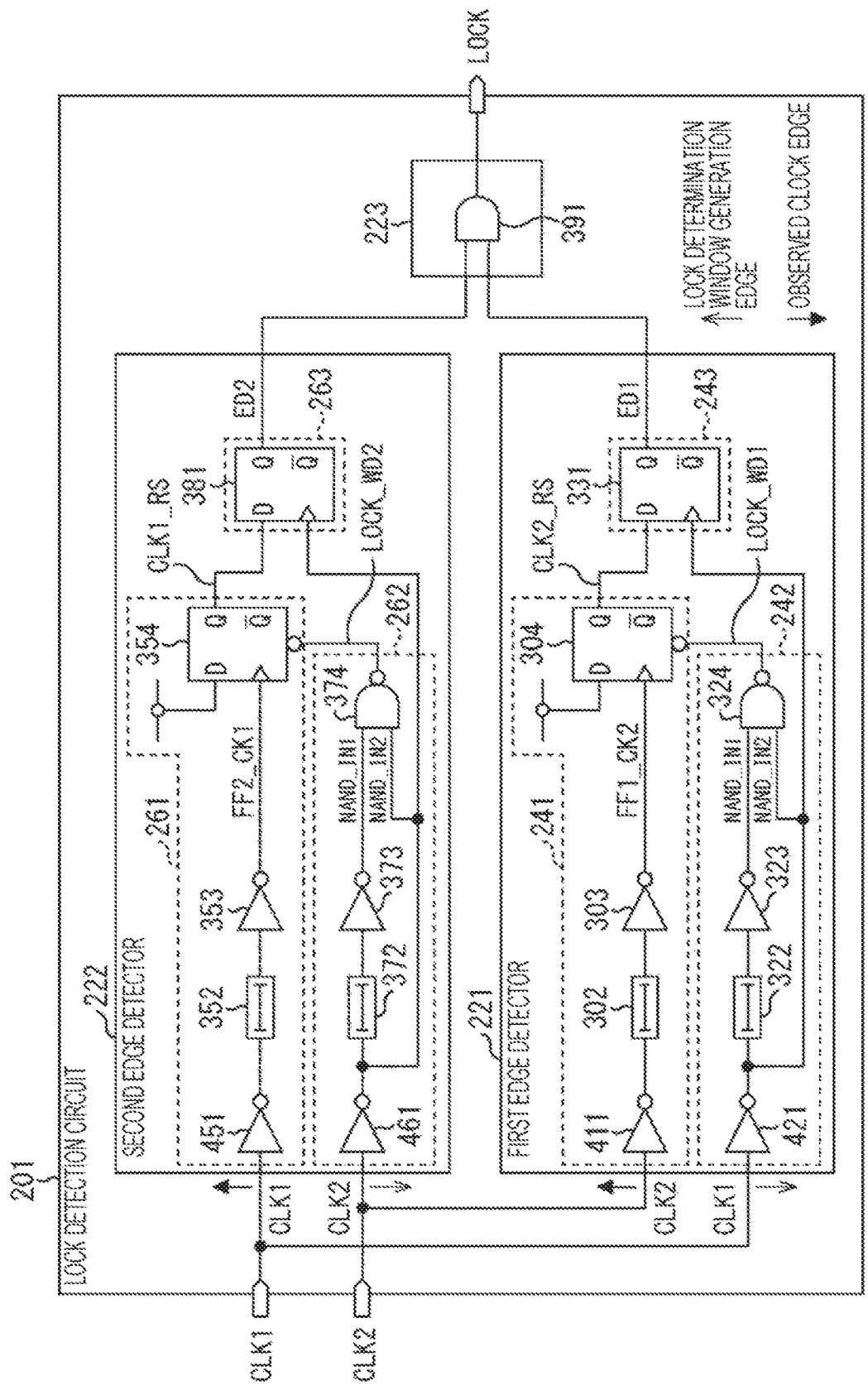
FIG. 34 is a diagram showing a third specific configuration of the first edge detector and the second edge detector.

FIG. 34 shows a third specific configuration of the first edge detector 221 and the second edge detector 222.

In the third specific configuration shown in FIG. 34, the same components as those of the first specific configuration shown in FIG. 18 are denoted by the same reference numerals as those used in FIG. 18, and explanation of them is not unnecessarily repeated herein.

The third specific configuration in FIG. 34 differs from the first specific configuration in FIG. 18 in that the buffer 301 of the edge detection unit 241 of the first edge detector 221 in the first specific configuration is replaced with an inverter 411, and the buffer 321 of the reset pulse generation unit 242 is replaced with an inverter 421.

Accordingly, the edge detection logic (the edge direction) of the lock determination window generation edges and the observed clock edges in the first edge detector 221 of the second specific configuration is the opposite of that in the first edge detector 221 of the above described first specific configuration.

That is, the first edge detector 221 of the above described first specific configuration detects a falling edge of the second clock signal CLK2, if any, in the lock determination window in one cycle of the first clock signal CLK1, the lock determination window being determined at a rising edge of the first clock signal CLK1.

On the other hand, the first edge detector 221 of the third specific configuration detects a rising edge of the second clock signal CLK2, if any, in the lock determination window in one cycle of the first clock signal CLK1, the lock determination window being determined at a falling edge of the first clock signal CLK1.

The third specific configuration in FIG. 34 also differs from the first specific configuration in FIG. 18 in that the buffer 351 of the edge detection unit 261 of the second edge detector 222 in the first specific configuration is replaced with an inverter 451, and the buffer 371 of the reset pulse generation unit 262 is replaced with an inverter 461.

Accordingly, the edge detection logic (the edge direction) of the lock determination window generation edges and the observed clock edges in the second edge detector 222 of the third specific configuration is the opposite of that in the second edge detector 222 of the above described first specific configuration.

That is, the second edge detector 222 of the above described first specific configuration detects a falling edge of the first clock signal CLK1, if any, in the lock determination window in one cycle of the second clock signal CLK2, the lock determination window being determined at a rising edge of the second clock signal CLK2.

On the other hand, the second edge detector 222 of the third specific configuration detects a rising edge of the first clock signal CLK1, if any, in the lock determination window in one cycle of the second clock signal CLK2, the lock determination window being determined at a falling edge of the second clock signal CLK2.

The other aspects in the third specific configuration are the same as those in the above described first specific configuration.

<7.4 Fourth Example Specific Configuration of the First Embodiment>

Figure 35:
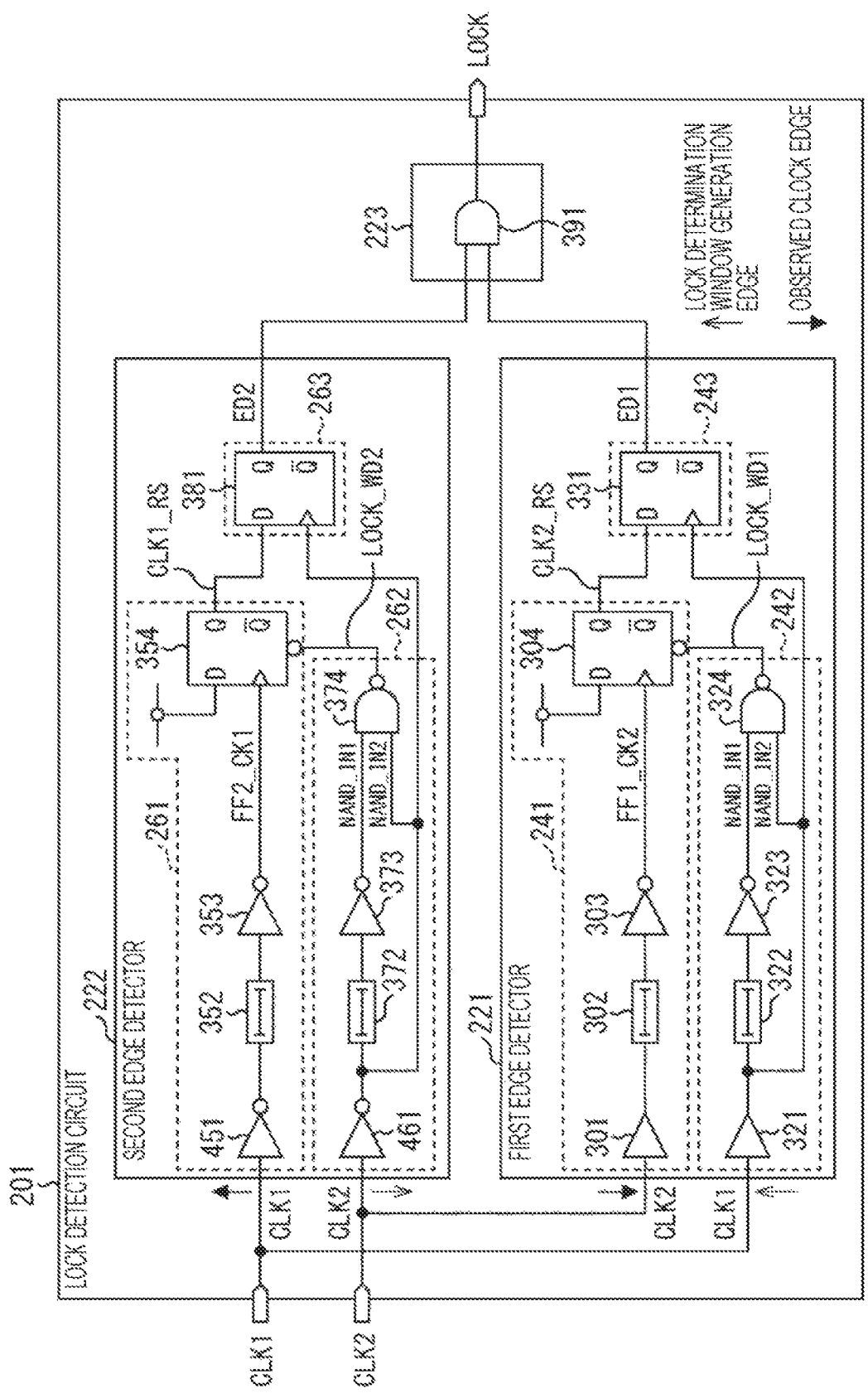
FIG. 35 is a diagram showing a fourth specific configuration of the first edge detector and the second edge detector.

FIG. 35 shows a fourth specific configuration of the first edge detector 221 and the second edge detector 222.

In the fourth specific configuration shown in FIG. 35, the same components as those of the first specific configuration shown in FIG. 18 are denoted by the same reference numerals as those used in FIG. 18, and explanation of them is not unnecessarily repeated herein.

As for the first edge detector 221, the fourth specific configuration in FIG. 35 is the same as the first specific configuration shown in FIG. 18.

Therefore, the first edge detector 221 detects a falling edge of the second clock signal CLK2, if any, in the lock determination window in one cycle of the first clock signal CLK1, the lock determination window being determined at a rising edge of the first clock signal CLK1.

As for the second edge detector 222, on the other hand, the fourth specific configuration in FIG. 35 differs from the first specific configuration in FIG. 18 in that the buffer 351 of the edge detection unit 261 of the second edge detector 222 in the first specific configuration is replaced with an inverter 451, and the buffer 371 of the reset pulse generation unit 262 is replaced with an inverter 461.

Accordingly, the edge detection logic (the edge direction) of the lock determination window generation edges and the observed clock edges in the second edge detector 222 of the fourth specific configuration is the opposite of that in the second edge detector 222 of the above described first specific configuration.

That is, the second edge detector 222 of the above described first specific configuration detects a falling edge of the first clock signal CLK1, if any, in the lock determination window in one cycle of the second clock signal CLK2, the lock determination window being determined at a rising edge of the second clock signal CLK2.

On the other hand, the second edge detector 222 of the fourth specific configuration detects a rising edge of the first clock signal CLK1, if any, in the lock determination window in one cycle of the second clock signal CLK2, the lock determination window being determined at a falling edge of the second clock signal CLK2.

The other aspects in the third specific configuration are the same as those in the above described first specific configuration.

<7.5 Summary of the First Through Fourth Specific Configurations>

Figure 36:
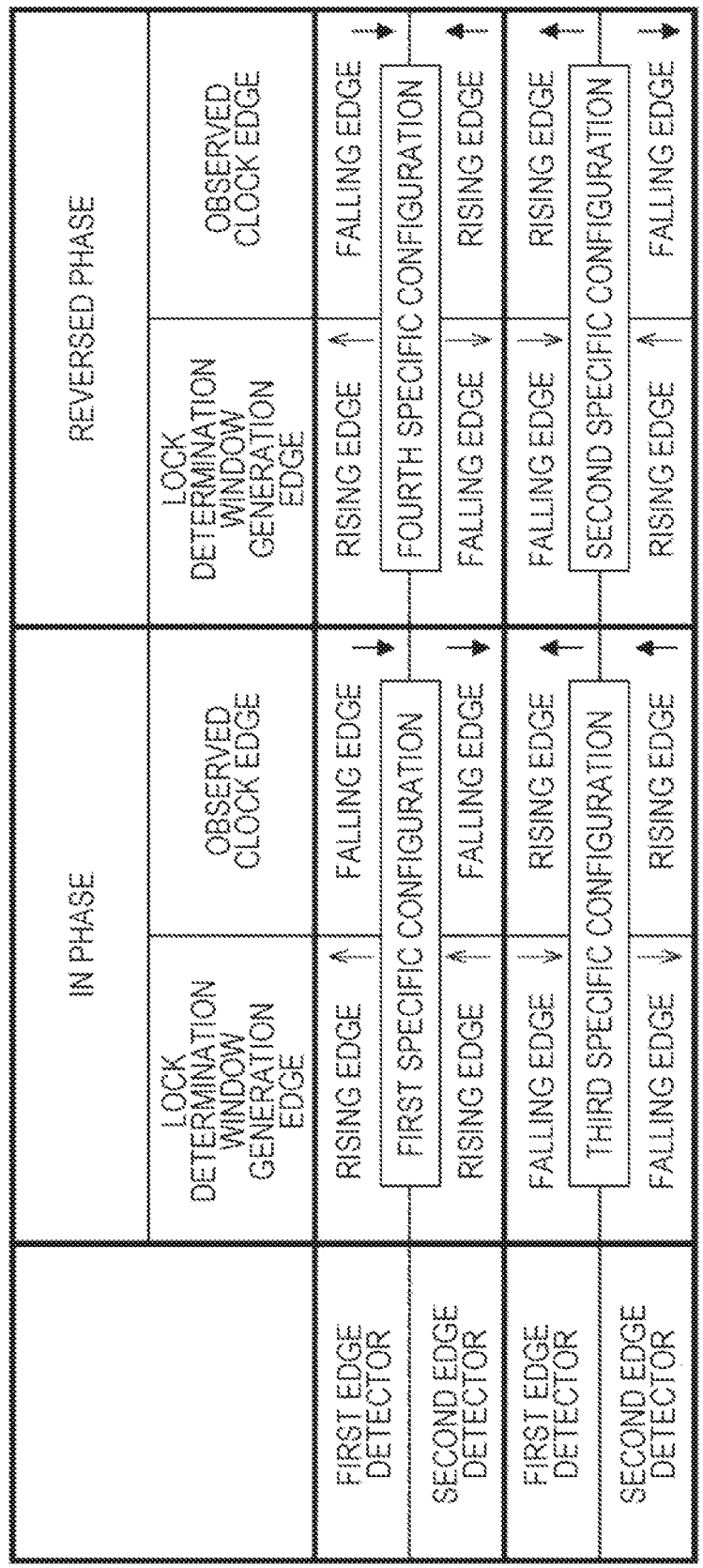
FIG. 36 is a table that summarizes the relationships among the first through fourth specific configurations of the first embodiment.

FIG. 36 is a table that summarizes the relationships among the first through fourth specific configurations of the above described first embodiment.

There are two kinds of edge directions of the lock determination window generation edges and the observed clock edges, depending on whether the first edge detector 221 and the second edge detector 222 have the same edge directions (in-phase), or have the opposite edge directions from each other (reversed phase).

Examples of configurations in which the first edge detector 221 and the second edge detector 222 have the same edge directions (in-phase) in the lock determination window generation edges and the observed clock edges are the first specific configuration shown in FIG. 18 and the third specific configuration shown in FIG. 34.

In the first specific configuration shown in FIG. 18, a lock determination window is generated at a rising edge in both the first edge detector 221 and the second edge detector 222. An observed clock edge is the opposite from the edge direction of a lock determination window generation edge, and accordingly, is a falling edge.

In the third specific configuration shown in FIG. 34, a lock determination window is generated at a falling edge in both the first edge detector 221 and the second edge detector 222. An observed clock edge is the opposite from the edge direction of a lock determination window generation edge, and accordingly, is a rising edge.

That is, the first specific configuration and the third specific configuration of the lock detection circuit 201 are configurations in which: one of a rising edge and a falling edge of a clock signal is set as a first edge while the other is set as a second edge; the first edge detector 221 detects a second edge of the second clock signal CLK2 in a determination window within one cycle of the first clock signal CLK1, the determination window being determined at a first edge of the first clock signal CLK1; and the second edge detector 222 detects a second edge of the first clock signal CLK1 in a determination window within one cycle of the second clock signal CLK2, the determination window being determined at a first edge of the second clock signal CLK2.

Meanwhile, examples of configurations in which the first edge detector 221 and the second edge detector 222 have opposite edge directions (reversed phase) in lock determination window generation edges and observed clock edges are the second specific configuration shown in FIG. 25 and the fourth specific configuration shown in FIG. 35.

In the second specific configuration shown in FIG. 25, a lock determination window is generated at a falling edge in the first edge detector 221, and a lock determination window is generated at a rising edge in the second edge detector 222. Since an observed clock edge is the opposite from the edge direction of a lock determination window generation edge, observed clock edges are rising edges in the first edge detector 221, and are falling edges in the second edge detector 222.

In the fourth specific configuration shown in FIG. 35, a lock determination window is generated at a rising edge in the first edge detector 221, and a lock determination window is generated at a falling edge in the second edge detector 222. Since an observed clock edge is the opposite from the edge direction of a lock determination window generation edge, observed clock edges are falling edges in the first edge detector 221, and are rising edges in the second edge detector 222.

That is, the second specific configuration and the fourth specific configuration of the lock detection circuit 201 are configurations in which: one of a rising edge and a falling edge of a clock signal is set as a first edge while the other is set as a second edge; the first edge detector 221 detects a second edge of the second clock signal CLK2 in a determination window within one cycle of the first clock signal CLK1, the determination window being determined at a first edge of the first clock signal CLK1; and the second edge detector 222 detects a first edge of the first clock signal CLK1 in a determination window within one cycle of the second clock signal CLK2, the determination window being determined at a second edge of the second clock signal CLK2.

According to the first embodiment of the lock detection circuit 201 designed to have one of the first through fourth specific configurations described above, a locked state can be appropriately detected in any cases, such as a case where the pulse width of the second clock signal CLK2 (the comparison clock signal FBCLK) is small, a case where phase changes are large, or a case where the frequency of the second clock signal CLK2 fluctuates with a certain variation width.

The lock detection circuit 201 according to the first embodiment can be formed with only an addition of smaller and simpler circuits such as the reset pulse generation circuits 242 and 262, and accordingly, have simpler circuit configurations than those of the lock detection circuit 41 in FIG. 2, the lock detection circuit 91 in FIG. 10, the lock detection circuit 101 in FIG. 12, the lock detection circuit 121 in FIG. 14, and the like.

Further, there is no need to adjust the lock determination window with a delay circuit, and pull in a high-speed clock such as the output clock signal VCOCLK. Thus, the first embodiment also has advantages in terms of adjustment work, circuit cost, electric current consumption, and the like.

<8. Second Embodiment of a Lock Detection Circuit>

Figure 37:
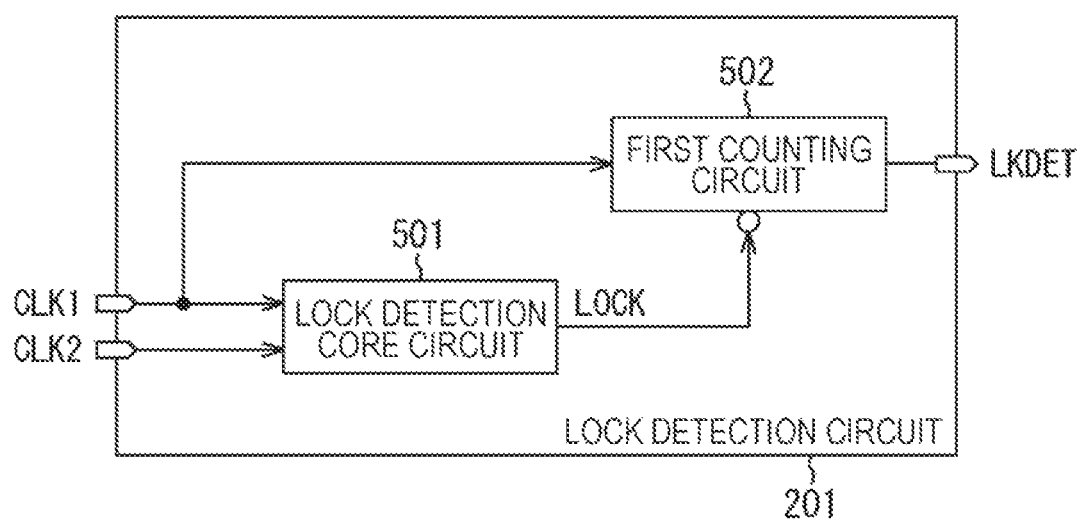
FIG. 37 is a block diagram of a second embodiment of a lock detection circuit to which the present technology is applied.

FIG. 37 is a block diagram of a second embodiment of a lock detection circuit to which the present technology is applied.

Figure 38:
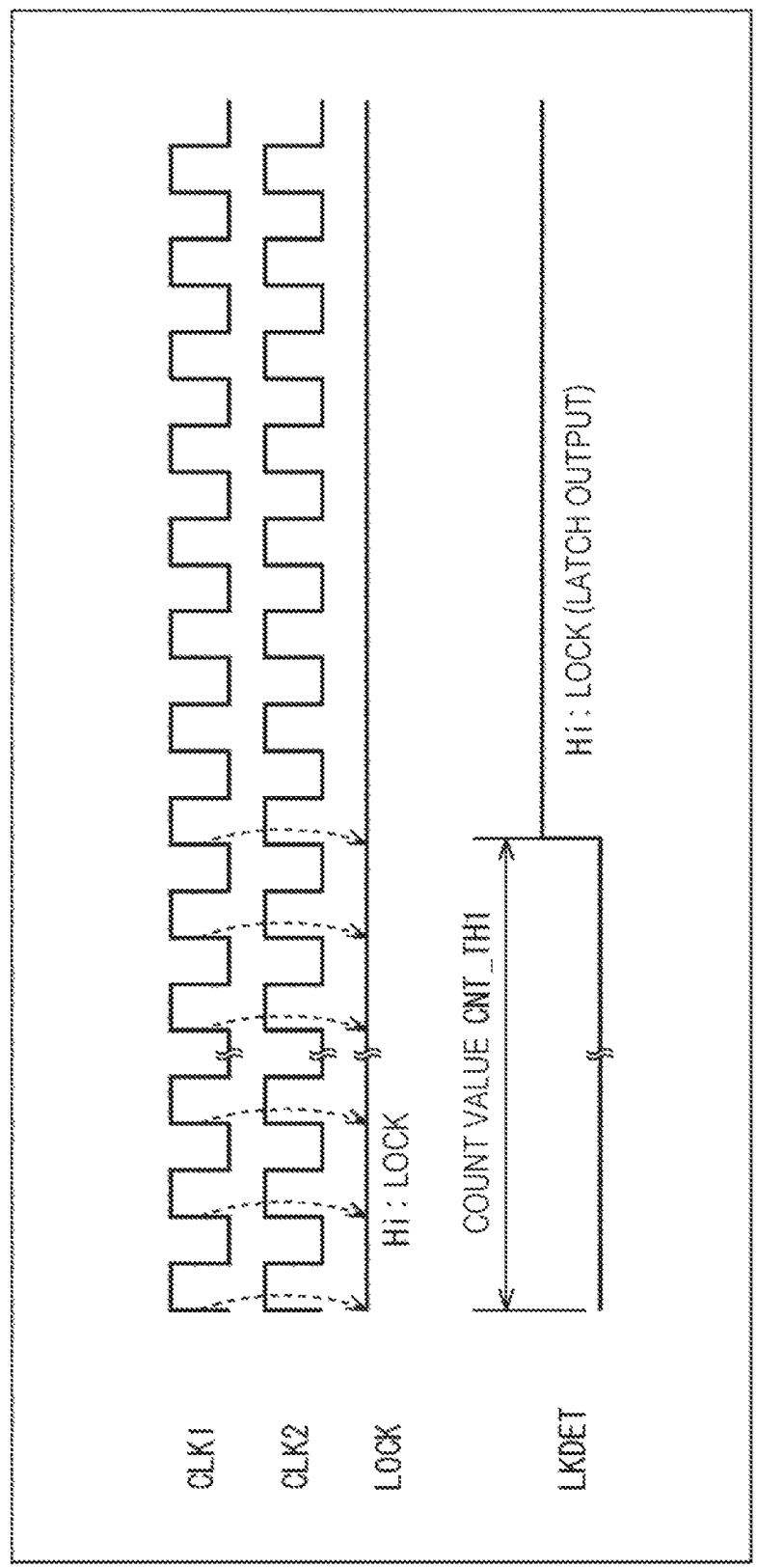
FIG. 38 is a timing chart showing operation of the second embodiment.

FIG. 38 is a timing chart showing operation of the lock detection circuit in the second embodiment. Note that FIG. 38 shows a timing chart at the time of a locked state.

The lock detection circuit 201 according to the second embodiment includes a lock detection core circuit 501 and a first counting circuit 502.

The lock detection core circuit 501 has the same configuration as the lock detection circuit 201 according to the first embodiment described above. The lock detection core circuit 501 determines a locked state between a first clock signal CLK1 and a second clock signal CLK2 that have been input. In the case of a locked state, the lock detection core circuit 501 outputs a "Hi" lock detection signal LOCK. In the case of an unlocked state, the lock detection core circuit 501 outputs a "Low" lock detection signal LOCK.

The first clock signal CLK1 and the lock detection signal LOCK that is an output from the lock detection core circuit 501 are input to the first counting circuit 502. The lock detection signal LOCK is input to the RST terminal of the first counting circuit 502.

The first counting circuit 502 counts the number of consecutive locked states in accordance with the input first clock signal CLK1, and, in a case where the count value exceeds a specified count value CNT_TH1, outputs a "Hi" latch detection signal LKDET indicating a locked state. However, when a "Low" lock detection signal LOCK is input to the RST terminal, the first counting circuit 502 resets the count value being counted. The count value CNT_TH1 serving as the threshold for outputting a "Hi" latch detection signal LKDET can be selected from among a plurality of values stored in advance, or can be set by the user from a setting screen or the like.

Here, when a lock determination window time Tw equal to one cycle of the first clock signal CLK1 or the second clock signal CLK2, the difference ΔT in cycle between the first clock signal CLK1 and the second clock signal CLK2, and the count value J of the first counting circuit 502 satisfy $$Tw > \Delta T \cdot J,$$

the first counting circuit 502 determines the state to be a locked state. For example, in a case where the count value J is 100, a locked state is detected when an edge is detected 100 or more times during the lock determination window time Tw, and the frequency accuracy is 1%. As lock determination window generation and edge observation are performed between the first clock signal CLK1 and the second clock signal CLK2, the lock detection core circuit 501 can perform accurate locked state detection in spite of any frequency drift.

According to the second embodiment described above, the lock detection core circuit 501 having the same configuration as the first embodiment is provided. Thus, a locked state can be appropriately detected in any cases, such as a case where the pulse width of the second clock signal CLK2 (the comparison clock signal FBCLK) is small, a case where phase changes are large, or a case where the frequency of the second clock signal CLK2 fluctuates with a certain variation width.

Further, it is possible to easily set the lock determination accuracy by switching the count value CNT_TH1 serving as the threshold for outputting a "Hi" latch detection signal LKDET.

<9. Third Embodiment of a Lock Detection Circuit>

Figure 39:
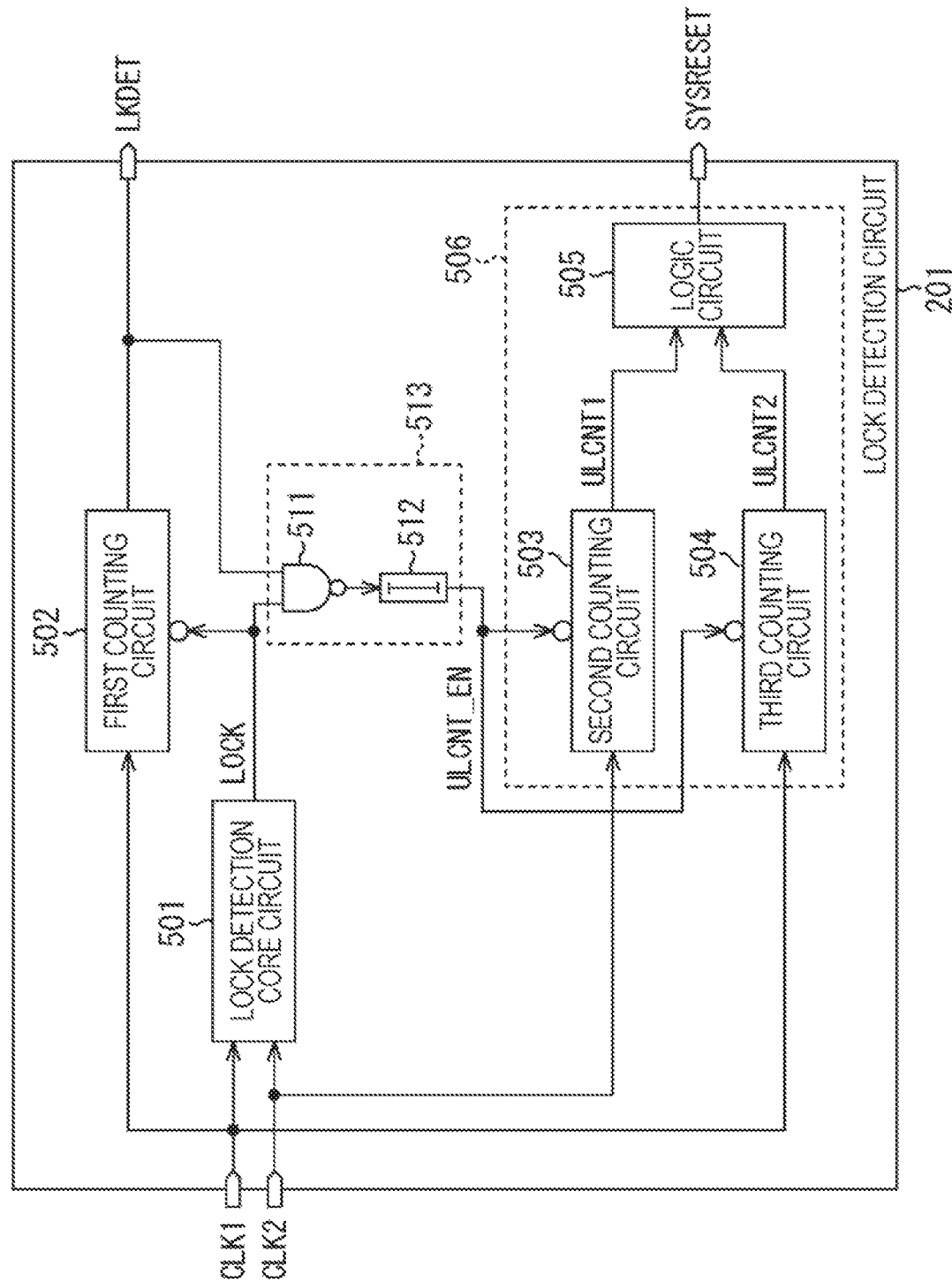
FIG. 39 is a block diagram of a third embodiment of a lock detection circuit to which the present technology is applied.

FIG. 39 is a block diagram of a third embodiment of a lock detection circuit to which the present technology is applied.

The lock detection circuit 201 according to the third embodiment includes a lock detection core circuit 501, a first counting circuit 502, a second counting circuit 503, a third counting circuit 504, and a logic circuit 505.

The lock detection core circuit 501 and the first counting circuit 502 are similar to those of the second embodiment described above, and therefore, explanation of them is not made herein.

The second counting circuit 503, the third counting circuit 504, and the logic circuit 505 constitute an abnormality detection circuit 506 that detects abnormalities of the first clock signal CLK1 and the second clock signal CLK2.

The lock detection circuit 201 according to the third embodiment also includes an NAND circuit 511 and a delay circuit 512. The NAND circuit 511 and the delay circuit 512 constitute an enable signal generation circuit 513 that generates an enable signal ULCNT_EN to be supplied to the abnormality detection circuit 506.

A lock detection signal LOCK that is an output from the lock detection core circuit 501, and a latch detection signal LKDET that is an output from the first counting circuit 502 are input to the NAND circuit 511. The NAND circuit 511 calculates a negative AND (NAND) of the latch detection signal LKDET and the lock detection signal LOCK, and outputs the calculation result as the enable signal ULCNT_EN for counting unlocked states. The enable signal ULCNT_EN output from the NAND circuit 511 is delayed by a predetermined time at the delay circuit 512, and is then input to the RST terminals of the second counting circuit 503 and the third counting circuit 504.

The second counting circuit 503 detects an abnormality of the first clock signal CLK1, in accordance with the input second clock signal CLK2.

More specifically, during an enable period in which the enable signal ULCNT_EN for counting unlocked states is "Hi", the second counting circuit 503 counts the number of consecutive unlocked states in accordance with the input second clock signal CLK2. In a case where the count value exceeds a specified count value CNT_TH2, the second counting circuit 503 outputs an "Hi" first clock abnormality detection signal ULCNT1 indicating an abnormality of the first clock signal CLK1.

When a "Low" enable signal ULCNT_EN is input to the RST terminal, the second counting circuit 503 resets the count value being counted. The count value CNT_TH2 serving as the threshold for detecting an abnormality of the first clock signal CLK1 can be selected from among a plurality of values stored in advance, or can be set by the user from a setting screen or the like.

The third counting circuit 504 detects an abnormality of the second clock signal CLK2, in accordance with the input first clock signal CLK1.

More specifically, during an enable period in which the enable signal ULCNT_EN for counting unlocked states is "Hi", the third counting circuit 504 counts the number of consecutive unlocked states in accordance with the input first clock signal CLK1. In a case where the count value exceeds a specified count value CNT_TH3, the third counting circuit 504 outputs a "Hi" second clock abnormality detection signal ULCNT2 indicating an abnormality of the second clock signal CLK2.

When a "Low" enable signal ULCNT_EN is input to the RST terminal, the third counting circuit 504 resets the count value being counted. The count value CNT_TH3 serving as the threshold for detecting an abnormality of the second clock signal CLK2 can be selected from among a plurality of values stored in advance, or can be set by the user from a setting screen or the like.

Note that the count value CNT_TH2 of the second counting circuit 503 and the count value CNT_TH3 of the third counting circuit 504 are set at sufficiently larger values than the count value CNT_TH1 of the first counting circuit 502, to secure sufficiently longer times than the assumed lock-up time, as shown in the following relational expressions. Here, "≪" and "≪≪" are inequality signs indicating that the difference between the left side and the right side is sufficiently large.

(the cycle of the second clock signal CLK2)*(the count value CNT_TH2 of the second counting circuit 503)≫lock-up time (the cycle of the first clock signal CLK1)*(the count value CNT_TH3 of the third counting circuit 504)≫lock-up time (the count value CNT_TH1 of the first counting circuit 502)≪(the count value CNT_TH2 of the second counting circuit 503)

(the count value CNT_TH1 of the first counting circuit 502)≪(the count value CNT_TH3 of the third counting circuit 504)

The logic circuit 505 calculates the logical sum (OR) of the first clock abnormality detection signal ULCNT1 and the second clock abnormality detection signal ULCNT2, and outputs the calculation result as a system reset signal SYSRESET.

The abnormality detection circuit 506 having the above described configuration detects a stop of the first clock signal CLK1 and/or the second clock signal CLK2, and a lock abnormality in a PLL circuit (the PLL circuit 11 or the PLL circuit 81), and outputs the detection results as the system reset signal SYSRESET. The system reset signal SYSRESET can be used in recovery control such as a reset operation for the PLL circuit or for the system into which the PLL circuit is incorporated.

Figure 40:
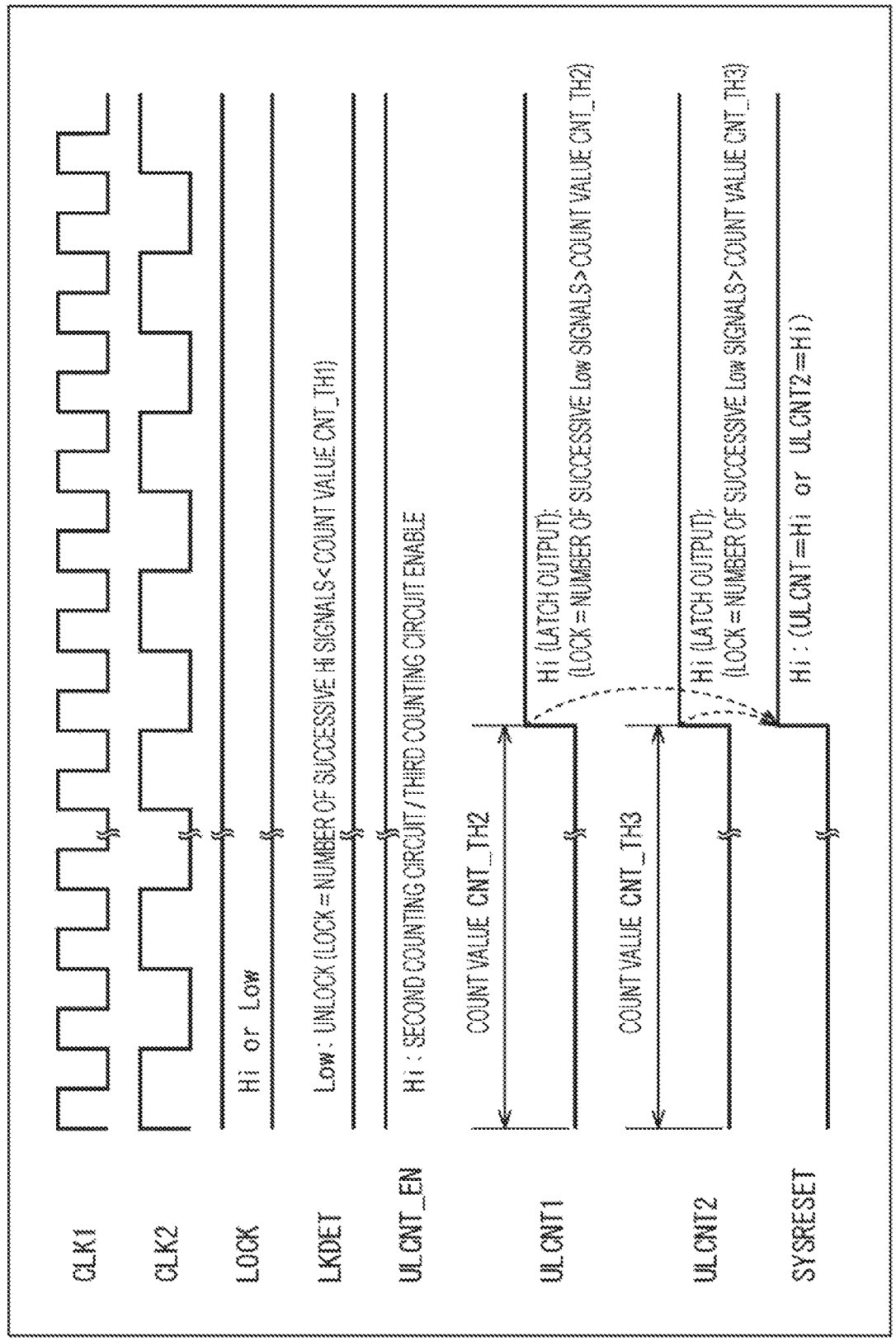
FIG. 40 is a timing chart showing operation of the third embodiment.

FIG. 40 is a timing chart showing operation of the lock detection circuit in the third embodiment. Note that FIG. 40 shows a timing chart of an unlocked state in a case where the frequency of the second clock signal CLK2 is about 0.5 times the frequency of the first clock signal CLK1.

In FIG. 40, since the frequency of the second clock signal CLK2 is about 0.5 times the frequency of the first clock signal CLK1, the lock detection core circuit 501 outputs a "Low" or "Hi" lock detection signal LOCK, depending on the phase relationship between the first clock signal CLK1 and the second clock signal CLK2.

On the other hand, the first counting circuit 502 outputs a "Low" latch detection signal LKDET, because the count value obtained by counting the number of consecutive locked states in accordance with the first clock signal CLK1 does not exceed the specified count value CNT_TH1.

The enable signal generation circuit 513 calculates the negative AND (NAND) of the "Low" or "Hi" lock detection signal LOCK and the "Low" latch detection signal LKDET, and thus, outputs a "Hi" enable signal ULCNT_EN.

The second counting circuit 503 and the third counting circuit 504 count the number of consecutive unlocked states during the enable period in which the enable signal ULCNT_EN is "Hi". In a case where the second counting circuit 503 outputs a "Hi" first clock abnormality detection signal ULCNT1, or the third counting circuit 504 outputs a "Hi" second clock abnormality detection signal ULCNT2, the logic circuit 505 outputs a "Hi" system reset signal SYSRESET.

Figure 41:
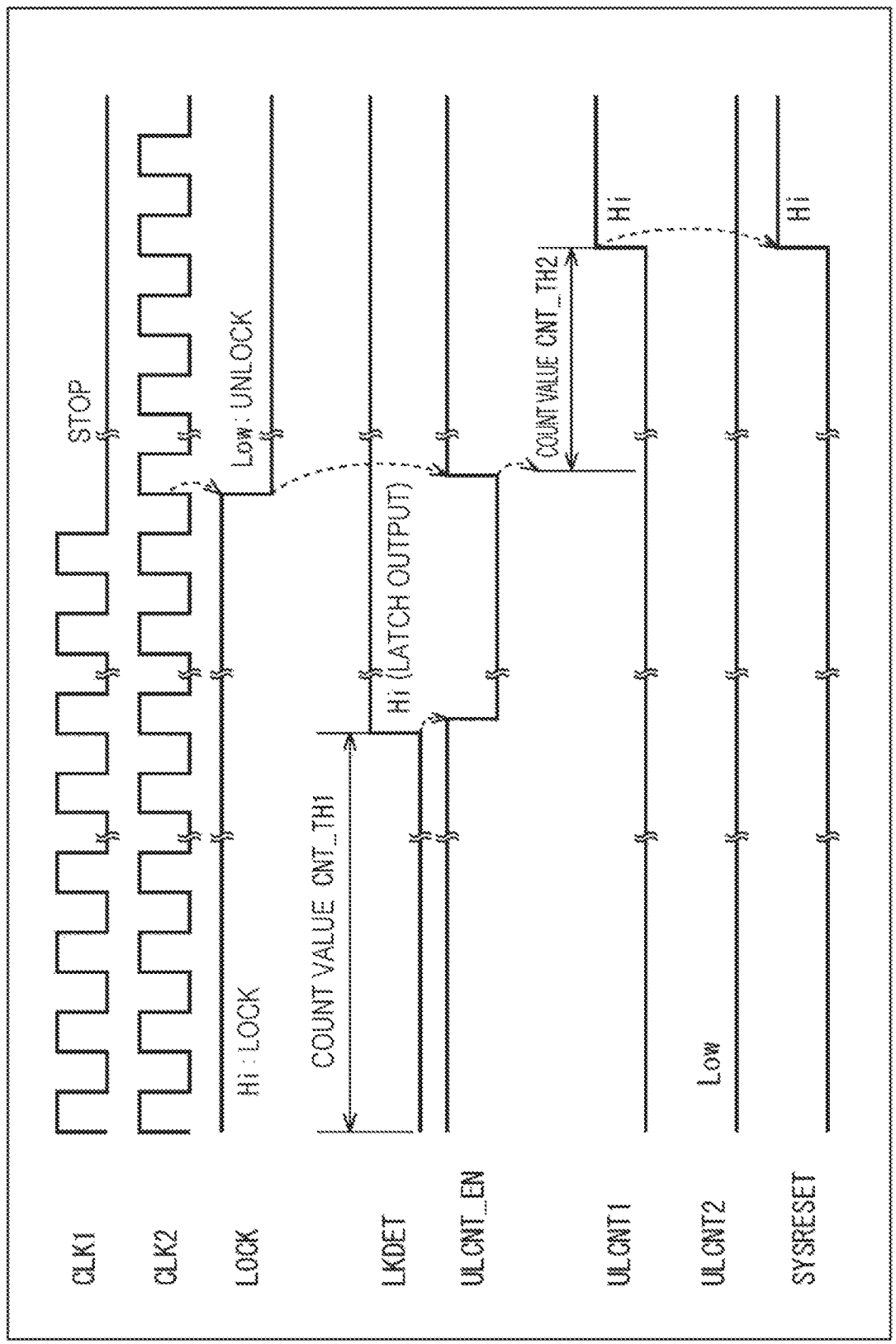
FIG. 41 is a timing chart in a case where a first clock signal CLK1 stops.

FIG. 41 shows a timing chart in a case where the first clock signal CLK1 stops after a locked state appears in the third embodiment.

As shown in FIG. 41, in a case where the first clock signal CLK1 stops, the lock detection signal LOCK being output from the lock detection core circuit 501 switches from "Hi" to "Low". As a result, the enable signal ULCNT_EN being output from the enable signal generation circuit 513 switches from "Low" to "Hi".

The second counting circuit 503 counts the number of consecutive unlocked states in accordance with the input second clock signal CLK2. In a case where the count value exceeds the specified count value CNT_TH2, the second counting circuit 503 outputs a "Hi" first clock abnormality detection signal ULCNT1 indicating an abnormality of the first clock signal CLK1. As a result, the system reset signal SYSRESET, which is an output from the logic circuit 505 that calculates a logical sum (OR), also becomes "Hi".

Note that, in the third embodiment, a stop of the first clock signal CLK1 is detected with the lock detection signal LOCK represented by the logical product (AND) of the ED1 signal and the ED2 signal. However, the ED2 signal may be used, instead of the lock detection signal LOCK.

FIG. 42 shows a timing chart in a case where the second clock signal CLK2 stops after a locked state appears in the third embodiment.

As shown in FIG. 42, in a case where the second clock signal CLK2 stops, the lock detection signal LOCK being output from the lock detection core circuit 501 switches from "Hi" to "Low". As a result, the enable signal ULCNT_EN being output from the enable signal generation circuit 513 switches from "Low" to "Hi".

The third counting circuit 504 counts the number of consecutive unlocked states in accordance with the input first clock signal CLK1. In a case where the count value exceeds the specified count value CNT_TH3, the third counting circuit 504 outputs a "Hi" second clock abnormality detection signal ULCNT2 indicating an abnormality of the second clock signal CLK2. As a result, the system reset signal SYSRESET, which is an output from the logic circuit 505 that calculates a logical sum (OR), also becomes "Hi".

Note that, in the third embodiment, a stop of the second clock signal CLK2 is detected with the lock detection signal LOCK represented by the logical product (AND) of the ED1 signal and the ED2 signal. However, the ED1 signal may be used, instead of the lock detection signal LOCK.

According to the third embodiment described above, the lock detection core circuit 501 having the same configuration as the first embodiment is provided. Thus, a locked state can be appropriately detected in any cases, such as a case where the pulse width of the second clock signal CLK2 (the comparison clock signal FBCLK) is small, a case where phase changes are large, or a case where the frequency of the second clock signal CLK2 fluctuates with a certain variation width.

The same first counting circuit 502 as that of the second embodiment is also provided. Thus, it is possible to easily set the lock determination accuracy by switching the count value CNT_TH1 serving as the threshold for outputting a "Hi" latch detection signal LKDET.

Further, as the abnormality detection circuit 506 is provided, it is possible to detect a stop of the first clock signal CLK1 and/or the second clock signal CLK2, and a lock abnormality in the PLL circuit. In addition to that, a detected abnormal state can be output as the system reset signal SYSRESET. Thus, recovery control can be performed on the PLL circuit or on the system into which the PLL circuit is incorporated.

In this specification, a system means an assembly of a plurality of components (devices, modules (parts), and the like), and not all the components need to be provided in the same housing. In view of this, a plurality of devices that are housed in different housings and are connected to one another via a network form a system, and one device having a plurality of modules housed in one housing is also a system.

Embodiments of the present technology are not limited to the above described embodiments, and various modifications can be made to them without departing from the scope of the present technology.

For example, it is possible to adopt a combination of all or some of the above described plurality of embodiments.

For example, the present technology can be embodied in a cloud computing configuration in which one function is shared among a plurality of devices via a network, and processing is performed by the devices cooperating with one another.

The advantageous effects described in this specification are merely examples, and the advantageous effects of the present technology are not limited to them and may include effects other than those described in this specification.

Note that the present technology can also be embodied in the configurations described below.

(1)
A detection device including:
a first edge detector that detects whether there is an edge of a second clock signal in one cycle of a first clock signal;
a second edge detector that detects whether there is an edge of the first clock signal in one cycle of the second clock signal; and
a logic circuit that performs a logical operation on a detection result from the first edge detector and a detection result from the second edge detector.

(2)
The detection device according to (1), in which
the first edge detector includes:
a first edge detection unit that detects presence/absence of an edge of the second clock signal;
a first reset pulse generation unit that generates a reset pulse for resetting the first edge detection unit in each cycle of the first clock signal;
a first detection result acquisition unit that acquires and outputs a detection result from the first edge detection unit immediately before the first edge detection unit is reset, and
the second edge detector includes:
a second edge detection unit that detects presence/absence of an edge of the first clock signal;
a second reset pulse generation unit that generates a reset pulse for resetting the second edge detection unit in each cycle of the second clock signal; and
a second detection result acquisition unit that acquires and outputs a detection result from the second edge detection unit immediately before the second edge detection unit is reset.

(3)
The detection device according to (1), in which
one of a rising edge and a falling edge of a clock signal is set as a first edge while the other is set as a second edge,
the first edge detector detects whether there is the second edge of the second clock signal in a determination window within one cycle of the first clock signal, the determination window being determined at the first edge of the first clock signal, and
the second edge detector detects whether there is the first edge of the first clock signal in a determination window within one cycle of the second clock signal, the determination window being determined at the second edge of the second clock signal.

(4)
The detection device according to (1), in which
the first edge detector detects whether there is a rising edge of the second clock signal in a determination window within one cycle of the first clock signal, the determination window being determined at a falling edge of the first clock signal, and
the second edge detector detects whether there is a falling edge of the first clock signal in a determination window within one cycle of the second clock signal, the determination window being determined at a rising edge of the second clock signal.

(5)
The detection device according to (1), in which
the first edge detector detects whether there is a falling edge of the second clock signal in a determination window within one cycle of the first clock signal, the determination window being determined at a rising edge of the first clock signal, and
the second edge detector detects whether there is a rising edge of the first clock signal in a determination window within one cycle of the second clock signal, the determination window being determined at a falling edge of the second clock signal.

(6)
The detection device according to (1), in which
one of a rising edge and a falling edge of a clock signal is set as a first edge while the other is set as a second edge,
the first edge detector detects whether there is the second edge of the second clock signal in a determination window within one cycle of the first clock signal, the determination window being determined at the first edge of the first clock signal, and
the second edge detector detects whether there is the second edge of the first clock signal in a determination window within one cycle of the second clock signal, the determination window being determined at the first edge of the second clock signal.

(7)
The detection device according to (1), in which
the first edge detector detects whether there is a falling edge of the second clock signal in a determination window within one cycle of the first clock signal, the determination window being determined at a rising edge of the first clock signal, and
the second edge detector detects whether there is a falling edge of the first clock signal in a determination window within one cycle of the second clock signal, the determination window being determined at a rising edge of the second clock signal.

(8)
The detection device according to (1), in which
the first edge detector detects whether there is a rising edge of the second clock signal in a determination window within one cycle of the first clock signal, the determination window being determined at a falling edge of the first clock signal, and
the second edge detector detects whether there is a rising edge of the first clock signal in a determination window within one cycle of the second clock signal, the determination window being determined at a falling edge of the second clock signal.

(9)

The detection device according to any of (1) to (8), further including a first counting circuit that counts outputs of the logic circuit with the first clock signal.

(10)

The detection device according to (9), further including an abnormality detection circuit that detects an abnormality of the first clock signal and the second clock signal.

(11)

The detection device according to (10), in which the abnormality detection circuit includes:

a second counting circuit that detects an abnormality of the first clock signal; and a third counting circuit that detects an abnormality of the second clock signal.

(12)

The detection device according to (11), in which the second counting circuit detects an abnormality of the first clock signal by performing counting in accordance with the second clock signal during an enable period indicated by an enable signal generated from an output of the logic circuit and an output of the first counting circuit.

(13)

The detection device according to (11) or (12), in which the third counting circuit detects an abnormality of the second clock signal by performing counting in accordance with the first clock signal during an enable period indicated by an enable signal generated from an output of the logic circuit and an output of the first counting circuit.

(14)

The detection device according to (12) or (13), further including an enable signal generation circuit that generates the enable signal from an output of the logic circuit and an output of the first counting circuit.

(15)

The detection device according to (14), in which the enable signal generation circuit generates the enable signal by performing a NNAND operation on an output of the logic circuit and an output of the first counting circuit.

(16)

The detection device according to any of (1) to (15), in which the logic circuit is formed with a circuit that calculates a logical product.

(17)

A detection method implemented in a detection device, the detection method including:

detecting whether there is an edge of a second clock signal in one cycle of a first clock signal;

detecting whether there is an edge of the first clock signal in one cycle of the second clock signal; and performing a logical operation on a result of detection of an edge of the second clock signal and a result of detection of an edge of the first clock signal.

REFERENCE SIGNS LIST

201 Lock detection circuit
221 First edge detector
222 Second edge detector
223 Logic circuit
241 Edge detection unit
242 Reset pulse generation unit
243 Result acquisition unit
261 Edge detection unit
262 Reset pulse generation unit
263 Result acquisition unit
501 Lock detection core circuit
502 First counting circuit
503 Second counting circuit
504 Third counting circuit
505 Logic circuit
506 Abnormality detection circuit
513 Enable signal generation circuit

The invention claimed is:

1. A detection device, comprising:
a first edge detector that includes:
a first edge detection unit configured to detect one of presence or absence of an edge of a second clock signal in one cycle of a first clock signal;
a first reset pulse generation unit configured to generate a first reset pulse that resets the first edge detection unit in each cycle of the first clock signal; and
a first detection result acquisition unit configured to acquire and output a first detection result from the first edge detection unit before the reset of the first edge detection unit;
a second edge detector that includes:
a second edge detection unit configured to detect one of presence or absence of an edge of the first clock signal in one cycle of the second clock signal;
a second reset pulse generation unit configured to generate a second reset pulse that resets the second edge detection unit in each cycle of the second clock signal; and
a second detection result acquisition unit configured to acquire and output a second detection result from the second edge detection unit before the reset of the second edge detection unit; and
a logic circuit configured to perform a logical operation on the first detection result from the first edge detector and the second detection result from the second edge detector.

2. The detection device according to claim 1, wherein
the first edge detection unit is further configured to detect one of a rising edge or a falling edge of the second clock signal in a first determination window within one cycle of the first clock signal,
the first determination window is determined at the other of the rising edge or the falling edge of the first clock signal,
the second edge detection unit is further configured to detect the one of the rising edge or the falling edge of the first clock signal in a second determination window within one cycle of the second clock signal, and
the second determination window is determined at the other of the rising edge or the falling edge of the second clock signal.

3. The detection device according to according to claim 1, wherein
the first edge detection unit is further configured to detect a rising edge of the second clock signal in a first determination window within one cycle of the first clock signal,
the first determination window is determined at a falling edge of the first clock signal,
the second edge detection unit is further configured to detect the falling edge of the first clock signal in a second determination window within one cycle of the second clock signal, and the second determination window is determined at the rising edge of the second clock signal.

4. The detection device according to claim 1, wherein
the first edge detection unit is further configured to detect falling edge of the second clock signal in a first determination window within one cycle of the first clock signal,
the first determination window is determined at a rising edge of the first clock signal,
the second edge detection unit is further configured to detect the rising edge of the first clock signal in a second determination window within one cycle of the second clock signal, and
the second determination window is determined at the falling edge of the second clock signal.

5. The detection device according to according to claim 1, wherein
the first edge detection unit is further configured to detect a falling edge of the second clock signal in a first determination window within one cycle of the first clock signal,
the first determination window is determined at a rising edge of the first clock signal,
the second edge detection unit is further configured to detect a falling edge of the first clock signal in a second determination window within one cycle of the second clock signal, and
the second determination window is determined at a rising edge of the second clock signal.

6. The detection device according to claim 1, wherein
the first edge detection unit is further configured to detect a rising edge of the second clock signal in a first determination window within one cycle of the first clock signal,
the first determination window is determined at a falling edge of the first clock signal,
the second edge detection unit is further configured to detect a rising edge of the first clock signal in a second determination window within one cycle of the second clock signal, and
the second determination window is determined at a falling edge of the second clock signal.

7. The detection device according to claim 1, further comprising a first counting circuit configured to count outputs of the logic circuit with the first clock signal.

8. The detection device according to claim 7, further comprising an abnormality detection circuit configured to detect an abnormality of the first clock signal and an abnormality of the second clock signal.

9. The detection device according to claim 8, wherein the abnormality detection circuit includes:
a second counting circuit configured to detect the abnormality of the first clock signal; and
a third counting circuit configured to detect the abnormality of the second clock signal.

10. The detection device according to claim 9, wherein
the second counting circuit is further configured to detect the abnormality of the first clock signal based on execution of a count operation,
the count operation is based on the second clock signal, and
the count operation is executed during an enable period indicated by an enable signal generated from an output of the logic circuit and an output of the first counting circuit.

11. The detection device according to claim 9, wherein the third counting circuit is configured to detect the abnormality of the second clock signal based on execution of a count operation,
the count operation is based on the first clock signal, and
the count operation is executed during an enable period indicated by an enable signal generated from an output of the logic circuit and an output of the first counting circuit.

12. The detection device according to claim 10, further comprising an enable signal generation circuit configured to generate the enable signal based on the output of the logic circuit and the output of the first counting circuit.

13. The detection device according to claim 12, wherein the enable signal generation circuit is further configured to generate the enable signal based on execution of a NAND operation on the output of the logic circuit and the output of the first counting circuit.

14. The detection device according to claim 1, wherein the logic circuit includes a circuit configured to calculate a logical product.

15. A detection method implemented in a detection device, the detection method comprising:
detecting, by a first edge detection unit, one of presence or absence of an edge of a second clock signal in one cycle of a first clock signal;
generating, by a first reset pulse generation unit, a first reset pulse that resets the first edge detection unit in each cycle of the first clock signal;
acquiring and outputting, by a first detection result acquisition unit, a first detection result from the first edge detection unit before the reset of the first edge detection unit;
detecting, by a second edge detection unit, one of presence or absence of an edge of the first clock signal in one cycle of the second clock signal;
generating, by a second reset pulse generation unit, a second reset pulse that resets the second edge detection unit in each cycle of the second clock signal;
acquiring and outputting, by a second detection result acquisition unit, a second detection result from the second edge detection unit before the reset of the second edge detection unit; and
performing, by a logic circuit, a logical operation on the first detection result and the second detection result.

* * * * *